| (12) United States Patent | (10) Patent No.: US 10,852,123 B2 |
| Stavis et al. | (45) Date of Patent: Dec. 1, 2020 |

(54) APPARATUS FOR CRITICAL-DIMENSION LOCALIZATION MICROSCOPY

(71) Applicant: Government of the United States of America, as represented by the Secretary of Commerce, Gaithersburg, MD (US)

(72) Inventors: Samuel Martin Stavis, Rockville, MD (US); Craig Robert Copeland, Joppa, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 0 days.

(21) Appl. No.: 16/663,959

(22) Filed: Oct. 25, 2019

(65) Prior Publication Data

US 2020/0132437 A1 Apr. 30, 2020

Related U.S. Application Data

(60) Provisional application No. 62/750,372, filed on Oct. 25, 2018.

(51) Int. Cl.
*G01B 11/02* (2006.01)
*G06T 7/62* (2017.01)

(52) U.S. Cl.
CPC .............. *G01B 11/022* (2013.01); *G06T 7/62* (2017.01); *G06T 2207/10056* (2013.01)

(58) Field of Classification Search
CPC ...... G01B 11/022; G01B 9/04; G01B 21/042; G01B 2210/56; G03F 9/7019; G06T 2207/10056; G06T 7/62

(Continued)

(56) References Cited

U.S. PATENT DOCUMENTS 7,353,128 B2 * 4/2008 Archie .................. G01D 18/00
356/625
7,747,101 B2 6/2010 Matsuzawa et al.
(Continued)

OTHER PUBLICATIONS

Copeland, C.R., et al., "Subnanometer localization accuracy in widefield optical microscopy" Light: Science and Applications, 2018, vol. 7.
(Continued)

*Primary Examiner* — Hoa Q Pham
(74) *Attorney, Agent, or Firm* — Office of Chief Counsel for National Institute of Standards and Technology

(57) ABSTRACT

Performing critical-dimension localization microscopy includes: subjecting a first dimensional member and a second dimensional member of a reference artifact to critical-dimension metrology, the first and second dimensional members, in combination, including a critical dimension and each independently providing optical contrast; determining a primary length of the critical dimension to be traceable to International System of Units meter; imaging in a calibrant optical field, by optical microscopy, the first dimensional member and the second dimensional member, the calibrant optical field disposed in an ocular optical field; determining, from the optical microscopy of the first dimensional member and the second dimensional member, a secondary length and a secondary length uncertainty of the critical dimension subjected to the critical-dimension metrology; and calibrating the calibrant optical field and the secondary length, to the primary length to establish traceability of the secondary length to the International System of Units meter to perform critical-dimension localization microscopy.

14 Claims, 38 Drawing Sheets

(58) Field of Classification Search
USPC .................................. 356/124–127, 614–635
See application file for complete search history.

(56)                References Cited

U.S. PATENT DOCUMENTS

| | | | |
|---|---|---|---|
| 7,924,435 B2* | 4/2011 | Colonna De Lega | ........................ G01B 9/02084 356/511 |
| 8,284,406 B2* | 10/2012 | Nakata | ............... G01B 9/02014 356/496 |
| 2019/0317413 A1* | 10/2019 | Cheng | ................. G03F 7/70625 |

OTHER PUBLICATIONS

Farid, H., et al., "Blind removal of lens distortion", Journal of Optical Society of America, 2001, p. 2072-2078, vol. 18 No. 9.

* cited by examiner

APPARATUS FOR CRITICAL-DIMENSION LOCALIZATION MICROSCOPY

CROSS REFERENCE TO RELATED APPLICATIONS

The application claims priority to U.S. Provisional Patent Application Ser. No. 62/750,372 filed Oct. 25, 2018, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov.

BRIEF DESCRIPTION

Disclosed is a process for performing critical-dimension localization microscopy, the process comprising: fabricating a reference artifact that comprises a first dimensional member and a second dimensional member, such that the first dimensional member and the second dimensional member, in combination, comprise a critical dimension, and each of the first dimensional member and the second dimensional member independently provide optical contrast when the reference artifact is subjected to optical microscopy; subjecting the first dimensional member and the second dimensional member of the reference artifact to critical-dimension metrology; determining a primary length and a primary length uncertainty of the critical dimension from the critical-dimension metrology so that the critical dimension is traceable to International System of Units meter (SI-m); imaging in a calibrant optical field, by optical microscopy, the first dimensional member and the second dimensional member, the calibrant optical field disposed in an ocular optical field; determining, from the optical microscopy of the first dimensional member and the second dimensional member, a secondary length and a secondary length uncertainty of the critical dimension subjected to the critical-dimension metrology; and calibrating the calibrant optical field and the secondary length, to the primary length to establish traceability of the secondary length to the International System of Units meter SI-m to perform critical-dimension localization microscopy.

Disclosed is a process for performing critical-dimension localization microscopy, the process comprising: subjecting a first dimensional member and a second dimensional member of a reference artifact to critical-dimension metrology, the first dimensional member and the second dimensional member, in combination, comprising a critical dimension, and each of the first dimensional member and the second dimensional member independently provide optical contrast when the reference artifact is subjected to optical microscopy; determining a primary length and a primary length uncertainty of the critical dimension from the critical-dimension metrology so that the critical dimension is traceable to International System of Units meter (SI-m); imaging in a calibrant optical field, by optical microscopy, the first dimensional member and the second dimensional member, the calibrant optical field disposed in an ocular optical field; determining, from the optical microscopy of the first dimensional member and the second dimensional member, a secondary length and a secondary length uncertainty of the critical dimension subjected to the critical-dimension metrology; and calibrating the calibrant optical field and the secondary length, to the primary length to establish traceability of the secondary length to the International System of Units meter SI-m to perform critical-dimension localization microscopy.

Disclosed is an apparatus for critical-dimension localization microscopy for performing critical-dimension localization microscopy and comprising: a critical-dimension metrolog that: subjects a reference artifact to critical-dimension metrology, the reference artifact comprising a critical dimension; and produces metrology data of the reference artifact from the critical-dimension metrology; an optical microscope comprising: an ocular optical field; and a calibrant optical field disposed in the ocular optical field, such that the optical microscope: receives the reference artifact in the calibrant optical field, the reference artifact being subjected to the critical-dimension metrology; subjects the reference artifact in the calibrant optical field to optical microscopy; produces calibrant microscopy data from the reference artifact in the calibrant optical field; receives the reference artifact in the ocular optical field; subjects the reference artifact in the ocular optical field to optical microscopy; produces ocular microscopy data from the reference artifact in the ocular optical field; an analysis machine comprising: a first analyzer that: receives the metrology data from the critical-dimension metrolog; and produces calibration factors from the metrology data; a second analyzer that: receives the calibrant microscopy data from the optical microscope; receives the ocular microscopy data from the optical microscope; calibrates, with the calibration factors, the calibrant microscopy data and the ocular microscopy data to the critical dimension to produce from the calibrant microscopy data, the ocular microscopy data, and the calibration factors to establish traceability of the ocular optical field to the International System of Units meter SI-m.

BRIEF DESCRIPTION OF THE DRAWINGS

The following description should not be considered limiting in any way. With reference to the accompanying drawings, like elements are numbered alike.

DETAILED DESCRIPTION

A detailed description of one or more embodiments is presented herein by way of exemplification and not limitation.

It has been discovered that an apparatus for critical-dimension localization microscopy and processes herein provide critical-dimension localization microscopy. Critical-dimension localization microscopy calibrates and measures to establish International System of Units meter (SI-m) traceability of optical microscopy with an uncertainty of approximately 1 nm over an optical field of view. Advantageously, an array of sub-resolution apertures can be disposed in an opaque substrate (e.g., a metal film of suitable thickness). The array can be subjected to critical-dimension metrology to characterize a critical dimension of the aperture array, providing measurements of spacing of apertures that are traceable to SI-m. Upon determination of the length of the critical dimension from the critical-dimension localization microscopy, calibration of an ocular field, e.g., of a widefield optical microscope, can occur based on reference to the critical dimension. Accordingly, the optical microscope enables CDLM, extending SI-traceability to localization of emitters in large fields with high throughput, e.g., in production of reference materials for other optical microscopes.

Figure 1:
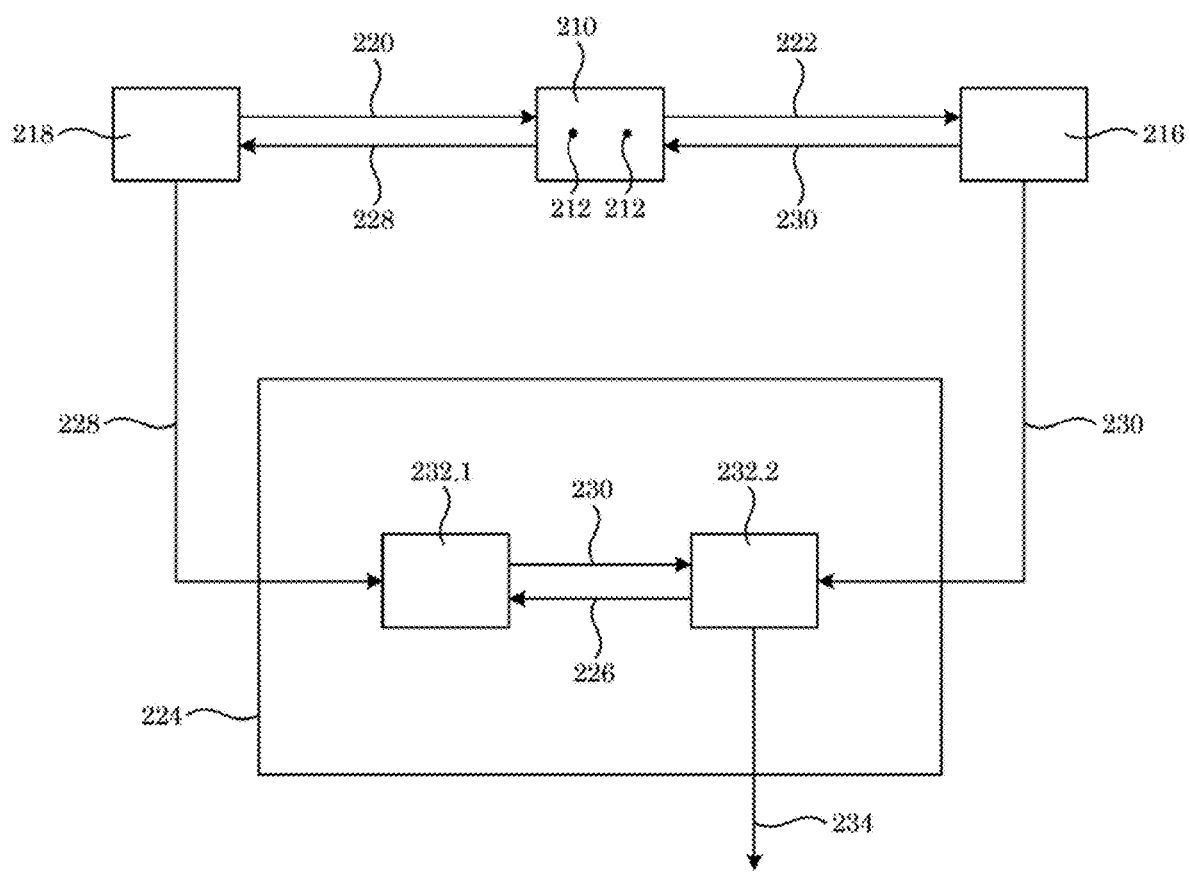
FIG. 1 shows an apparatus for critical-dimension localization microscopy.

Apparatus for critical-dimension localization microscopy 200 performs critical-dimension localization microscopy. In an embodiment, with reference to FIG. 1, critical-dimension metrolog 218 that: subjects reference artifact 210 to critical-dimension metrology 220, reference artifact 210 including critical dimension 214; and produces metrology data 228 of reference artifact 210 from critical-dimension metrology 220; optical microscope 216 including: ocular optical field 236; and calibrant optical field 238 disposed in ocular optical field 236, such that optical microscope 216: receives reference artifact 210 in calibrant optical field 238, reference artifact 210 being subjected to critical-dimension metrology 220; subjects reference artifact 210 in calibrant optical field 238 to optical microscopy 222; produces calibrant microscopy data 230 from reference artifact 210 in calibrant optical field 238; receives reference artifact 210 in ocular optical field 236; subjects reference artifact 210 in ocular optical field 236 to optical microscopy 222; produces ocular microscopy data 230 from reference artifact 210 in ocular optical field 236; analysis machine 224 including: first analyzer 232.1 that: receives metrology data 228 from critical-dimension metrolog 218; and produces calibration factors 226 from metrology data 228; second analyzer 232.2 that: receives calibrant microscopy data 230 from optical microscope 216; receives ocular microscopy data 230 from optical microscope 216; calibrates, with calibration factors 226, calibrant microscopy data 230 and ocular microscopy data 230 to critical dimension 214 to produce traceable microscopy data 234 from calibrant microscopy data 230, ocular microscopy data 230, and calibration factors 226 to establish traceability of ocular optical field 236 to International System of Units meter SI-m.

As used herein, "critical dimension" refers to a distance between selected dimensional members. As used herein, "pitch" refers to an average of critical dimensions among selected adjacent dimensional members.

It is contemplated that critical-dimension metrolog 218 can include stages with interferometric sensors of position that move a sample for fabrication or measurement through distances that are traceable to the SI-m through the wavelength of light to determine primary length L1 and primary length uncertainty LU1 of reference artifact 210 that is a length standard for microscopy and can be an array of apertures, pillars, or other objects suitable for optical microscopy. It is contemplated that "length" is synonymous with distance and dimension. Exemplary critical-dimension metrologs 218 include machines that perform electron-beam lithography, critical-dimension atomic-force microscopy, and critical-dimension scanning-electron microscopy. Critical-dimension metrolog 218 determines primary length L1 with a precision that can be from 0.1 nm to 2 nm. In an embodiment, critical-dimension metrolog 218 includes critical-dimension atomic-force microscopy.

Figure 2:
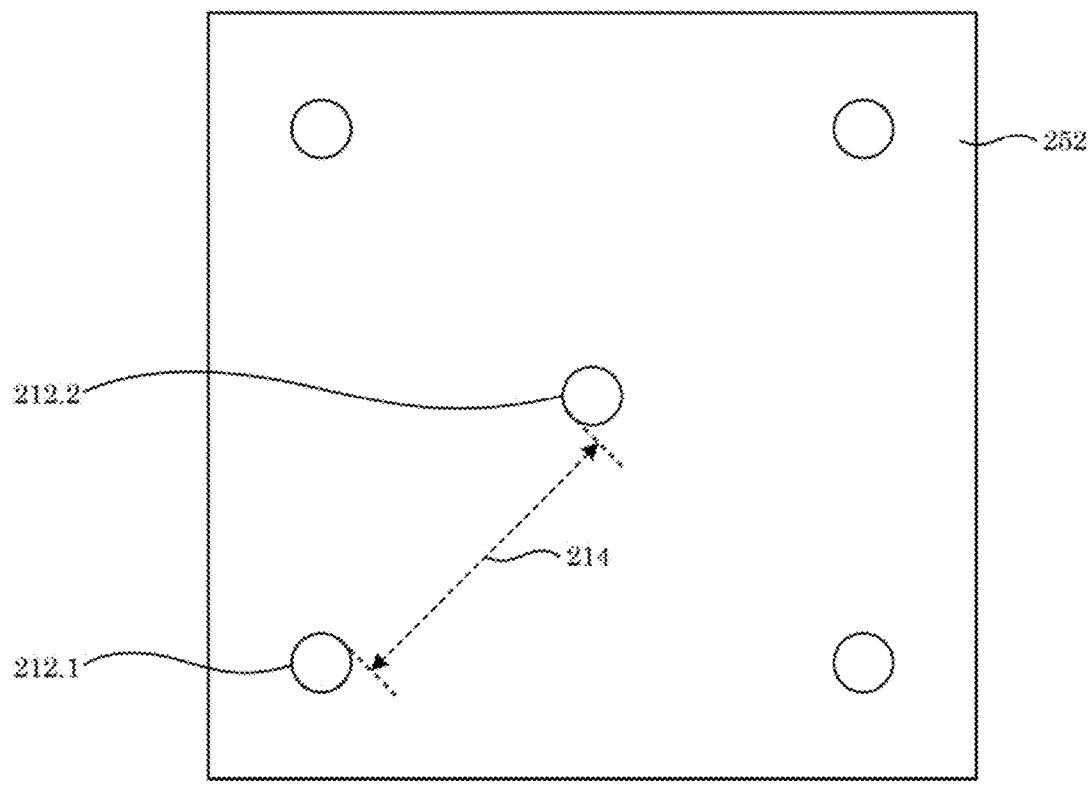
FIG. 2 shows a reference artifact.

Critical-dimension metrolog 218 subjects reference artifact 210 to critical-dimension metrology to determine primary length L1. With reference to FIG. 2, reference artifact 210 can include substrate 252 and a plurality of dimensional members 212 disposed on substrate 252. Substrate 252 can include an opaque film to block the transmission of light and can be a metallic film. Exemplary substrates 252 include a platinum film deposited on fused silica. Moreover, an additional adhesion layer may be required to adhere the metallic film to the fused silica. An optical density of substrate 252 can be from 1 to 10. A size, e.g., a length or thickness, of substrate 252 can be from 50 nm to 200 nm thick of platinum on 170 μm thick fused silica. In an embodiment, substrate 252 includes a platinum film with a thickness of 100 nm deposited onto a titanium film with a thickness of 10 nm deposited onto fused silica with a thickness of 170 μm.

Dimensional member 212 can include an array of apertures to transmit light and can be a square array with a pitch of 5 μm. Exemplary dimensional member 212 include apertures with a diameter that is smaller than the resolution limit of optical microscope 216. Moreover, dimensional member 212 provides optical contrast when subjected to optical microscopy and produces images that can be measured by localization microscopy. A number of dimensional members 212 can be from 2 to thousands. In an embodiment, with reference to FIG. 2, dimensional-member 212 includes first dimensional member 212.1 and second dimensional member 212.2 separated by critical dimension 214. Critical dimension 214 has primary length L1. Primary length L1 can be from the resolution limit of the optical microscope to the size of the field of view of the optical microscope. Critical-dimension metrolog 218 can provide an uncertainty in determination of primary length L1. Primary length uncertainty LU1 can be from 0.1 nm to 2 nm.

Optical microscope 216 can include an illumination source, light-collimating and directing optics, and an imaging sensor to perform microscopy and can provide contrast by absorption, reflection, scattering, and fluorescence. An exemplary optical microscope 216 includes a fluorescence microscope. Moreover, an optical microscope can include multiple light paths and optical elements enabling optical microscopy in a variety of contrast modes, such as light absorption, reflection, scattering, and fluorescence, and can include electron microscopes. It should be appreciated that apparatus for performing critical dimensional microscopy and processes herein apply to optical microscopes and optical microscopy as well as electron microscopes and electron microscopy. The terms "optical" and "wavelength" are not limited to photons but also include properties of other particles or waves, and it is contemplated that electron microscopes and other microscopy devices that include electron optics, focusing elements, beam steering elements, or the like can be included structural features in certain embodiments and can affect a very short wavelength of electrons and similar particles.

An optical resolution of optical microscope 216 can be from 150 nm to 1000 nm, specifically from 0.6 multiplied by the wavelength of light that forms the image of the sample divided by the numerical aperture of the objective lens. An optical power of optical microscope 216 can be from 10 mW to 2 W. In an embodiment, optical microscope 216 includes an inverted stand, a scanning stage that translates in x and y with a sample holder that rotates around these axes, a piezoelectric actuator that translates an objective lens in z with a nominal resolution of 10 nm, an objective lens with a nominal magnification of 63×, a numerical aperture of 1.2, and an immersion medium with an index of refraction of 1.33; a light emitting diode (LED) array with a peak wavelength of 510 nm and a full width at half maximum of 25 nm, a CMOS camera with 2048 pixels by 2048 pixels with an on-chip size of 6.5 μm by 6.5 μm, an excitation filter with a bandwidth from 450 nm to 500 nm, a dichroic mirror with a transition at 505 nm, and an emission filter with a bandwidth from 515 nm to 565 nm. It should be appreciated that, while critical-dimension metrolog 218 provides primary length uncertainty LU1 of primary length L1, optical microscope 216 subjects reference artifact 210 to optical microscopy and determines secondary length L2 and secondary length uncertainty LU2 of secondary length L2. Secondary length uncertainty LU2 can be from 0.01 nm to 2 nm.

Figure 3:
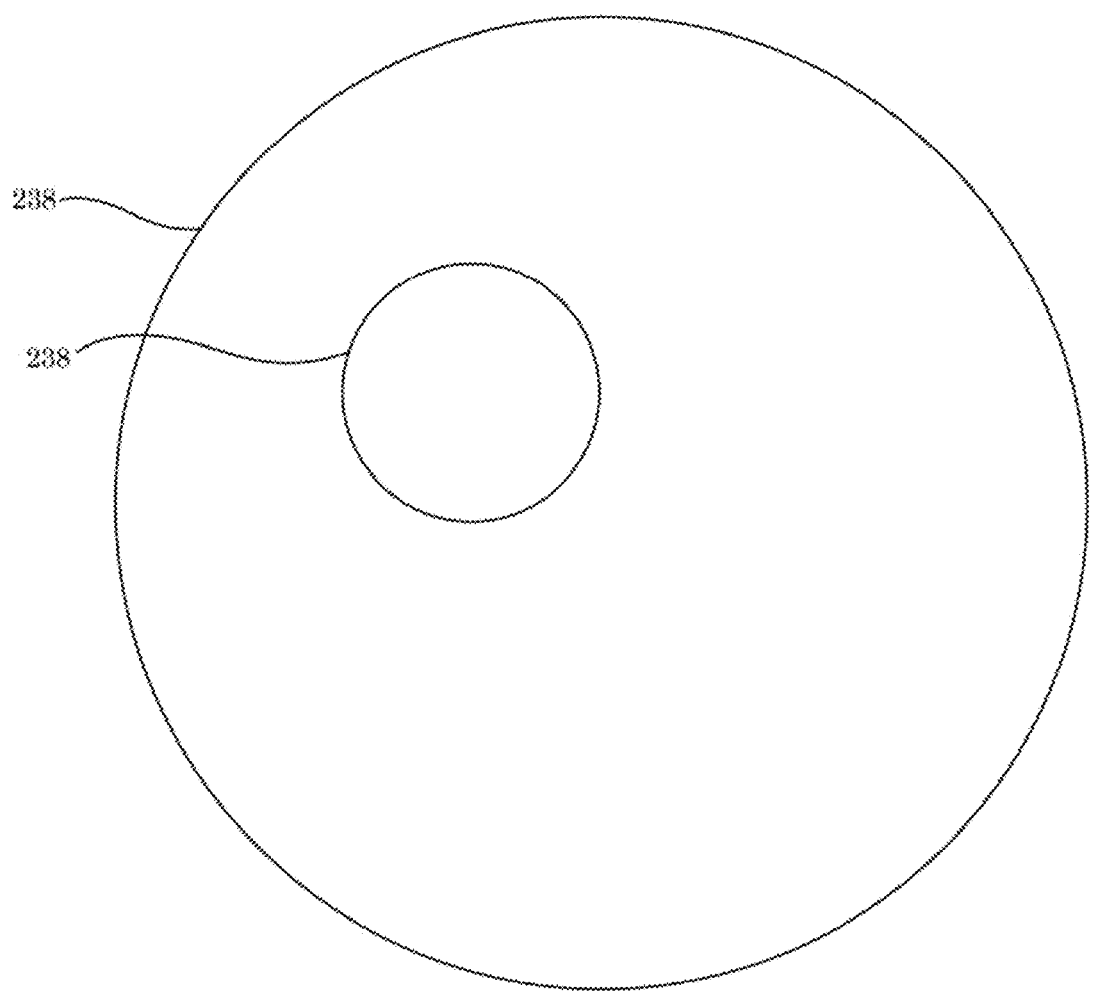
FIG. 3 shows an optical field of view.

With reference to FIG. 3, optical field of view 258 of optical microscope 216 includes calibrant optical field 238 disposed in ocular optical field 236. Ocular optical field 236 can include a region of the field of view of the optical microscope that contains an imaging sensor to record micrographs of a sample subject to optical microscopy. Exemplary ocular optical fields 236 include the region of the field of view containing a CMOS or CCD imaging sensor. In an embodiment, ocular optical field 236 includes the region of the microscope field of view that contains a CMOS imaging sensor.

Calibrant optical field 238 can include a subset of the ocular optical field that exhibits the most uniform effects of optical aberrations to reduce errors from optical aberrations in optical microscopy. Exemplary calibrant optical fields 238 include the region of the field of view of the optical microscope that is coincident with the optical axis. Moreover, the center of the field of view of the optical microscope can be coincident with the optical axis. In an embodiment, calibrant optical field 238 includes the central 100 μm$^2$ of the field of view of the optical microscope.

Figure 6:
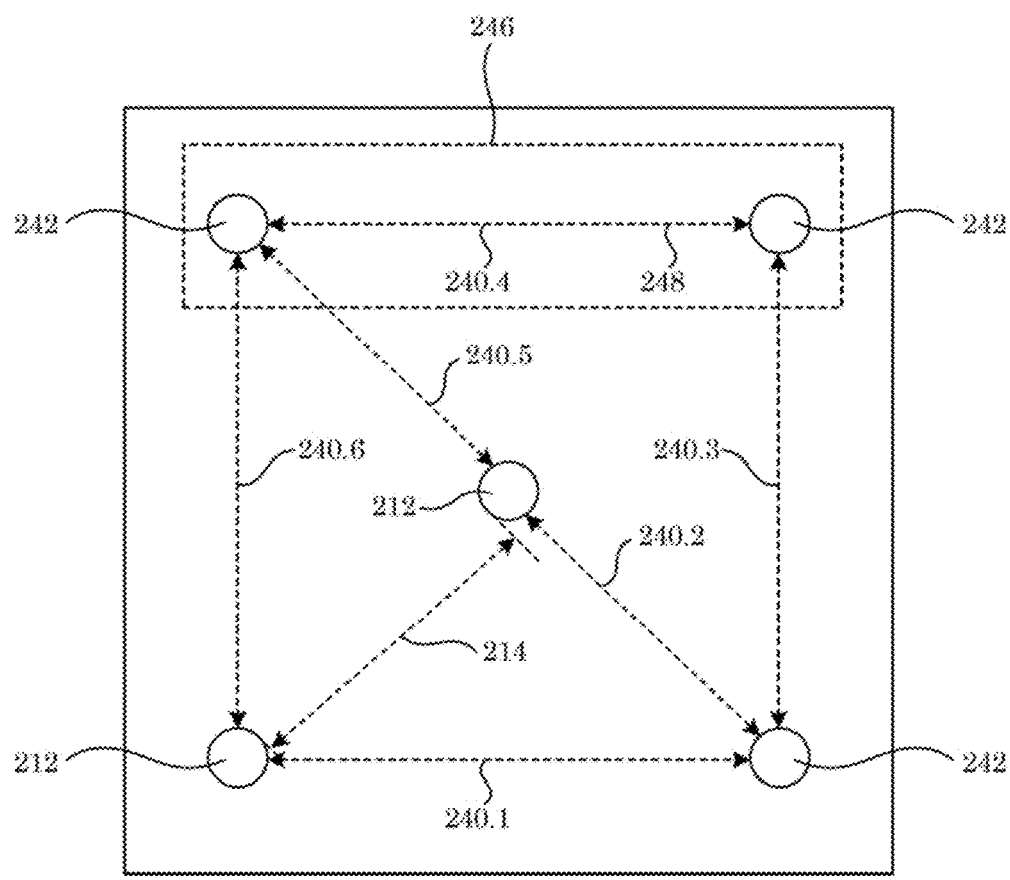
FIG. 6 shows an analyte artifact.

With reference to FIG. 6, for calibration and traceability of optical field of view 258 of optical microscope 216, optical microscope 216 subjects analyte artifact 244 to optical microscopy 222. Analyte artifact 244 can include a plurality of analyte members 242 disposed on substrate 252, wherein analyte member 242 provides optical contrast when subjected to optical microscopy 222. Analyte artifact 244 can consist of an army of apertures in a metallic film on a silica substrate to transmit light at specific positions. Exemplary analyte artifacts 244 include aperture arrays. Moreover, analyte member 242 produces images when subjected to optical microscopy that can be measured by localization microscopy. A number of analyte members 242 can be from 2 to thousands. Analyte artifact 244 includes first analyte member 242.1 and second analyte member 242.2 separated by analyte dimension 240, wherein analyte dimension 240 has analyte length 248 that, when subjected to optical microscopy 222, has an uncertainty. Further, first analyte member 242.1 and second analyte member 242.2 can be subjected to optical microscopy as pair 246 to determine analyte dimension 240. Analyte length 248 can be from the resolution limit of the optical microscope to the size of the field of view of the optical microscope. Optical microscope 216 can provide an uncertainty in determination of analyte length 248. Uncertainty in analyte length 248 can be from 0.01 nm to 2 nm.

Analysis machine 224 receives metrology data 228 and microscopy data 230 to produce calibration factors 226 and traceable microscopy data 234. It is contemplated that analysis machine 224 can include a computer system to store and process micrographs and can be programmed to execute analysis software. Exemplary analysis machines 224 include a computer system equipped with scientific analysis software. Analysis machine 224 can include a plurality of analyzer 232, e.g., first analyzer 232.1 and second analyzer 232.2. Analyzer 232 can include mathematical relationships and models to calculate calibration factors for a correspondence between metrology data and microscopy data and can be a software program. Exemplary analyzers 232 include algorithms for determining the positions of elements in microscopy data and metrology data and models for relating the positions. Moreover, the mathematical relationships and models enable calculation of uncertainty in element positions and associated metrics such as calibration factors.

Metrology data 228 can include micrographs with dimensions that are traceable to the SI-m to record the relative positions of dimensional members as measured by critical dimension metrolog 218. Microscopy data 230 can include optical micrographs to record the relative positions of dimensional members as measured by optical microscopy. Calibration factors 226 can include scale factors relating image pixel size in optical micrographs to physical distances in micrographs from critical-dimension metrolog 218 to determine the image pixel size in optical microscopy. Traceable microscopy data 234 can include positions of dimensional members that are traceable to the SI-m after calibration of microscopy data and models of the optical properties of the optical field of view to generate a value of image pixel size in optical micrographs that is traceable to the SI-m.

Apparatus for critical-dimension localization microscopy 200 can be made in various ways. In an embodiment, a process for making apparatus for critical-dimension localization microscopy 200 includes: providing critical-dimension metrolog 218; optionally disposing reference artifact 210 on critical-dimension metrolog 218; optionally disposing reference artifact 210 in optical microscope 216; disposing analyte artifact 244 on optical microscope 216; disposing analysis machine 224 in communication with critical-dimension metrolog 218 to receive metrology data 228; and disposing analysis machine 224 in communication with optical microscope 216 to receive microscopy data 230.

In an embodiment, a process for fabricating reference artifact 210 includes providing with silica substrates with thickness of approximately 170 μm, surface roughness of less than 0.7 am root mean square, scratch number of 20, dig number of 10, flatness deviation from 2.5×10-4 nm·nm-1 to 5.0×10-4 nm·nm-1, and a parallelism of less than 0.15 mrad; depositing a titanium film with a thickness of approximately 10 nm as an adhesion layer, a platinum film with a thickness of approximately 80 nm for optical opacity, a positive-tone electron-beam resist film with a thickness of approximately 120 nm, and an aluminum film with a thickness of approximately 15 nm for charge dissipation; and performing electron-beam lithography using an electron-beam lithography system with a scanning stage with two laser interferometers to measure stage position in x and in y. The resolution of a stage position measurement can be 632.8 nm/1024=0.6180 nm, with traceability to the SI through the operating wavelength of the helium-neon laser. The lithography system performs internal calibrations of electron optics using critical-dimension metrology of stage position to place features at locations that are traceable to the SI-m. The electron-beam current for this system is typically 1.0 nA. The process can include performing a Monte Carlo simulation of electron trajectories in the film stack to correct the pattern data for proximity effects at an accelerating voltage of 100 kV; and fracturing the pattern data into polygons. After electron-beam exposure, the process can include removing the aluminum film with tetramethylammonium hydroxide; cold-developing the electron-beam resist in hexyl acetate; milling apertures with argon ions with a secondary-ion mass spectrometer to monitor emission products; and stopping at the top surface of the silica substrate.

Apparatus for critical-dimension localization microscopy 200 has numerous advantageous and unexpected benefits and uses. In an embodiment, with reference to FIG. 4, FIG. 5, FIG. 7, and FIG. 8, a process for performing critical-dimension localization microscopy with apparatus for critical-dimension localization microscopy 200 includes: subjecting first dimensional member 212.1 and second dimensional member 212.2 of reference artifact 210 to critical-dimension metrology 220, first dimensional member 212.1 and second dimensional member 212.2, in combination, include critical dimension 214, and each of first dimensional member 212.1 and second dimensional member 212.2 independently provide optical contrast when reference artifact 210 is subjected to optical microscopy; determining primary length L1 and primary length uncertainty LU1 of critical dimension 214 from critical-dimension metrology 220 so that critical dimension 214 is traceable to International System of Units meter (SI-m); imaging in calibrant optical field 238, by optical microscopy 222, first dimensional member 212.1 and second dimensional member 212.2, calibrant optical field 238 disposed in ocular optical field 236; determining, from optical microscopy 222 of first dimensional member 212.1 and second dimensional member 212.2, secondary length L2 and secondary length uncertainty LU2 of critical dimension 214 subjected to critical-dimension metrology 220; and calibrating calibrant optical field 238 and secondary length L2, to primary length L1 to establish traceability of secondary length L2 to International System of Units meter SI-m to perform critical-dimension localization microscopy.

In the process for performing critical-dimension localization microscopy, subjecting first dimensional member 212.1 and second dimensional member 212.2 of reference artifact 210 to critical-dimension metrology 220 can include recording atomic-force micrographs of their relative positions using a critical-dimension atomic-force microscope.

In the process for performing critical-dimension localization microscopy, determining primary length L1 and primary length uncertainty LU1 of critical dimension 214 from critical-dimension metrology 220 so that critical dimension 214 is traceable to International System of Units meter (SI-m) can include determining the distance between the centroids of each dimensional member in an atomic-force micrograph and the associated measurement uncertainty.

In the process for performing critical-dimension localization microscopy, imaging in calibrant optical field 238, by optical microscopy 222, first dimensional member 212.1 and second dimensional member 212.2, calibrant optical field 238 disposed in ocular optical field 236 can include recording optical micrographs of their relative positions using an optical microscope.

In the process for performing critical-dimension localization microscopy, determining, from optical microscopy 222 of first dimensional member 212.1 and second dimensional member 212.2, secondary length L2 and secondary length uncertainty LU2 of critical dimension 214 can include determining the distance between the centroids of each dimensional member in an optical micrograph and the associated measurement uncertainty.

In the process for performing critical-dimension localization microscopy, calibrating calibrant optical field 238 and secondary length L2, to primary length L1 to establish traceability of secondary length L2 to International System of Units meter SI-m can include determining the image pixel size of the calibrant optical field as the ratio of L1 to L2. It should be appreciated that traceability includes tracing or an ability to trace the value of L2 through a measurement chain to the SI-m with an uncertainty of approximately 1 nm. Accordingly, a length, e.g., when secondary length L2 is traceable to Si-m, a value of L2 is referenced by comparison to L1, which is provided by motion of the interferometric scanning stage of the critical-dimension metrolog, which is determined by the interference of light that has a known wavelength, and the stage position is known to within a selected position uncertainty, e.g., of approximately 1 nm. Moreover, when calibrant optical field 238 is traceable to Si-m, the image pixel size is traceable through a chain of measurements to the wavelength of light of the interferometric sensor of critical dimension metrolog 218.

The process for performing critical-dimension localization microscopy also can include fabricating reference artifact 210 by focused ion-beam milling.

Figure 4:
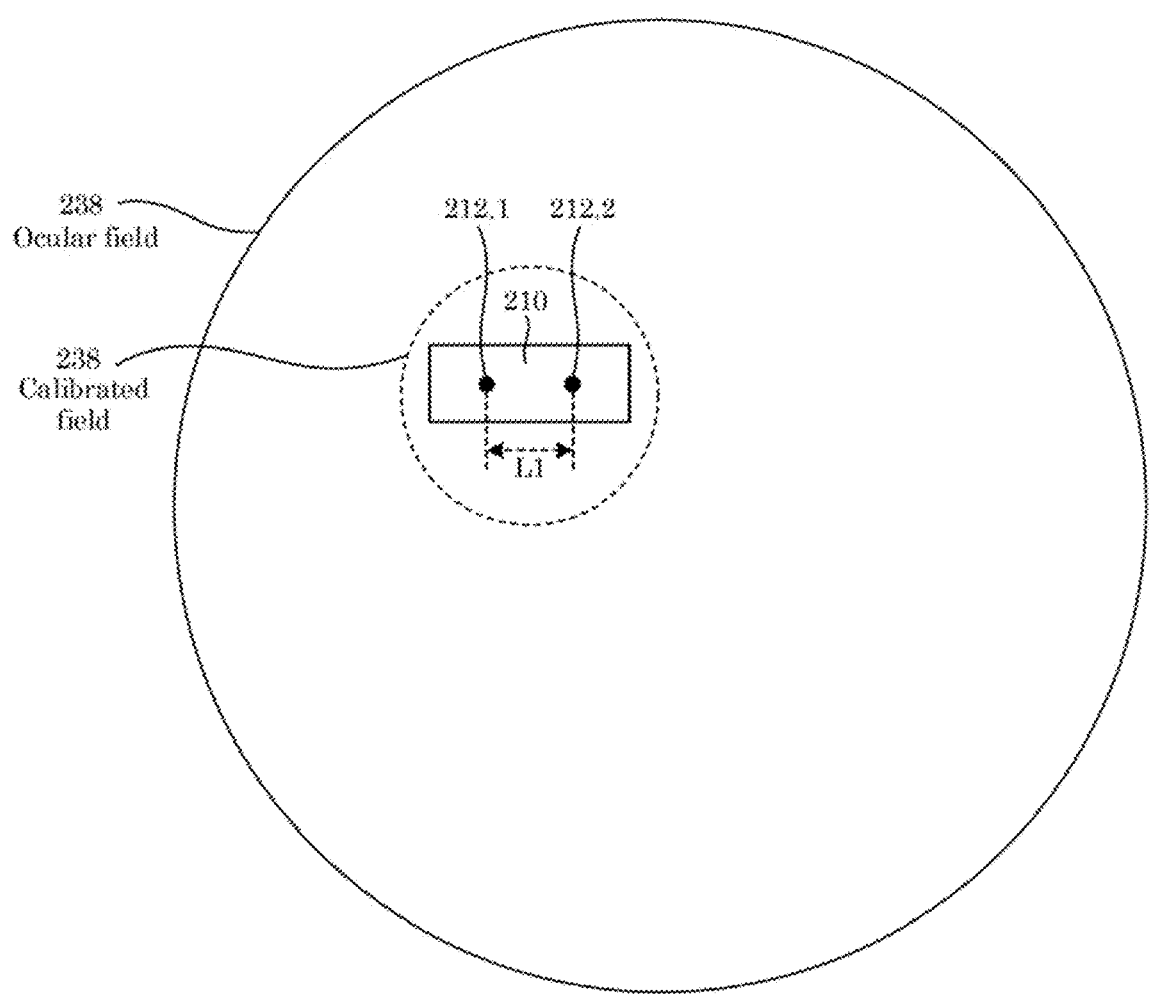
FIG. 4 shows a reference artifact disposed in a calibrant optical field of an optical field of view.
Figure 5:
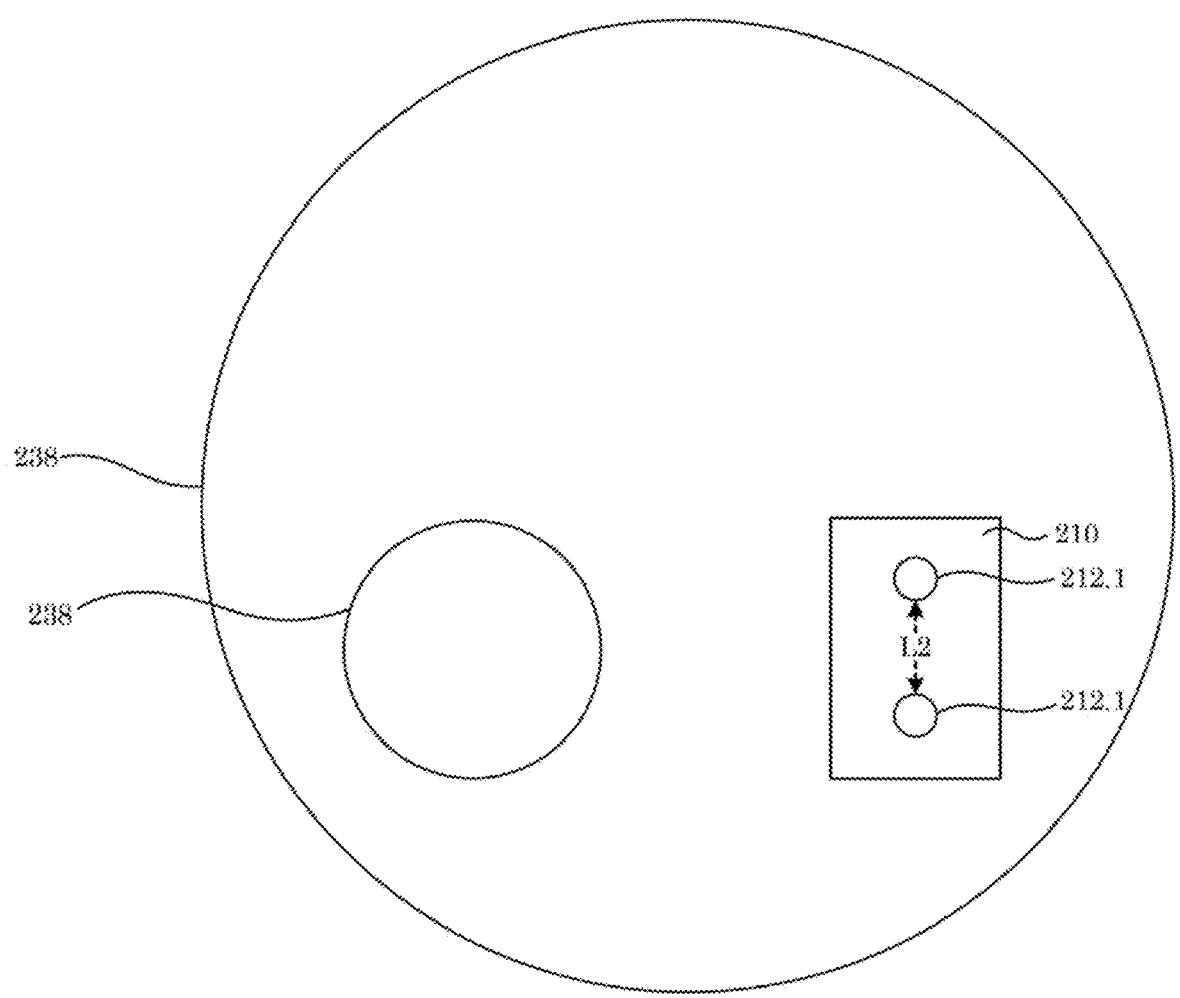
FIG. 5 shows a reference artifact disposed in an ocular optical field of an optical field of view.
Figure 7:
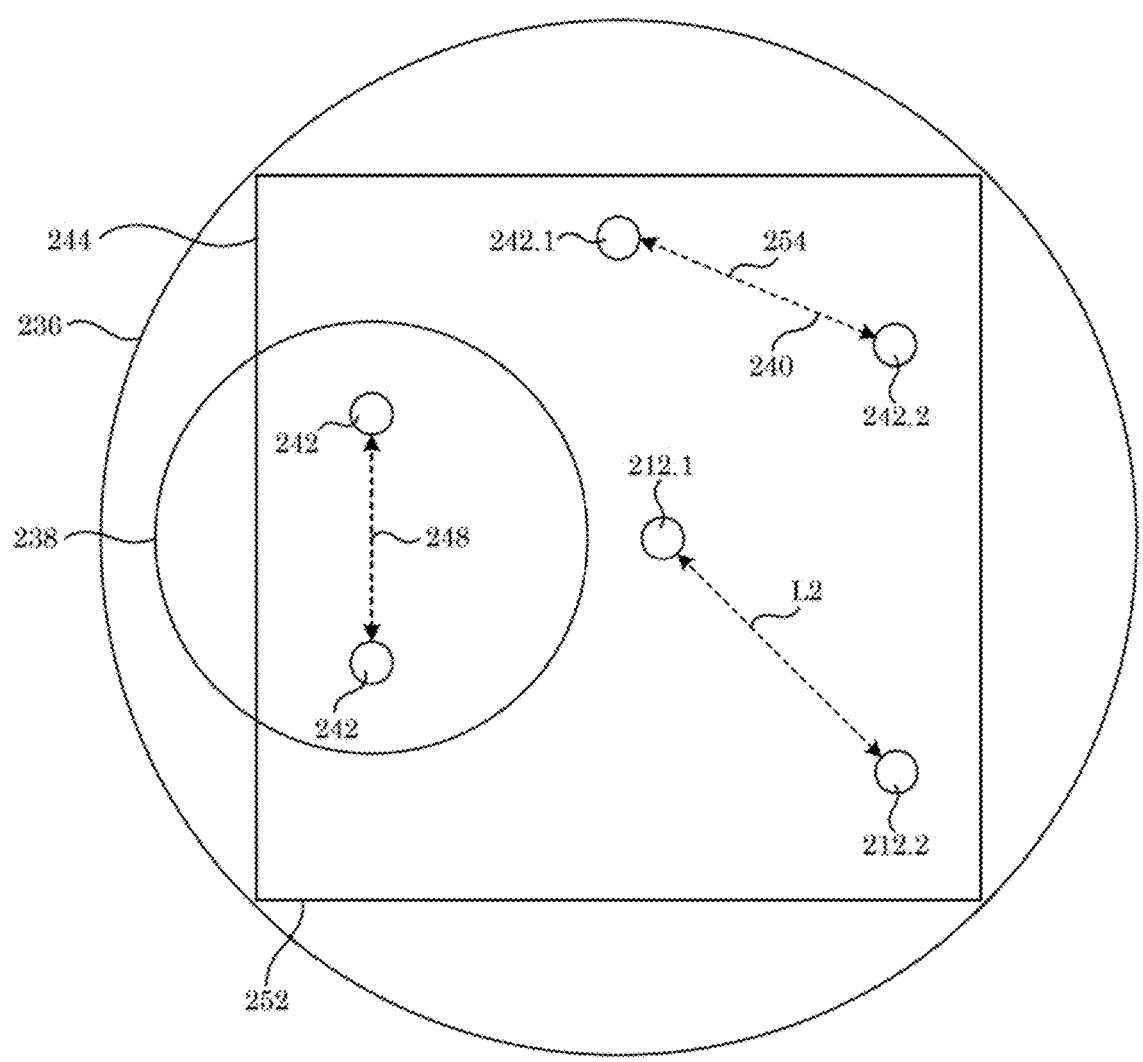
FIG. 7 shows an analyte artifact disposed in an optical field of view.
Figure 8:
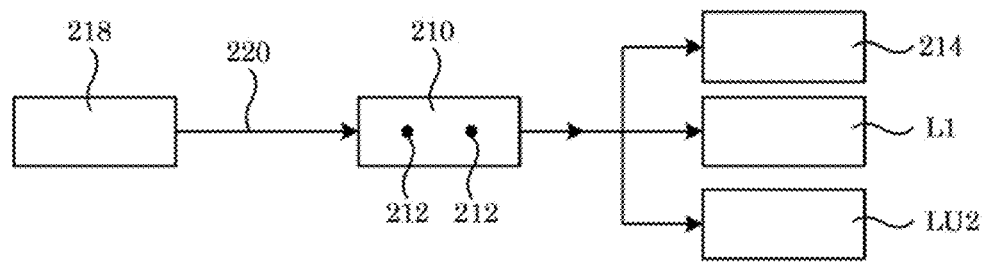
FIG. 8 shows acquisition of a critical dimension via critical-dimension metrology of a reference artifact in panel A; acquisition of secondary length L2 via optical microscopy of the reference artifact in panel B; and production of traceable microscopy data from primary length L1 and secondary length L2
Figure 8:
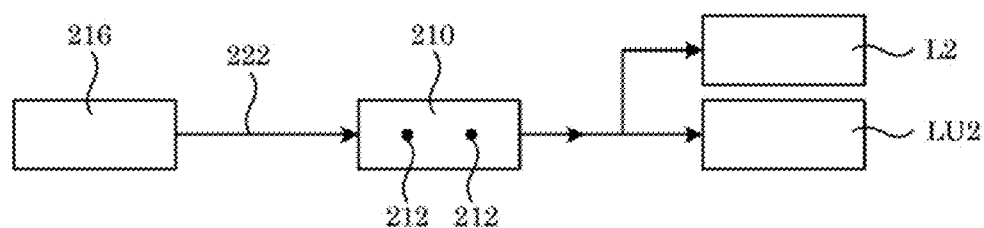
Figure 8:
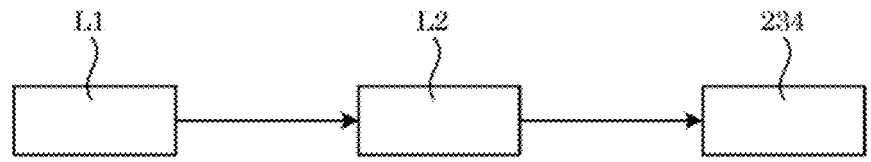

With reference to FIG. 4, the process for performing critical-dimension localization microscopy can include disposing first pair 246.1 of analyte members 242 in calibrant optical field 238 by positioning the analyte members within the calibrant field of the optical microscope using the stage of the optical microscope; imaging in calibrant optical field 238, by optical microscopy 222, first pair 246.1 by exposing the imaging sensor while the analyte members are exhibiting optical contrast; determining, from optical microscopy 222 of first pair 246.1, first analyte length 248.1 and first analyte length uncertainty 250.1 of the first pair 246.1 by repeatedly determining the position of each analyte member and calculating the distance between them in units of pixels, the mean value of distance provides the first analyte length and the standard error provides the first analyte length uncertainty; and calibrating first analyte length 248.1 and first analyte length uncertainty 250.1 of first pair 246.1 to primary length L1 to establish traceability of the first analyte length 248.1 to the International System of Units meter SI-m by converting the first analyte length and length uncertainty to units of Si-m using the calibrated image pixel size of the calibrant optical field. With reference to FIG. 7, the process further can include translating, relative to calibrant optical field 238, substrate 252 on which is disposed a plurality of analyte members 242, so that different pairs of analyte members are disposed in calibrant optical field 238 due to translating analyte members 242; independently imaging the different pairs in calibrant optical field 238, by optical microscopy 222 by exposing the imaging sensor while the analyte members are exhibiting optical contrast; independently determining, from optical microscopy 222 of the different pairs, analyte length 248 and analyte length uncertainty 250 of each different pair by repeatedly determining the position of each analyte member and calculating the distance between them in units of pixels, the mean value of distance provides the analyte length and the standard error provides the analyte length uncertainty; and calibrating analyte length 248 of each different pair to primary length L1 to establish traceability of analyte length 248 of each different pair to International System of Units meter SI-m by converting each analyte length and length uncertainty to units of Si-m using the calibrated image pixel size of the calibrant optical field.

In some embodiments, the process for performing critical-dimension localization microscopy can include disposing first pair 246.1 in ocular optical field 236 outside of calibrant optical field 238; imaging in ocular optical field 236, by optical microscopy 222, first pair 246.1; and calibrating optical length 254 of ocular optical field 236 in which first pair 246.1 is disposed indirectly to primary length L1 via first analyte length 248.1 to establish traceability of optical length 254 to International System of Units meter SI-m. Additionally, the process for performing critical-dimension localization microscopy can include translating, relative to calibrant optical field 238, substrate 252 on which is disposed the plurality of analyte members 242, so that different pairs of analyte members are disposed in calibrant optical field 238 due to translating analyte members 242; independently imaging different pairs in calibrant optical field 238, by optical microscopy 222; independently determining, from optical microscopy 222 of different pairs, analyte length 248 and analyte length uncertainty 250 of each different pair; and calibrating analyte length 248 of each different pair to primary length L1 to establish traceability of analyte length 248 of each different pair to International System of Units meter SI-m. Further, the process can include disposing the different pairs in ocular optical field 236 outside of calibrant optical field 238; imaging in ocular optical field 236, by optical microscopy 222, different pairs; and calibrating optical length 254 of ocular optical field 236 in which the different pairs are disposed indirectly to primary length L1 via analyte length 248 of each different pair to establish traceability of optical length 254 of ocular optical field 236 in which different pairs are disposed to International System of Units meter SI-m.

Apparatus for critical-dimension localization microscopy 200 and processes disclosed herein have numerous beneficial uses, including providing traceable measurements from analysis of optical micrographs, enabling critical-dimension analysis over larger fields and with higher throughput than existing critical-dimension metrologs, and providing a universal method of characterizing and controlling the quality of standards for calibrating optical microscopes. Advantageously, apparatus for critical-dimension localization microscopy 200 overcomes limitations of technical deficiencies of conventional articles such as inaccurate nominal values of image pixel size in optical microscopy and calibration standards with critical dimensions that have relatively large uncertainties on the order of 100 nm to 1000 nm. Apparatus for critical-dimension localization microscopy 200 and processes herein unexpectedly provides critical-dimension metrology using an optical microscope.

The articles and processes herein are illustrated further by the following Example, which is non-limiting.

Example

Subnanometer localization accuracy in widefield optical microscopy

Figure 9:
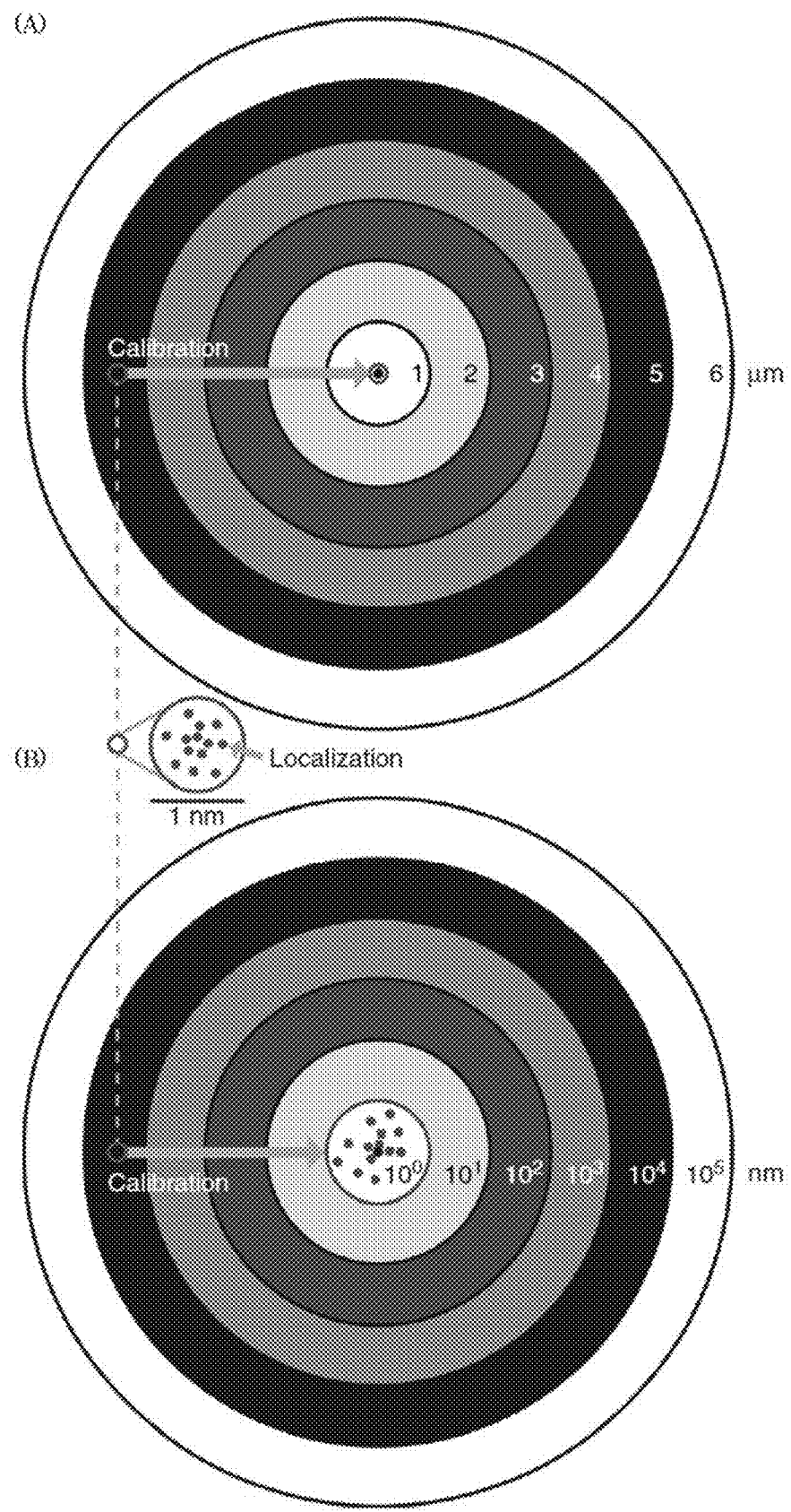
FIG. 9 shows precision and accuracy in critical-dimension localization microscopy.

Optical microscopy for localizing small emitters are useful in cell biology, nanoscale fabrication, cryogenic physics, and microelectromechanical systems. Both precision and accuracy are involved in localization microscopy. Localization of single fluorophores with a statistical uncertainty of tens of nanometers can occur, and subnanometer uncertainty may occur for fluorophores and might be achievable for emitters such as particles. Achieving localization accuracy presents challenges in calibration of an optical microscope as a nonideal measurement system. Calibration involves discrete parts of the system and interaction of the parts during a measurement and is rarely, if ever, implemented. This can cause overconfidence in measurement results with statistical uncertainties at the nanometer scale that are invalid due to larger systematic errors. These errors can extend into the micrometer scale when localizing emitters across a wide field, as is involved for imaging microstructures and tracking motion. The discrepancy between precision and accuracy can be large and involve a logarithmic target to illustrate, as shown in FIG. 9, with respect to precision and accuracy in localization microscopy, panel A shows a linear target. Panel B shows a logarithmic target. Dots are localization data having scatter that indicates statistical uncertainty at the subnanometer scale, which is not apparent on the linear target as systematic errors can be four orders of magnitude larger. This discrepancy requires a logarithmic target to illustrate both precision and accuracy. Calibration of the measurement system and correction of localization data ensures that precision is the limit of accuracy.

A root cause of the problem is a lack of reference materials and calibration methods that are optimal for localization microscopy, analogous to those for optical imaging at larger scales. Small particles are useful for mapping certain effects of optical aberrations. However, their size distribution and random deposition can result in nonuniform sampling of the imaging field, fluorophores in particles often have a different emission spectrum from that of fluorophores in solution, and evaluating magnification requires a specification of distance between emitters. DNA origami can control the sub-micrometer distance between a few fluorophores, but this approach has limitations of emitter intensity and stability, as well as sampling uniformity. Stages require their own calibration to scan emitters through the imaging field, while microscope instability can limit sampling accuracy. Arrays of sub-resolution apertures enable calibration of both aberrations and magnification, with intense and stable emission, and uniform and accurate sampling. Aperture arrays can be calibrated for effects of chromatic aberrations on image registration, sample orientation and aberrations in three dimensions, and image pixel size. But challenges remain for quantifying critical dimensions of an aperture array to produce a reference material. Other problems persist as follows.

Electron-multiplying charge-coupled-device (EMCCD) cameras were common at the advent of localization microscopy and their calibration continues. Complementary metal-oxide-semiconductor (CMOS) cameras are of increasing interest due to advantages of performance and cost but have nonuniform sensitivity and read noise. Initial studies tested the effects of CMOS noise on localization and improved the localization of single fluorophores. However, no study has calibrated over the full dynamic range of a CMOS camera to maximize the number of signal photons and minimize statistical uncertainty. Previous studies have improved illumination uniformity and performed Hatfield corrections but have not accounted for all related CMOS nonuniformities.

Localization analysis extracts information from optical images. Maximum-likelihood and weighted least-squares methods, with specific estimators for CMOS cameras, compete on the basis of accuracy and efficiency. However, previous studies have not evaluated the performance of each method in the presence of discrepancies between model approximations of the point spread function and experimental data. The resulting fitting errors are common for models that neglect deformations from aberrations, which vary across a wide field.

Finally, localization of a fiducial marker such as a small particle often provides a reference position for correcting systematic errors from unintentional motion of the sample or microscope. A typical but critical assumption is that the fiducial is motionless with respect to the sample. However, there are open questions about whether nanoparticle fiducials are truly static on imaging substrates. Confounding this issue, microscope systems are not perfectly stable, and there is no appropriate reference material for assessing their subnanometer stability across a wide field.

In this Example, we present a comprehensive solution to this overall problem, reducing localization errors from a widefield optical microscope by up to four orders of magnitude and transforming the microscope into a quantitative metrology system. We develop aperture arrays into prototype reference materials with multiple functions and combine them with novel methods to calibrate the parts of the system and their interaction during a measurement. We validate our widefield measurements and quantify localization error approaching the scale of atomic diameters across a submillimeter field, for multiple colors and emission sources. We apply our new measurement capability to introduce the concept of critical-dimension localization microscopy of aperture arrays and to answer open questions about the apparent motion of nanoparticle fiducials. By minimizing and quantifying systematic errors at subnanometer scales, we enable rigorous confidence in precision as the limit of accuracy for localization microscopy.

We designed and fabricated square arrays of circular apertures with nominal diameters ranging from 200 nm to 500 nm in titanium and platinum films with a total thickness of approximately 100 nm on silica substrates with a thickness of approximately 170 nm. We use two different electron-beam lithography systems to pattern independent arrays and test the accuracy of aperture placement. Both lithography systems have traceable laser interferometers that measure stage position with a resolution of approximately 0.6 nm in the x and y directions to calibrate electron-beam position and to confirm the absence of, or correct for, electron-optical aberrations. To avoid additional errors of aperture placement from stage motion of the lithography systems, we limit the lateral extents of our arrays to single write fields.

For some measurements, we filled the aperture array with a solution of boron-dipyrromethene dye at a concentration of approximately 200 μM in N,N-dimethylformamide. We also test fluorescent nanoparticles as fiducial markers. The manufacturer specifies polystyrene spheres with a mean diameter of 220 nm, containing boron-dipyrromethene dye molecules and having a carboxylic acid coating. We disperse the nanoparticles in pure water, deposit 10 μL of the suspension onto a borosilicate coverslip with a thickness of approximately 170 μm and a poly-D-lysine coating, and remove the suspension after 1 min. We expect the nanoparticles to bind electrostatically to the coverslip. We cover the sample surface with pure water and seal it with another borosilicate coverslip for imaging.

The microscope had an inverted stand, a scanning stage that translated in the x and y directions with a sample holder that rotated around these axes, and a piezoelectric actuator that translated an objective lens in the z direction with a nominal resolution of 10 nm. We typically use an objective lens with a nominal magnification of 63×, a numerical aperture of 1.2, and an immersion medium with an index of refraction of 1.33, resulting in a nominal depth of field of 0.95 μm at a wavelength of 500 nm. We reconfigure the microscope to epi-illuminate fluorescent dye in aperture arrays and fluorescent nanoparticles on a microscope coverslip or trans-illuminate empty aperture arrays with a light-emitting diode (LED) array. The numerical aperture of the transilluminator condenser is 0.55. The microscope has a CMOS camera with 2048 pixels by 2048 pixels, each with an on-chip size of 6.5 μm by 6.5 μm. We operated the camera with water cooling and without on-board correction of pixel noise. We typically operated the camera in fast-scan mode, cool the sensor to −10° C., and calibrate the imaging system for these parameters. In tests of fiducial stability, we operated the camera in slow-scan mode and cool the sensor to −30° C. For fluorescence imaging, we used an excitation filter with a bandwidth from 450 nm to 500 nm, a dichroic mirror with a transition at 505 nm, and an emission filter with a bandwidth from 515 nm to 565 nm. We equilibrated the microscope for at least 1 It before acquiring data at an ambient temperature of approximately 20° C.

We leveled the aperture array by iteratively rotating it around its x and y axes and translating the objective lens in the z direction to simultaneously focus on apertures at the four corners of the imaging field. We tested an alternate method for leveling the sample by analysis of Zernike coefficients. Unless we note otherwise, we translated the objective lens through z to obtain a series of images around optimal focus for each aperture in an array. We image at array centers unless we note otherwise.

For each pixel i, we measure pixel value offset $o_i$ as the mean and read noise $\sigma_{read,i}^2$ as the variance of 60000 images with the camera shutter closed. We determine flatfield corrections by imaging a white, planar object that is far out of focus and effectively featureless, at nine illumination levels spanning the dynamic range of the imaging sensor, $$FF_i = \frac{\overline{T_i^*} - o_i}{\overline{T}},$$

where $T_i$ is the mean value of pixel i from 15000 images at an illumination level, $o_i$ is the pixel value offset, and $\overline{T}$ is the mean value of $\overline{T_i^*} - o_i$ from all pixels. The total noise of each pixel is the variance of the pixel value minus the pixel value offset from the 15000 images at an illumination level.

We fit polynomial models to data using unweighted least-squares estimation and the Levenberg-Marquardt method to determine optimal focus, characterize CMOS response, and calculate Zernike coefficients. We fit Gaussian models to images of point spread functions using various estimators and the Nelder-Mead simplex method to localize single emitters.

Figure 10:
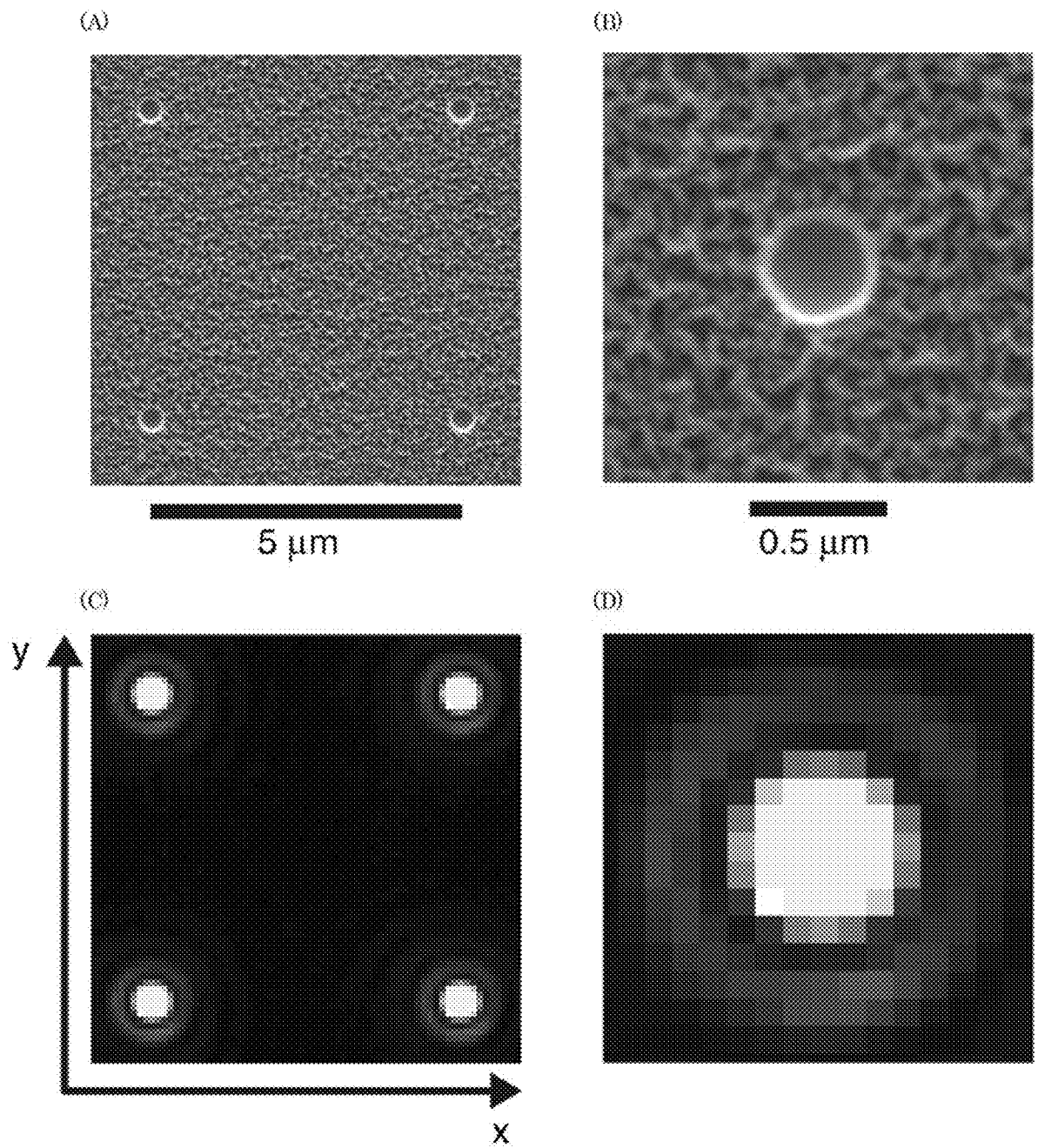
FIG. 10 shows electron micrographs of an aperture array in panels A and B and optical micrographs thereof in panels C and D.

We tested epi-illumination of a fluorescent dye in the apertures and transillumination of empty apertures as relevant configurations for localization microscopy. Whereas the dye solution degrades and requires cleaning, empty apertures are more stable and thus appropriate for developing our calibration methods. After doing so, we revisit the difference between the two configurations. Transillumination of empty apertures produces an array of point sources, as FIG. 10 shows. An array pitch of at least 5 μm ensures that the point spread functions from adjacent apertures do not overlap significantly. In FIG. 10, scanning electron micrographs show representative apertures in a metal bilayer on a silica substrate. In panel A, the array has a nominal pitch of 5 μm. In panel B, apertures have nominal diameters of 400 nm and smaller functional diameters. In panel C and D, brightfield optical micrographs show representative apertures transmitting light. False color represents peak illumination wavelength of 500 nm. Panel C shows four apertures form unit cells for pitch analysis. Panel D shows an image of an aperture closely resembles the point spread function of the imaging system.

Accurate localization of aperture images involves calibration of the CMOS camera. Nonuniform pixel gain, sensor packaging, and illumination intensity cause variation in pixel value, motivating a flatfield correction. This correction increases with pixel value mean through the bottom 5% of the dynamic range and then remains nearly constant over the remaining 95%. We used a constant correction in analysis of pixel values that span the full dynamic range. Total noise, or pixel value variance, including read noise, shot noise, and fixed-pattern noise, does not depend linearly on pixel value mean over the full dynamic range in contrast to a linear approximation from Poisson statistics at low pixel values. A quartic polynomial is a better approximation, but the linear approximation results in localization that is equally accurate and more efficient.

Figure 11:
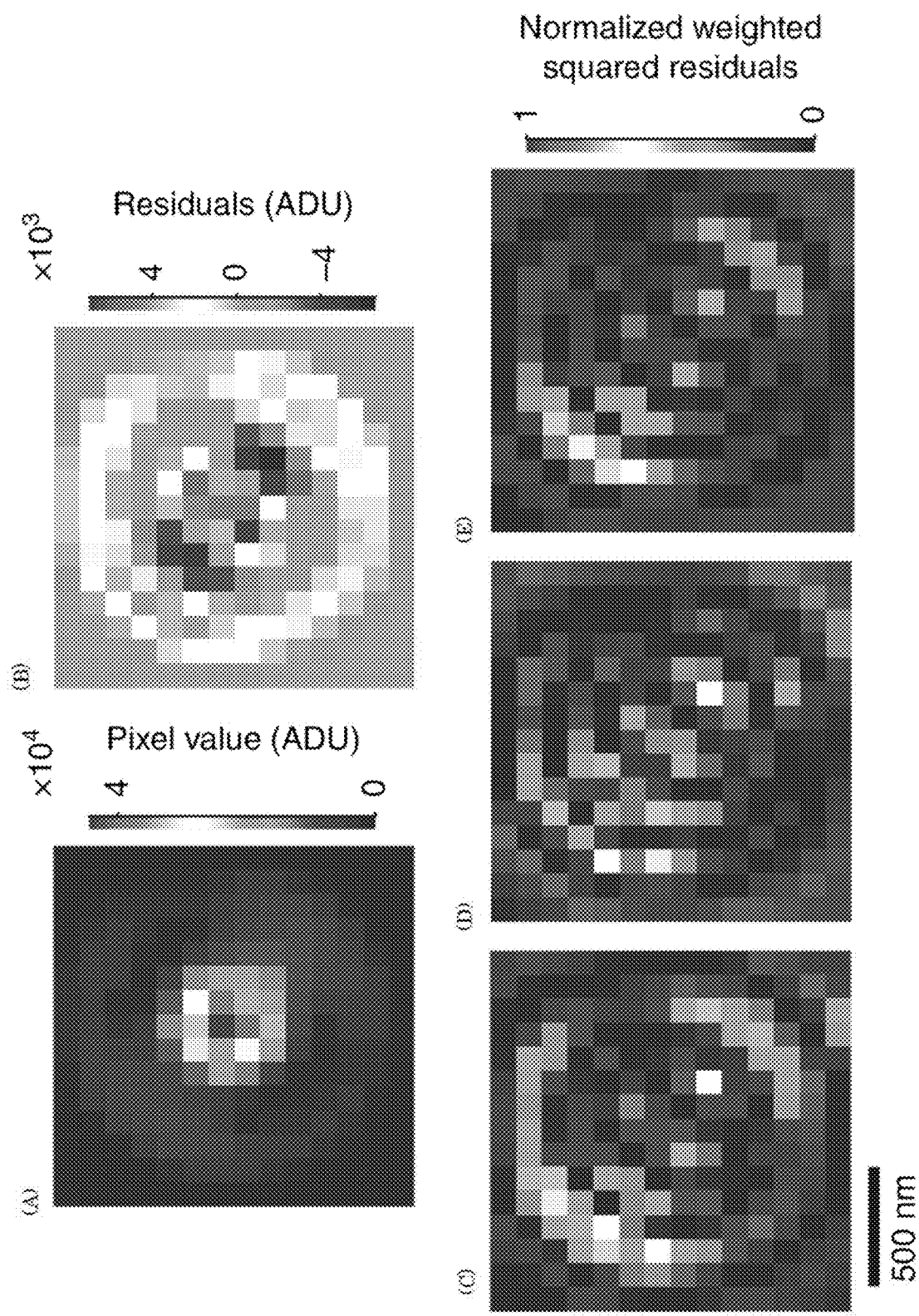
FIG. 11 shows localization processing in panels A-E.

Aberrations, such as from objective lenses 44, can become significant across a wide field and deform the point spread function in ways that are typically unpredictable. Most localizations do not account for such deformation. Previous studies have not fully explored the effects of fitting errors on performance of weighted least-squares or maximum-likelihood estimation. These methods can include information from CMOS calibration and shot noise, unlike unweighted least-squares. There are arguments for and against each method. Rather than strictly adhering to one method or another, we used the aperture array to test their performance in the presence of fitting errors from aberration effects, which vary across a wide field. For this test, we select a bivariate Gaussian approximation of the point spread function, $$G_{biv}(x, y) = A \cdot \exp - \left( \frac{1}{2(1-\rho^2)} \left[ \frac{(x-x_0)^2}{\sigma_x^2} - 2\rho\frac{(x-x_0)(y-y_0)}{\sigma_x\sigma_y} + \frac{(y-y_0)^2}{\sigma_y^2} \right] \right) + C \quad (1)$$

where A is the amplitude, $x_0$ is the position of the peak in the x direction, $y_0$ is the position of the peak in the y direction, $\sigma_x$ is the standard deviation in the x direction, $\sigma_y$ is the standard deviation in they direction, p is the correlation coefficient between the x and y directions, and C is a constant background. Unlike a univariate Gaussian function, this model has some empirical ability to accommodate asymmetry from deformation of the point spread function, which can be significant, as FIG. 11 shows at a corner of the imaging field, 140 μm away from its center. FIG. 11 shows images from localization methods, wherein, panel A shows a brightfield optical micrograph of the localization region of interest containing a point spread function with asymmetry from aberrations. Pixel values are in analog-to-digital units (ADU). False color enhances contrast. We fit a bivariate Gaussian model to the data to test the estimation performance of three localization methods in the presence of model discrepancy. Panel B shows a plot of residuals from a fit using the light-weighting objective function. Panels C-E show plots of weighted squared residuals on a normalized scale. Panel C shows that a weighted least-squares heavily weights the first Airy ring. Panel D shows that a maximum-likelihood heavily weights between the central peak and Airy ring. Panel E shows that light-weighting results in more uniform weighting than either (c) or (d) and improves empirical localization precision on average.

In light of the fitting errors that result, we introduce an empirical objective function for robust parameter estimation. The light-weighting objective function reduces the effect of fitting errors whether the model overestimates or underestimates the data, $$\hat{\Theta} = \operatorname{argmin}\left[\sum_i \frac{(I_i - E_i)^2}{g \cdot \max(I_i, E_i) + \sigma_{read,i}^2}\right] \quad (2)$$

where $\hat{\Theta}$ is the estimate for the parameter set $\hat{\Theta} = \{A, \sigma_x, \sigma_y, \rho, x_0, y_0, C\}$, i indexes each pixel, $I_i$ is the experimental pixel value after CMOS calibration, $E_i$ is the expected or model pixel value, g is the nominal gain of the camera, and $\sigma_{read,i}^2$ is the pixel read noise. The use of $\max(I_i, E_i)$ selects either weighted least-squares ($I_i > E_i$) or maximum-likelihood ($I_i < E_i$) to reduce the weights of pixels with large residuals due to model discrepancy The method performance depends on both the deformation extent and the photon count. For our wide field and intense emitters, light-weighting improves empirical localization precision on average. In field regions with large deformation, unweighted least-squares improves localization precision relative to the other methods. In field regions with small deformation, light-weighting, maximum-likelihood, and weighted least-squares perform comparably. The same is true in the case that the localization region of interest excludes regions of the point spread function that cause the largest fitting errors but doing so degrades empirical localization precision on average. We subsequently quantify localization error, including any effects of fitting errors.

Figure 12:
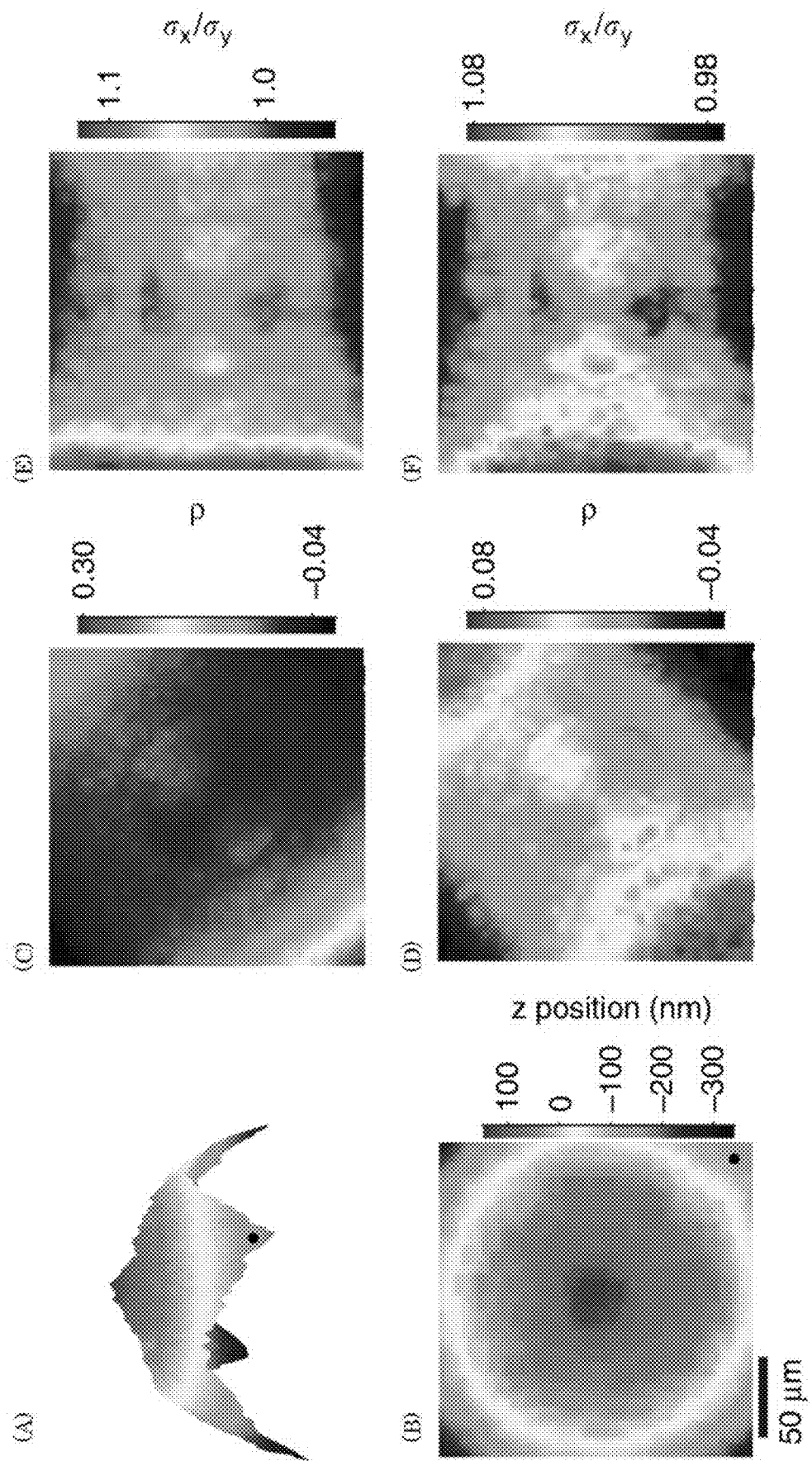
FIG. 12 shows field curvature and point spread function deformation in panel A-F.

Aberrations degrade localization accuracy through several effects. In our experimental system, a silica substrate of standard thickness and high quality underpins the aperture array and is therefore part of the microscope system and its calibration. Additional calibration can occur for aberration effects from an experimental sample. We begin to calibrate aberration effects by characterizing the bivariate Gaussian approximation of the point spread function in three dimensions. We image the aperture array through focus and locate optimal focus for each aperture as the z position that maximizes the amplitude of the resulting point spread function. The field curves in the z direction over a range of approximately 500 nm, as panel A and B of FIG. 12 show. We confirm the effective flatness of the aperture array. Without such characterization, a nonplanar array can corrupt calibration for localization in three dimensions. The complex curvature of the field motivates the use of an aperture array to uniformly sample it and has several consequences. Not all objects across the field can be at optimal focus simultaneously. Many experiments permit acquisition of only a single micrograph, which can be at a z position that maximizes the mean amplitude of point spread functions across the field. We define this optimal focal plane as z=0 nm in panel B of FIG. 12. If the quasi-static imaging of stable emitters is feasible, then acquiring multiple micrographs along the curving field allows for optimal focus of each point spread function. FIG. 12 shows field curvature and point spread function deformation, wherein panels A and B show plots of the curving field of the imaging system. Black dots mark the same corner. The optimal focal plane is at z=0 nm. Panel C shows a plot for a larger range of $\rho$ from a single image at the optimal focal plane, maximizing the mean amplitude of all point spread functions. Panel D shows a smaller range of $\rho\rho$ from multiple images along the curving field, maximizing the amplitude of each point spread function. Panel E shows a plot of $\sigma_x/\sigma_y$ from a single image at the optimal focal plane. Panel F shows a plot of $\sigma_x/\sigma_y$ from multiple images along the curving field. For these plots and subsequent plots showing optical effects, we use linear interpolations of data between aperture positions.

For the bivariate Gaussian approximation of the point spread function, the dimensionless parameters $\rho$ and $\rho_x/\sigma_y$ describe asymmetries resulting from deformation. We extract these parameters from one image at the optimal focal plane, as panels C and E of FIG. 12 show, and from multiple images along the curving field at which all apertures are in optimal focus, as panels D and F of FIG. 12 show. In either case, the parameters have a similar field dependence. Imaging through focus reduces the range of $\rho$ by a factor of approximately three but has little effect on $\sigma_x/\sigma_y$. Either analysis can improve localization by fixing or improving initial guesses of model parameters in minimization methods, which can occur in localization accuracy. These results also imply the potential for parameterizing accurate models of the point spread function, as well as for exploiting intrinsic aberrations to localize emitters in three dimensions.

Figure 13:
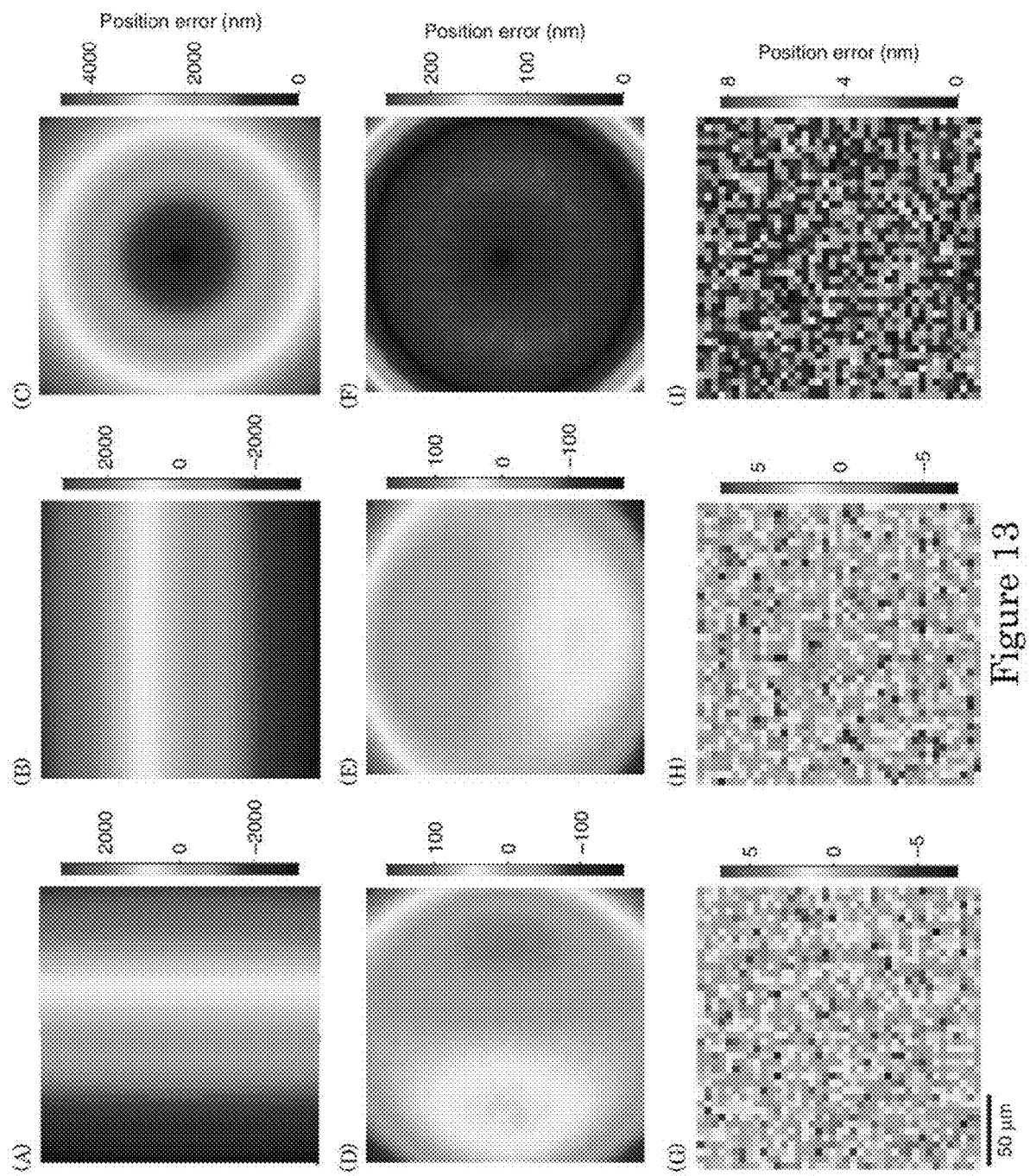
FIG. 13 shows position errors in panel A-I.

From one micrograph at the optimal focal plane, we localize each aperture and perform a similarity transformation to map an ideal array, with a pitch that is identical to the nominal value of 5 µm, to the localization data. This transformation includes planar translation and rotation, and uniform scaling to determine the mean value of image pixel size. The differences between the positions that we measure and the nominal positions in the ideal array define position errors. The transformation scale factor results in a mean value of image pixel size of 99.94 nm, which is 3% smaller than the nominal value of 103 nm. We revisit the uncertainty of image pixel size. Using the nominal value of image pixel size, which is a common but inadvisable practice, results in position errors of up to 4.5 µm, as panels A-C of FIG. 13 show. Using the mean value of image pixel size resulting from the similarity transformation reduces these position errors by a factor of more than 18, however, the errors are still as large as 250 nm and vary nonmonotonically across the field, as panels D-F of FIG. 13 show. These position errors are due primarily to pincushion distortion but also to field curvature and deformation of the point spread function. This extent of magnification calibration is comparable to that of a previous study that averaged over these effects in determining a mean value of image pixel size and demonstrates the utility of sampling the field with an aperture array to further reduce systematic errors from aberration effects. FIG. 13 shows, in panel A-C, plots of position errors in (a) the x direction, (b) the y direction, and (c) total magnitude, due mostly to using the nominal value of image pixel size of 103 nm. Panels D-F shows plots of position errors in (d) the x direction, (e) the y direction, and (f) total magnitude, after applying a similarity transformation to map the data in (a-c) to an ideal array, due mostly to using the mean value of image pixel size of 99.94 nm. Panels G-I show plots of position errors in (g) the x direction, (h) the y direction, and (i) total magnitude after applying a correction model to the localization data in (d-f), due mostly to placement precision.

With other objective lenses, our microscope system shows comparable aberration effects of variable magnitude and field dependence. The objective lenses resulted in mean values of image pixel size that are smaller than the nominal values by approximately 3%, indicating that our microscope tube lens is the primary source of this systematic error. The lens with the lowest numerical aperture results in the smallest position errors, revealing a competition between collection efficiency and magnification uniformity that exists in the absence of calibration.

Figure 14:
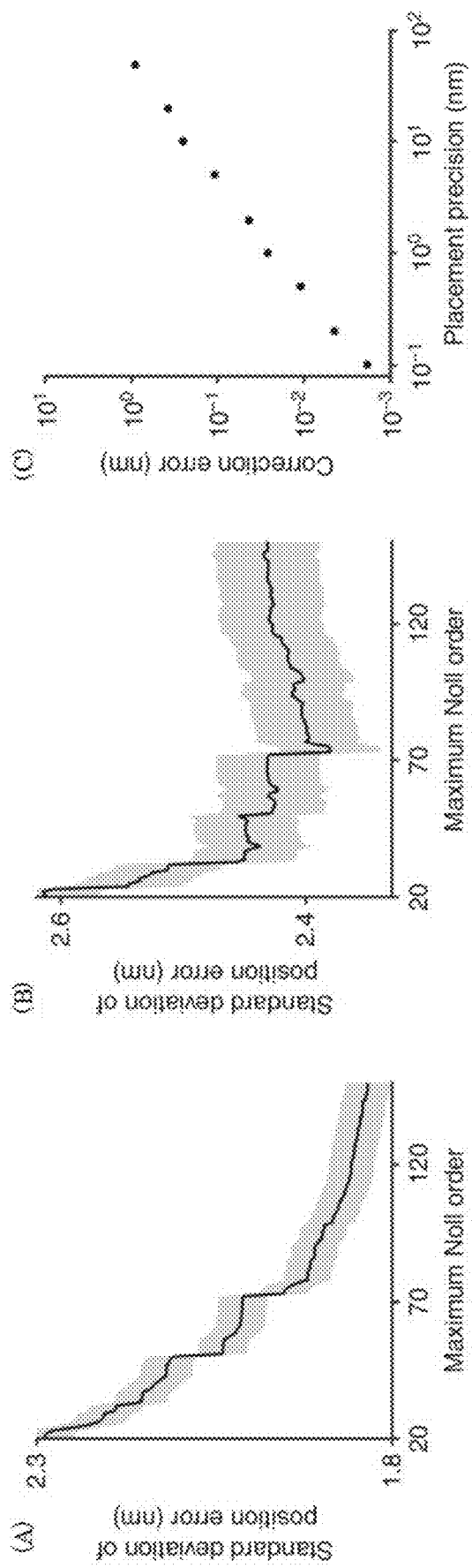
FIG. 14 shows correction modeling in panel A-C.

We model the position errors in panels D-F of FIG. 13 by a linear combination of consecutive Zernike polynomials to develop a widefield correction that is applicable to position data from many forms of localization microscopy. The correction takes as input the inaccurate position of an emitter from a localization measurement and gives as output its accurate position. The similarity transformation gives the value of image pixel size. At the center of the standard array from which we derive the model, the standard deviation of position error decreases monotonically with maximum Noll order, as panel A of FIG. 14 shows. Decreases correspond to polynomials with odd radial degrees greater than 1 and azimuthal degrees of 1 and −1, providing insight for optimization of the model by selection of a subset of nonconsecutive Zernike polynomials. FIG. 14 shows plots of representative values of the standard deviation of position errors in a single lateral dimension after correction, as a function of the number of consecutive Zernike polynomials in the model, or the maximum Noll order. A maximum Noll order of less than 20 corrects the largest fraction of the position errors. Panel A shows, at the center of the standard array from which we derive the model, the standard deviation decreases monotonically with maximum Noll order as the model corrects position errors due primarily to aberrations. Panel B shows, after applying the model from (a) to a different region of the standard array, the standard deviation decreases to a minimum at a maximum Noll order of 73 and then increases with additional orders, indicating erroneous inclusion of position errors due to placement precision at the array center. Plots for other regions of the array are similar. Gray bounds are one standard error. Panel C shows a plot of correction error, which increases approximately linearly with placement precision. Standard errors are smaller than the data markers.

We quantify the effect of placement precision on the correction model by two novel tests. First, we apply the correction to a different region of the standard array. The standard deviation of position error decreases to a minimum at a maximum Noll order of 73 and then increases, as panel B of FIG. 14 shows. This trend indicates a limit beyond which additional consecutive Zernike polynomials erroneously correct position errors due to placement precision at the array center, degrading correction accuracy. To test this effect in the correction model of maximum Noll order 73, we simulate position errors due to placement precision as the standard deviation of a normal distribution around a mean pitch of 5 µm and apply the correction to the resulting positions. The correction error depends approximately linearly on the magnitude of placement precision, as panel C of FIG. 14 shows and contributes less than 0.05 nm to the localization error for our aperture array.

The correction model of maximum Noll order 73 reduces the position errors in panels D-F FIG. 12 by another factor of 30, resulting in position errors in the x and y directions that are apparently random, as panel G-I of FIG. 12 show. The mean value of position errors is zero by definition of the similarity transformation, and the standard deviations of position errors for this standard array are listed in Table 1. We revisit these quantities to clarify their meaning.

TABLE 1

| Array | x direction (nm) | y direction (nm) |
| --- | --- | --- |
| Standard process | 1.95 ± 0.03 | 1.97 ± 0.03 |
| Low current, long dwell | 2.43 ± 0.04 | 2.00 ± 0.03 |
| Low current, many passes | 2.11 ± 0.04 | 1.35 ± 0.02 |

Optimal use of the aperture array requires control of its z position with respect to the imaging system, and, by extension, its orientation around the x and y axes. Although our nominal depth of field of nearly 1 µm is much greater than our positioning resolution in the z direction of 10 nm, position errors in the x and y directions are still sensitive to changes in the z direction that are as small as 10 nm, which deform the imaging field radially. For z positions beyond 150 nm from optimal focus, the standard deviation of position errors increases by more than 1 nm. Correction of experimental data will typically require disengagement of a reference material and engagement of an experimental sample, which can cause localization errors from variation in z position. This sensitivity also indicates the importance of microscope stability, as we investigate subsequently.

To validate widefield measurements and correction of position errors, we scan the aperture array to sequentially position all apertures included in the data in FIG. 13 within the central 100 µm$^2$, or 0.2%, of the imaging field area. This scanning measurement minimizes the effects of photon-optical aberrations to the extent that we can sample them with an array pitch of 5 µm, as FIG. 12 and panel D-F of FIG. 13 show. Pitch values within unit cells of the array are independent of the resolution and repeatability of the scanning stage of the optical microscope. For 1600 pairs of apertures, scanning measurements result in pitch values that are apparently consistent with widefield measurements.

Analysis shows that scanning and widefield measurements include sources of error and enables discrimination between the errors. From this analysis, we determine that placement precision results in position errors with a standard deviation of 1.71 nm±0.05 nm in the x direction and 1.81 nm±0.05 nm in the y direction, and that widefield measurements have a localization error of 0.62 nm±0.20 nm in the x direction and 0.72 nm±0.19 nm in the y direction, independently of empirical localization precision. These uncertainties are standard errors.

Measurements have errors that limit accuracy, and our quantification of localization error in widefield measurements is an important advance. One metric for assessing the resulting performance is the field size to localization error ratio of $3\times10^5$.

Registration of localization data from different wavelengths can result in errors from chromatic aberrations. To study these effects, we sequentially trans-illuminate the aperture array with three colors, acquiring three micrographs at each z position. For each color, we determine the z position of the optimal focal plane, the mean value of image pixel size, and the correction model. The mean values of image pixel size differ due to lateral chromatic aberration, and the z positions of the optimal focal planes differ due to axial chromatic aberration.

Figure 15:
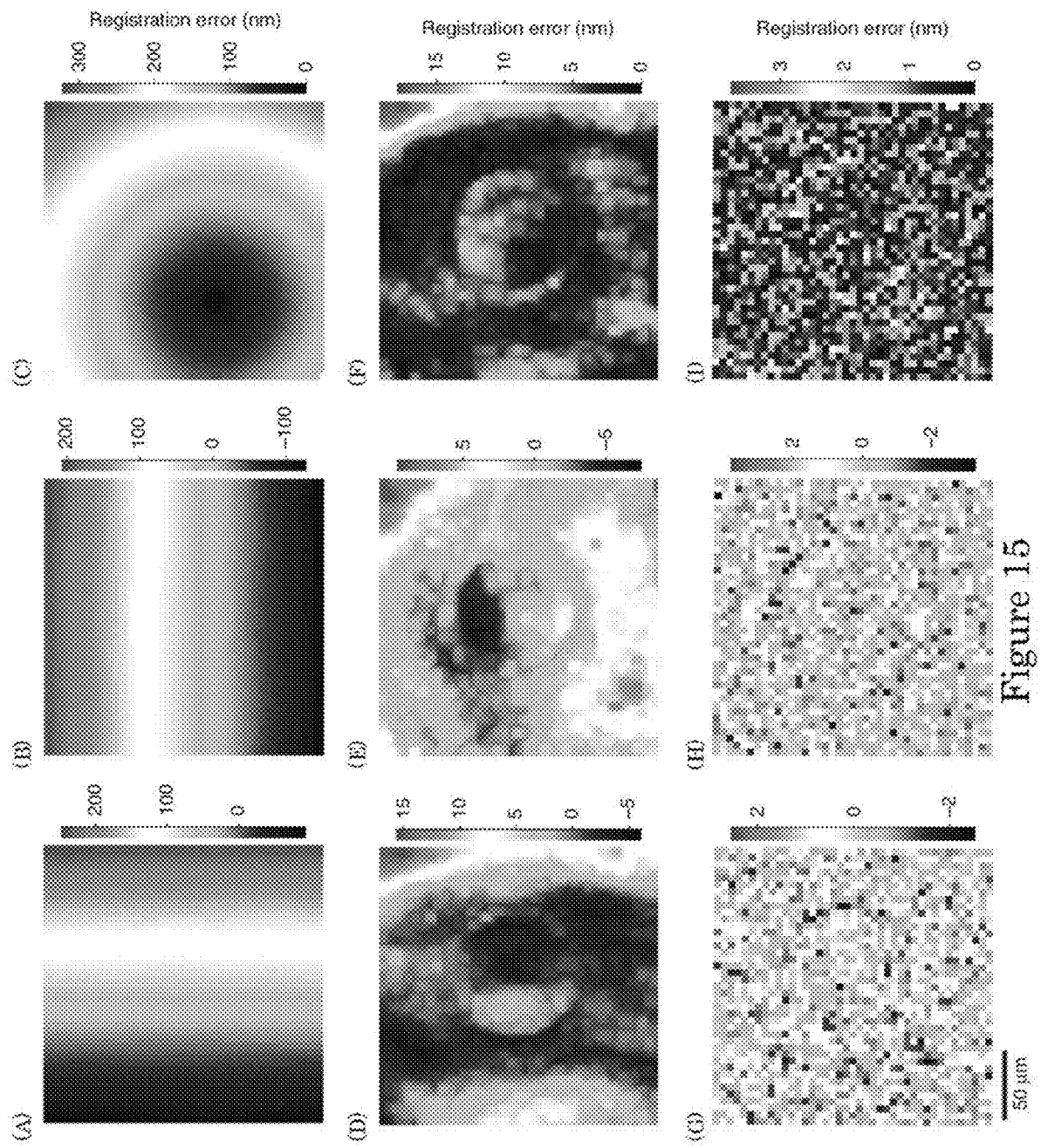
FIG. 15 shows registration errors in panel A-I.

The difference in mean values of image pixel size, and a lateral offset, dominate registration errors, as panels A-C of FIG. 15 show for peak wavelengths of 500 nm and 630 nm. We reduce the effects of axial chromatic aberration by selecting and registering micrographs at the optimal focal plane for each color. Registration errors increase for a common z position for multiple colors due to defocus of at least one color. A similarity transform of the localization data before registration reduces the errors in panels A-C of FIG. 15, resulting in systematic errors from the dependence of distortion on color, extending to over 15 nm, as panels D-F of FIG. 15 shows. Errors are due only to chromatic aberrations, adding to the errors in FIG. 13. In a novel analysis, we correct data from each color prior to the similarity transform. This correction removes the systematic errors from panels A-F of FIG. 13 and panels D-F of FIG. 15, resulting in registration errors that are apparently random, as panels G-I of FIG. 15 shows. The corresponding localization errors are 0.35 nm±0.01 nm in the x direction and 0.47 nm±0.01 nm in the y direction. These uncertainties are standard errors. These localization errors are consistent with but smaller than the localization error that we determine from a comparison of widefield and scanning measurements, indicating the existence of systematic components of localization error that cancel in data registration. FIG. 15 shows registration errors, wherein panel (a) shows the x direction, panel (b) the y direction, and (c) total magnitude, due mostly to different mean values of image pixel size and a lateral offset for localization data of different colors. Panels D-F shows plots of registration errors in (d) the x direction, (e) the y direction, and (f) total magnitude, after applying a similarity transformation to the localization data, due mostly to variable distortion from chromatic aberration. Panels G-I show plots of registration errors in (g) the x direction, (h) the y direction, and (i) total magnitude, after applying correction models to the localization data before a similarity transformation, due mostly to localization error and empirical localization precision.

We compare transillumination of empty apertures and epi-illumination of fluorescent dye in the apertures. The emission wavelengths are similar but not identical for this comparison. As an exemplary quantity for comparison, the mean values of image pixel size are 100.07 nm for transillumination and 100.16 nm for epi-illumination, which differ by more than is attributable to any potential effects of chromatic aberrations. These results indicate effects of the illumination and aperture optics, and the requirement for matching the emission of light from apertures to an experimental system to calibrate it. Our reference material and calibration method work equally well for either experimental configuration, indicating their general applicability. Diverse sample environments are relevant to localization microscopy, motivating future studies of their effects on fluorescence emission and microscope calibration.

We have assumed the absence of effects of electron-optical aberrations on placement accuracy, which would corrupt calibration of systematic effects of photon-optical aberrations. We test this possibility in two ways. First, because the lateral extent of the aperture array exceeds that of the imaging field, we can independently measure different regions of the array. If electron-optical aberrations were significant, then the photon-optical correction would erroneously include their effects at the array center, resulting in systematic errors upon application of the correction to other regions. No such errors are apparent. Second, we sample the full extent of the aperture array by scanning 100 pairs of apertures through the central 0.2% of the imaging field area. No systematic variation in pitch from electron-optical aberrations is apparent.

In a novel test of placement accuracy, we pattern an independent aperture array using a second lithography system. Widefield measurements reveal that the two arrays differ in mean pitch by 0.01 pixels or approximately 1 nm. This difference is extremely statistically significant, with a p value of 0.0006 for the x direction and 0.0004 for they direction but exceeds the position resolution of the lithography stages by less than a factor of two and is approximately half of the standard deviation of position errors due to placement precision. This analysis provides an estimate of placement accuracy, with a corresponding systematic error of image pixel size of 1 nm/5000 nm=0.02%. Importantly, such errors sum arithmetically with distance, as panels A-F of FIG. 13 shows, so that placement accuracy ultimately limits localization accuracy. However, this limitation of the reference material results in a relative error of only 0.02% in our analysis of placement precision and empirical localization precision.

Figure 16:
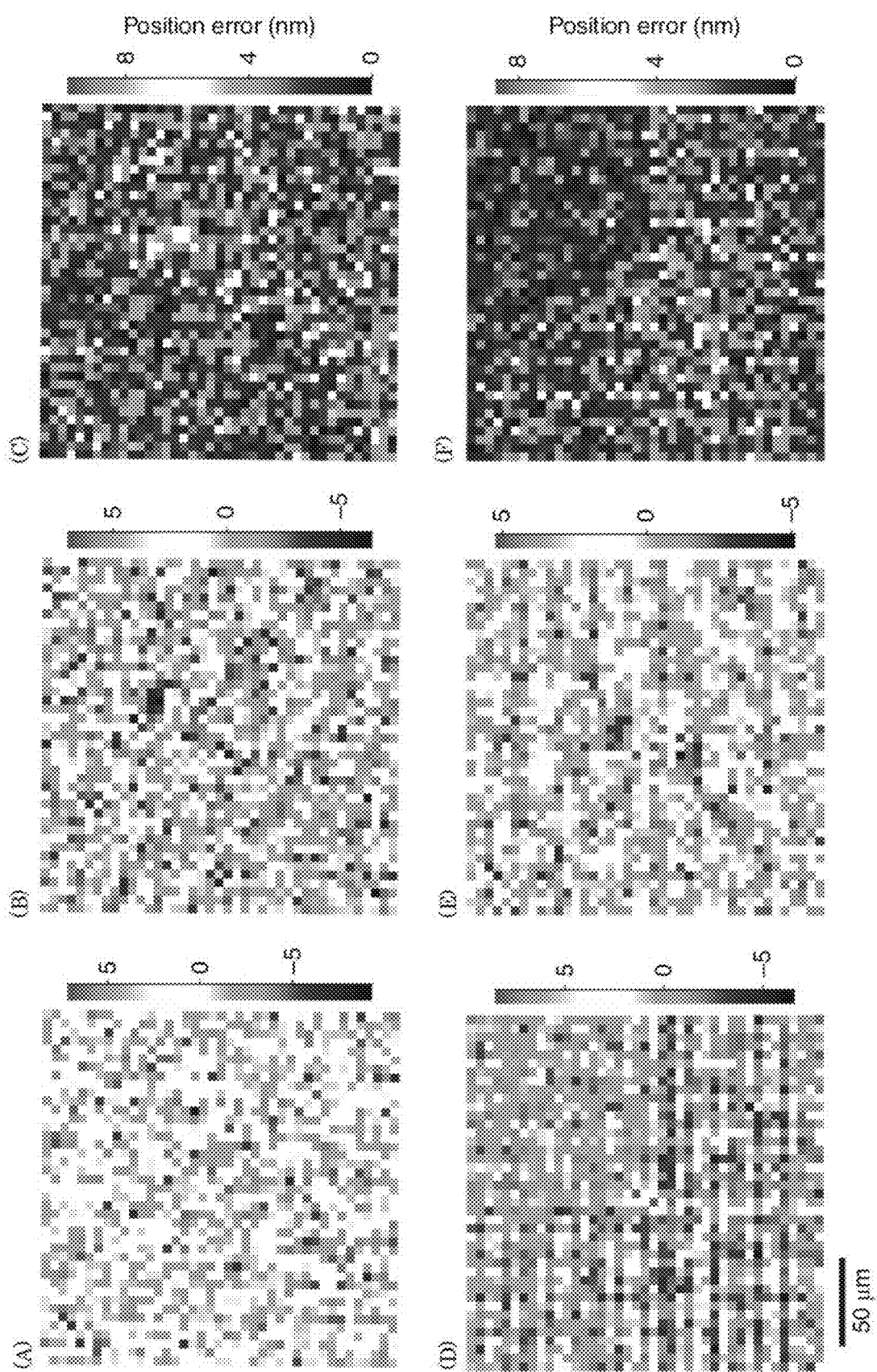
FIG. 16 shows pattern processing in panel A-F.

Our measurement capability closes the gap between common optical microscopes and uncommon instruments for dimensional metrology and is applicable to new tests of aperture arrays. For example, using widefield measurements, we can rapidly quantify the dependence of placement precision on fabrication parameters such as dose rate. We decrease the electron-beam current and increase the dwell time by a factor of five with respect to the standard process. The standard deviation of position errors in the x direction increases, as Table 1 and panels A-C of FIG. 16 show, indicating an asymmetry of our lithography system and that placement precision degrades with decreasing dose rate. Second, we reduce the dwell time by a factor of eight and overwrite the pattern eight times. The standard deviation of position errors decreases in the y direction, but systematic effects increase this value in the x direction, as Table 1 shows, and a striation pattern emerges, as panels D-F of FIG. 16 show. This pattern further indicates an asymmetry of our lithography system and that aperture placement errors compound with pattern overwriting. Interestingly, regions of panels D and F of FIG. 16 show systematically smaller position errors, indicating a useful anomaly of the patterning process. These results are all roughly consistent with the specification of beam positioning of 2 nm for our lithography system, but manifest unpredictable irregularities. The high speed and low cost of critical-dimension localization microscopy would facilitate quality control of aperture arrays in their production as reference materials. FIG. 16 shows, for patterning processes, plots of position errors in (a) the x direction, (b) the y direction, and (c) total magnitude after correcting measurements of aperture positions from an array that we pattern by decreasing the electron-beam current from 1.0 nA to 0.2 nA and increasing the dwell time proportionately to deliver the same dose. Panels D-F show plots of position errors in (d) the x direction, (e) the y direction, and (f) total magnitude after correcting measurements of aperture positions from an array that we pattern by decreasing the electron-beam current from 1.0 nA to 0.125 nA, maintaining the dwell time, and taking eight passes to deliver the same dose.

Transillumination of the aperture array produces an array of point sources that are static with respect to the imaging substrate at any scale that is relevant to our measurements, providing a stable reference material for evaluating any apparent motion of fluorescent nanoparticles as fiducial markers. We localize apertures or nanoparticles in an image series and assess the apparent motion of each point source using two-dimensional rigid transformations to register corresponding points in image pairs. We quantify apparent motion as the standard deviation of the registration errors over $\sqrt{2}$. This analysis eliminates unintentional motion of the measurement system in the x and y directions, but not in the z direction, as a source of error. For static point sources of one color, registration errors are due only to empirical localization precision and random components of localization error. Normalization of this value by theoretical localization precision allows for direct comparison of nanoparticles and apertures. The aperture array then allows for assessment of additional apparent motion. Any such motion of nanoparticles that exceeds that of apertures is due to actual motion. In this evaluation, the time that is necessary for our microscope to image through focus provides an experimental boundary between faster and slower time scales.

Rigid registration of consecutive images enables tests of motion at a time scale of $10^H$ s. Apertures show apparent motion that ranges from 0.30 nm to 0.65 nm in a single lateral dimension, or a factor of 1.2 to 2.0 times the Cramér-Rao lower bound for each aperture. For fluorescent nanoparticles on a microscope coverslip, apparent motion ranges from 0.30 nm to 0.85 nm, or a factor of 1.2 to 1.9 times the Cramér-Rao lower bound for each nanoparticle. These values exceed the Cramér-Rao lower bound by amounts that are consistent with random components of localization error, demonstrating that the nanoparticles apparently do not move at this time scale.

Figure 17:
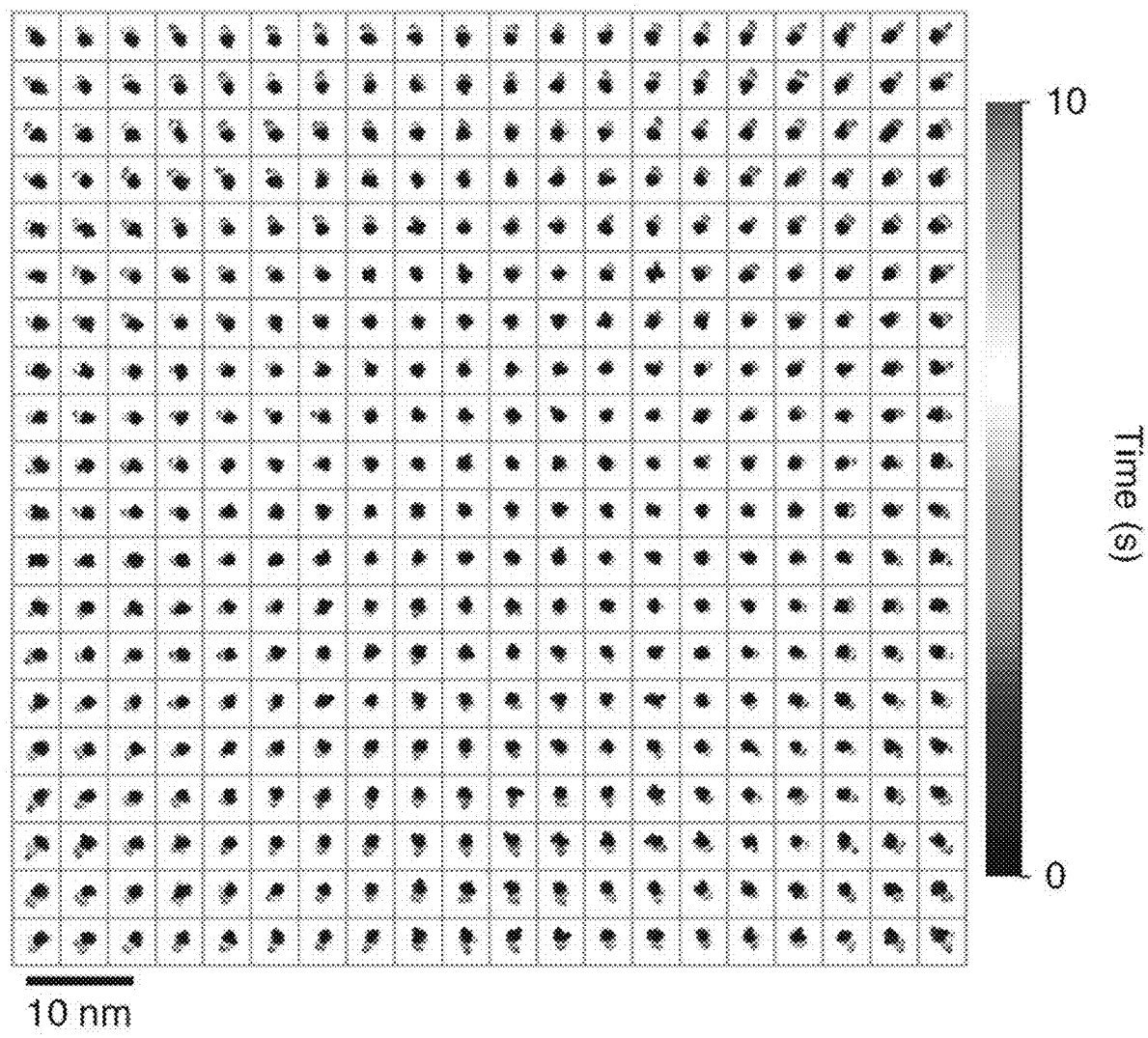
FIG. 17 shows apparent motion.

Rigid registration of each image in a time series with respect to the first image extends the time scale to 101 s. At this time scale, apertures appear to move radially, with registration errors that increase with distance from the center of the field, as FIG. 17 shows. Imaging through focus results in apparent motion that is qualitatively similar, indicating that this apparent motion is consistent with unintentional motion of the measurement system in the z direction. FIG. 17 shows apparent motion in a grid of scatterplots, each corresponding to a single aperture, showing apparent radial motion due to unintentional motion of the measurement system in the z direction over 101 s. The grid spacing indicates an aperture array pitch of 10 µm. The scale bar of 10 nm corresponds to the scatterplots.

At slower time scales, imaging through focus decreases unintentional motion in the z direction to less than 10 nm. Selection of the z position that minimizes registration error complements other active and passive methods for mitigating instability of z position. Over $10^4$ s, both apertures and nanoparticles exhibit apparent motion that is quantitatively consistent within their respective mean values of empirical localization precision of approximately 0.43 nm for apertures and 0.55 nm for nanoparticles. This apparent motion is likely due to differences in z position that are below the positioning resolution between images. Considering that the apertures are static, we conclude that the nanoparticles are static.

With regard to making the aperture array, we began with silica substrates with thickness of approximately 170 µm, surface roughness of less than 0.7 nm root mean square, scratch number of 20, dig number of 10, flatness deviation from $2.5 \times 10^4$ nm·nm$^{-1}$ to $5.0 \times 10^{-4}$ nm·nm$^{-1}$, and a parallelism of better than 0.15 mrad. We deposit a titanium film with a thickness of approximately 10 nm as an adhesion layer, a platinum film with a thickness of approximately 80 nm for optical opacity, a positive-tone electron-beam resist film with a thickness of approximately 120 nm, and an aluminum film with a thickness of approximately 15 nm for charge dissipation.

We used two electron-beam lithography systems, enabling comparison of independent aperture arrays to test placement accuracy, and fabrication of different types of aperture arrays that use and test the different operating modes of the systems. Other than different load locks, the lithography systems have nearly identical hardware. Each system has a scanning stage with two laser interferometers to measure stage position in the x and y directions. The resolution of a stage position measurement is 632.8 nm/1024=0.6180 nm, with traceability to the SI through the operating wavelength of the helium-neon laser. One lithography system operates four of five electron-optical lenses and has a write field of 1 mm by 1 mm, which is useful to avoid stitching errors in patterning aperture arrays for widefield imaging and has a specification for beam placement of 2 nm. The electron-beam current for this system is typically 1.0 nA, although we reduce it in some tests of patterning parameters that we note. The other lithography system operates five of five electron-optical lenses and has a better specification for beam placement of 0.125 nm, which nominally improves placement precision, but does so over a smaller write field of 62.5 µm by 62.5 µm. The electron-beam current for this system is 1 nA. We perform a Monte Carlo simulation of electron trajectories in the film stack to correct the pattern data for proximity effects at an accelerating voltage of 100 kV, and we fracture the pattern data into polygons.

After electron-beam exposure, we removed the aluminum film with tetramethylammonium hydroxide and cold-develop the electron-beam resist in hexyl acetate. Finally, we milled the apertures with argon ions, using a secondary-ion mass spectrometer to monitor emission products and stop at the top surface of the silica substrate. The electron-beam resist was not easily removed after argon-ion milling and did not affect the function of the aperture. Characteristics of aperture arrays are listed in Table 2 for which we characterized width of the point spread function as $(\sigma_x+\sigma_y)/2$. Uncertainties are one standard deviation. The mean size of image pixels is approximately 100 nm.

TABLE 2

| Array pitch (µm) | Array extent (µm) | Nominal aperture diameter (nm) | Point spread function width (pixels) |
|---|---|---|---|
| 5 | 350 by 350 | 200 | 1.28 ± 0.03 |
| 5 | 350 by 350 | 300 | 1.24 ± 0.02 |
| 5, 10 | 350 by 350 | 400 | 1.27 ± 0.02 |
| 5 | 350 by 350 | 500 | 1.37 ± 0.01 |
| 5 | 62.5 by 62.5 | 500 | 1.39 ± 0.01 |

Figure 18:
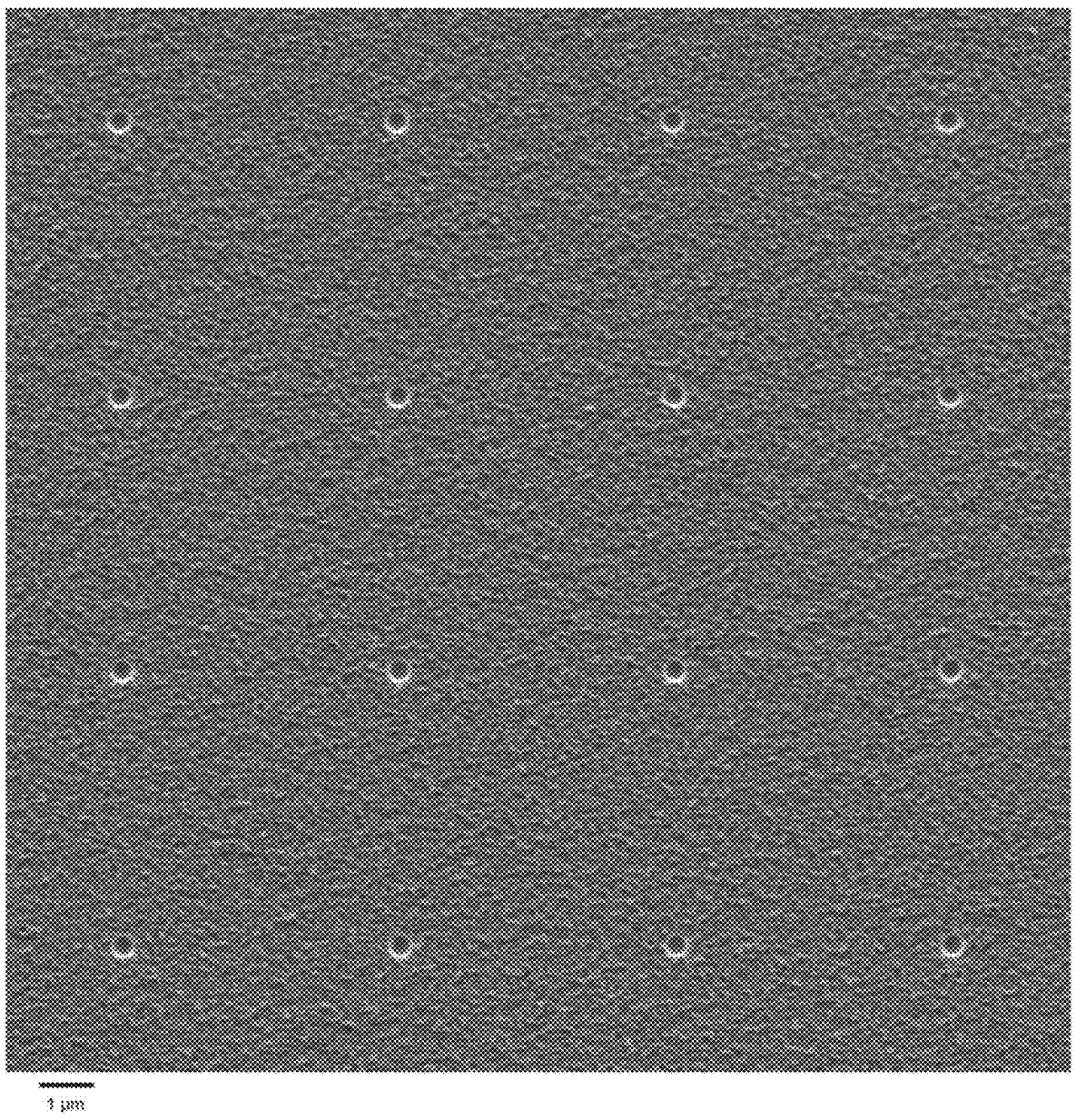
FIG. 18 shows an electron micrograph of an aperture array.

We inspected the standard aperture array by scanning electron microscopy, as FIG. 18 shows, at an accelerating voltage of 1 kV and using an Everhart-Thornley detector at a working distance of 9 mm. The apertures are approximately circular with shape irregularity at the scale of tens of nanometers and nonvertical sidewalls, resulting in functional diameters at the silica surface that are apparently smaller than the nominal diameters. FIG. 18 shows an electron micrograph of an aperture array from scanning electron microscopy that shows 16 apertures. Surface texture around the apertures is from electron-beam resist.

Figure 19:
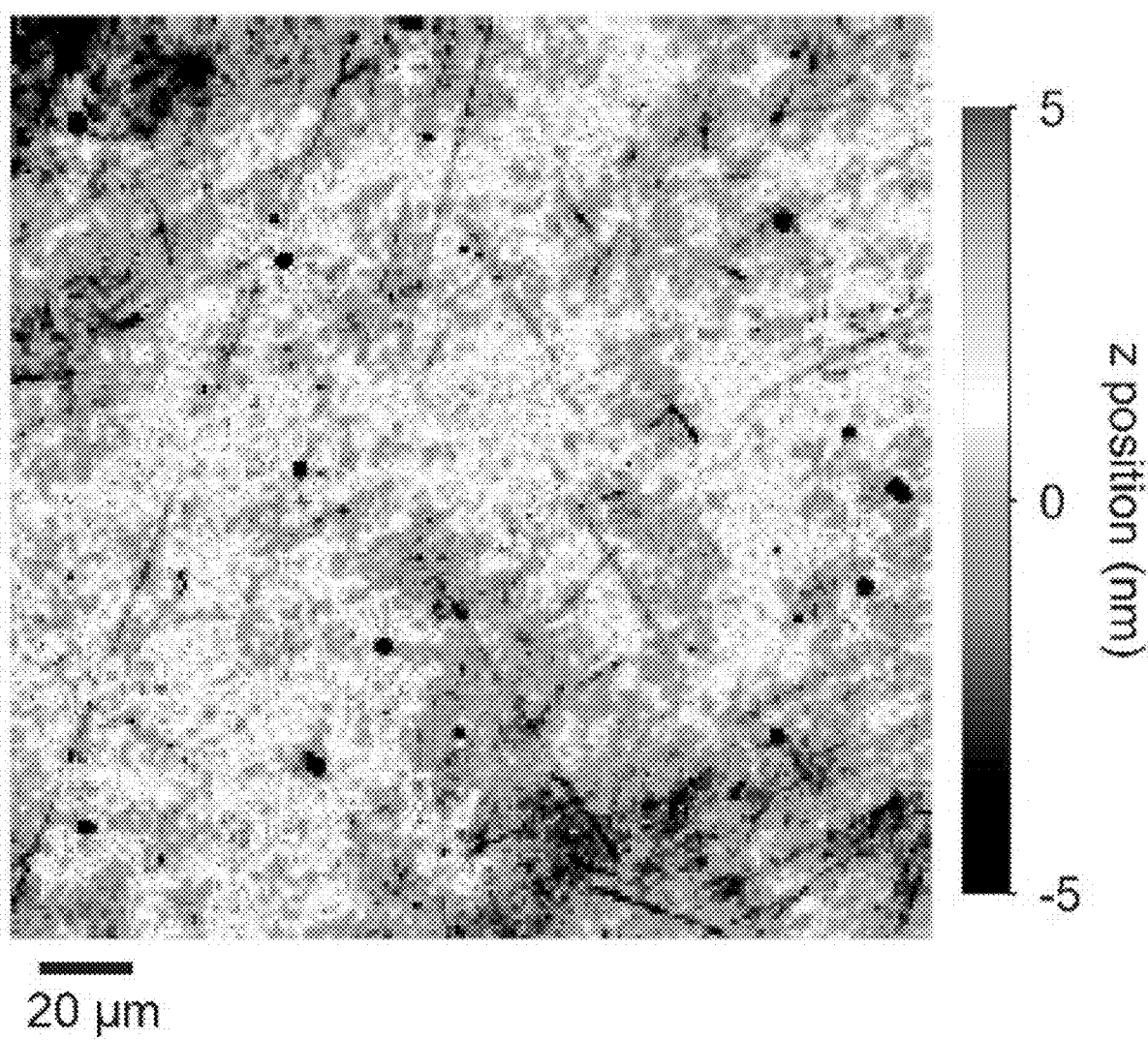
FIG. 19 shows an interferometric optical micrograph of an aperture array.

We measure the upper surface topography of the standard aperture array by interferometric optical microscopy, as FIG. 19 shows, at a peak wavelength of 475 nm with a bandwidth of 125 nm. The z position of the piezoelectric stage of this microscope is traceable to the SI through a reference material for step height, and we further calibrate these measurements using a reference flat of silicon carbide. We extract the center of the interference pattern as a function of z position as the location of the reflecting surface. We fit the resulting upper surface topography of the aperture array to a plane to level it and analyze the z-position variation of the upper surface as an indicator of the lower interface between silica and titanium. We observed scratches and digs consistent with the polish of the silica substrate transferring through conformal films. The standard deviation of z position is 1.76 nm, such that the upper surface is effectively flat within the z-position resolution of 10 nm of our localization microscope. Therefore, in subsequent analysis, we ignore any nonplanarity of the aperture array. However, in the production of reference materials for localization microscopy in three dimensions, this issue motivates the use of even flatter substrates, or the characterization and analytical correction of any nonplanar surface topography of the aperture array.

We applied localization measurements and analyses on apertures of varying nominal diameters that appear as point sources. Results are listed in Table 2. These results indicated that the apertures have functional diameters that are smaller than their nominal diameters, or that our microscope system does not achieve its expected spatial resolution, or a combination of these two effects.

FIG. 19 shows, for an aperture array, an interferometric optical micrograph of the upper surface topography of a representative region corresponding approximately to the aperture array. The apertures are below the resolution of this imaging system. Scratches and digs in the upper surface are consistent with the polish of the lower silica surface. The standard deviation of z position is 1.76 nm.

Figure 20:
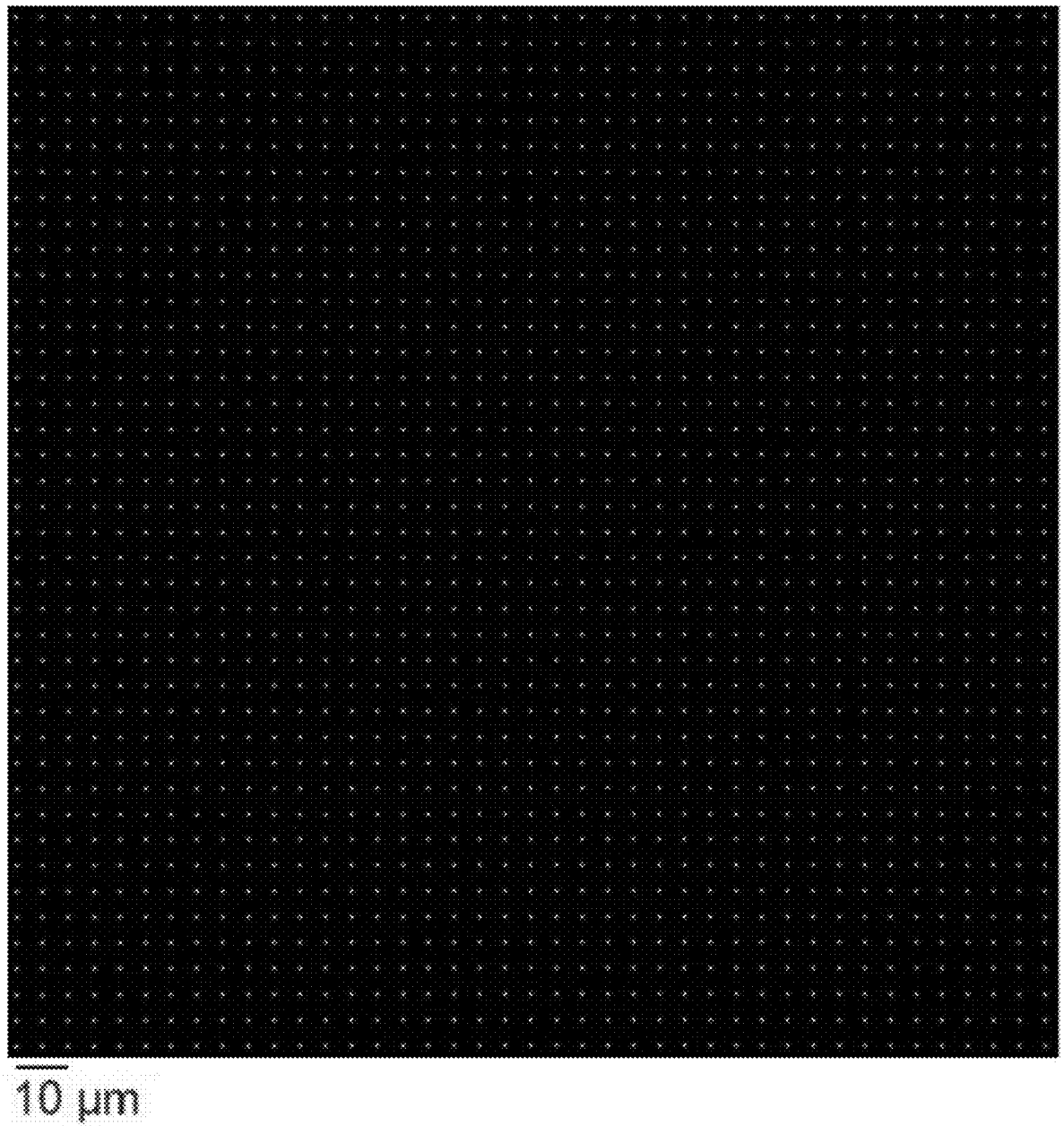
FIG. 20 shows an optical micrograph of an aperture array.

FIG. 20 shows, for an aperture array, a brightfield optical micrograph for transmission of light through an aperture array over the full field of the imaging system of approximately 200 µm by 200 µm. False color represents the illumination wavelengths of around 500 nm.

Figure 21:
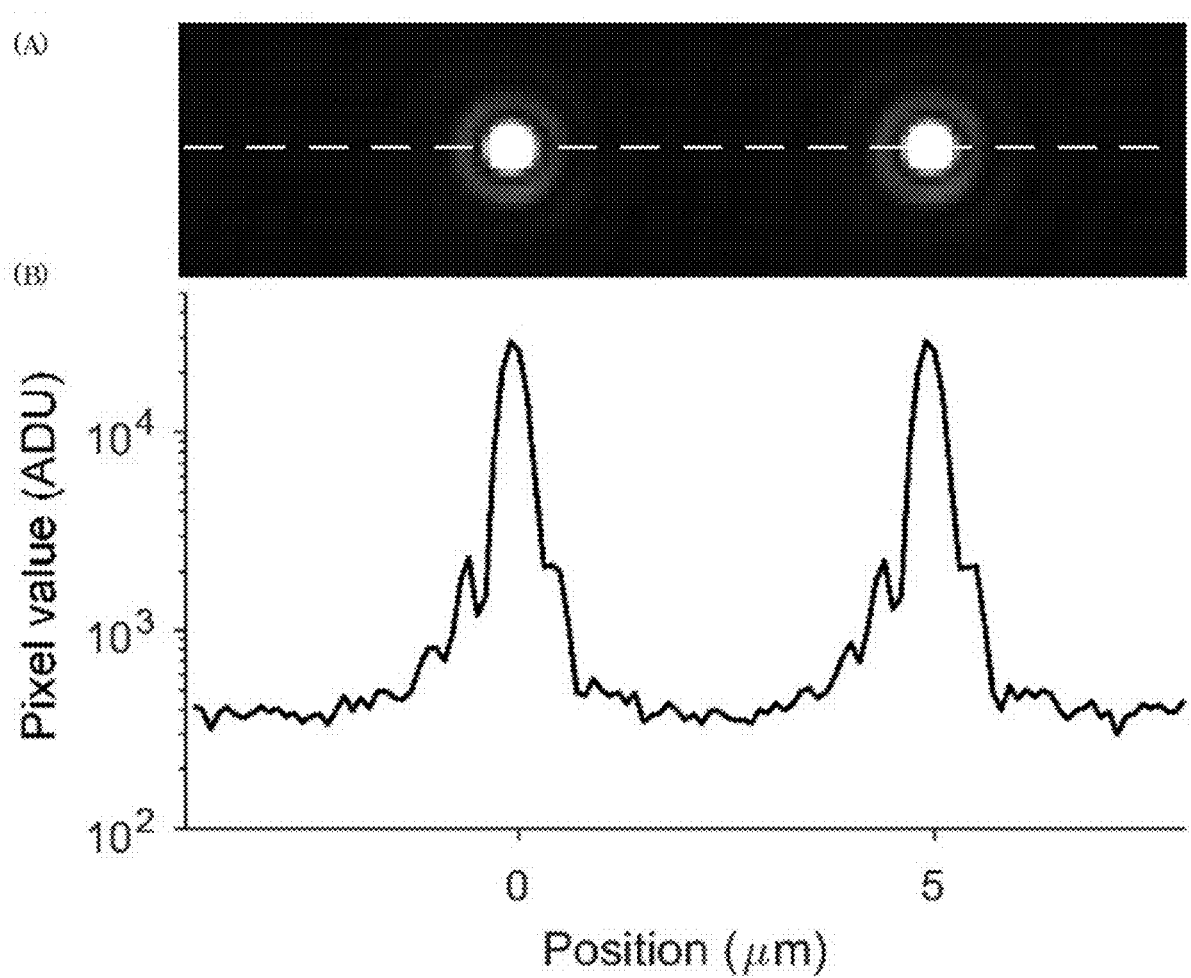
FIG. 21 shows an optical micrograph of an aperture array in panel A and a graph of pixel value versus position in panel B.

FIG. 21 shows, for an aperture array, in panel (A) a brightfield optical micrograph of point spread functions from two apertures with nominal diameters of 400 nm in an array with a nominal pitch of 5 µm. Panel B shows a plot of pixel value along the white dashed line in panel A. Airy rings are evident on a logarithmic scale for the vertical axis. The point spread function from the left aperture decays to background by approximately 3 µm from the center position of the aperture. This shows that an array pitch of 5 µm provides sufficient separation of adjacent apertures such that their signals do not appreciably overlap within the region of interest for localization analysis, which is approximately 1 µm around the center position of each aperture.

Figure 22:
FIG. 22 shows a fluorescence micrograph of nanoparticle fiducials.

FIG. 22 shows a fluorescence micrograph showing FOR fluorescent nanoparticles with a carboxylate coating on a borosilicate coverslip with a poly-D-lysine coating. In subsequent analysis, we ignore aggregates of nanoparticles, which are evident as images that are brighter and larger than single point spread functions.

Figure 23:
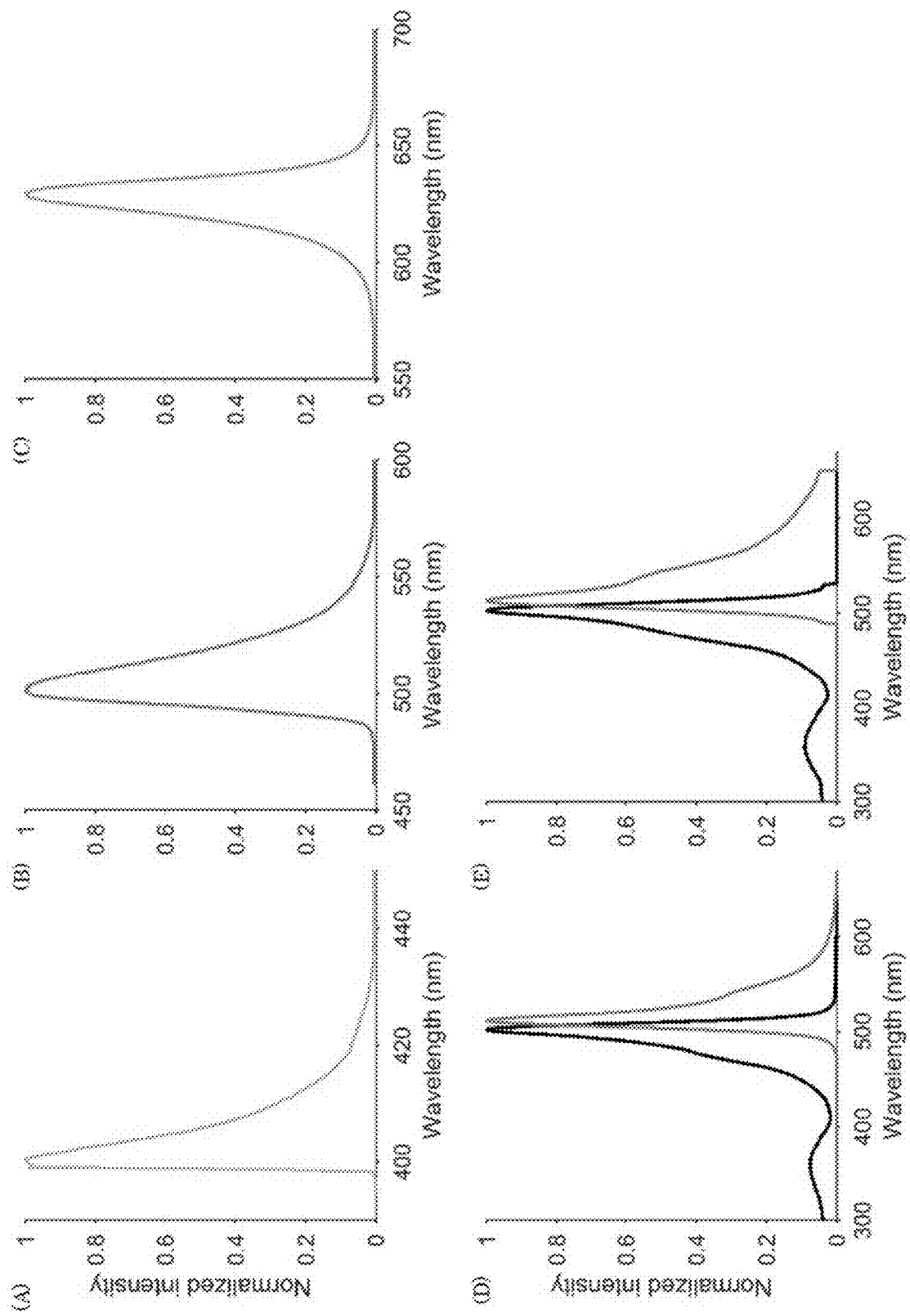
FIG. 23 shows graphs of normalized intensity versus wavelength in panels A-E.

FIG. 23 shows LED and dye spectra in (a-c) plots of experimental emission spectra of LED arrays with peak wavelengths of (a) 400 nm, (b) 500 nm, and (c) 630 nm. Panels D and E shows plots for nominal excitation and experimental emission spectra of (d) boron-dipyrromethene dye in N,N-dimethylformamide solution and (e) in amorphous polystyrene nanoparticles.

Figure 24:
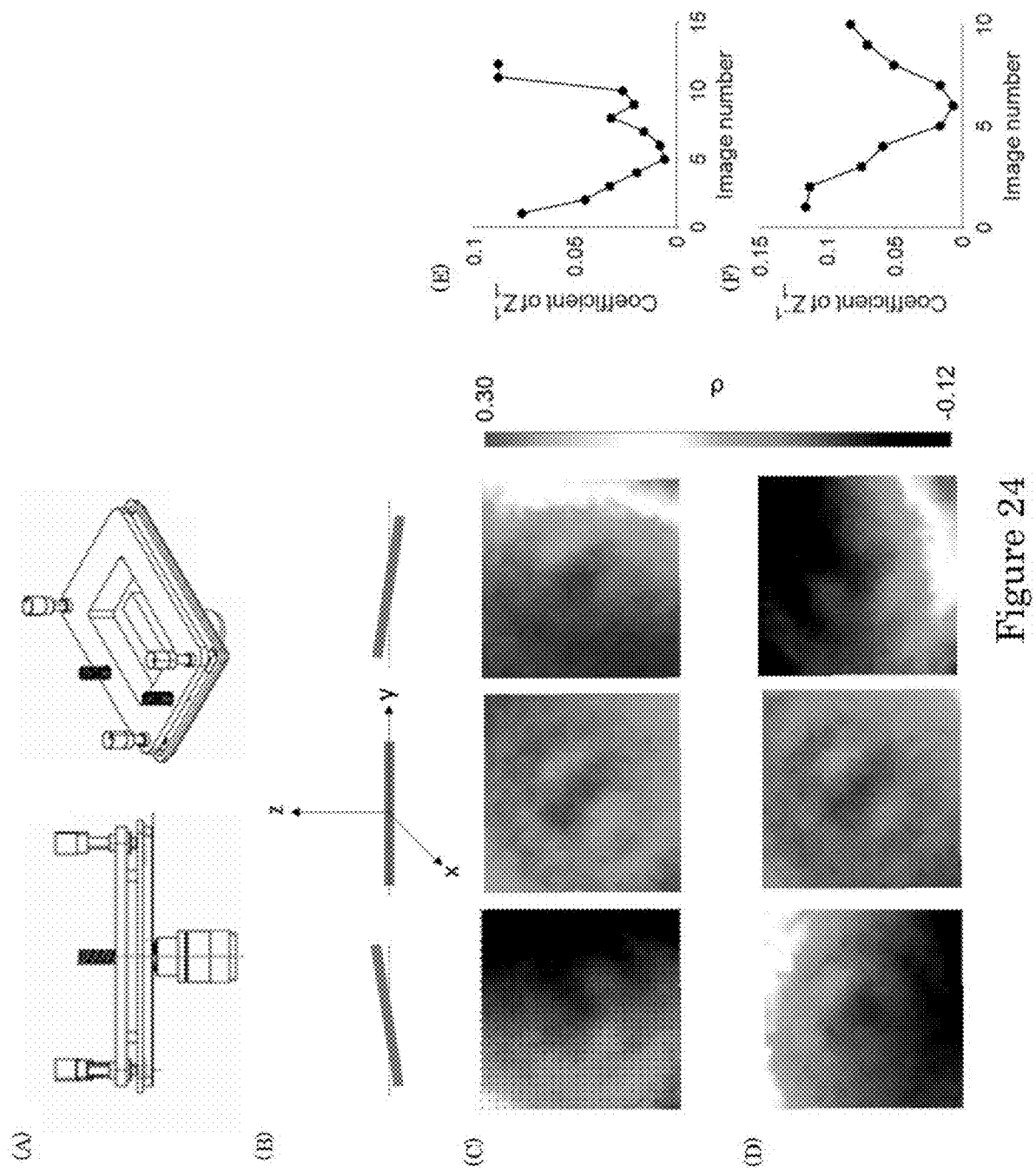
FIG. 24 shows sample level in panels A and B, orientation maps in panel C and D, ad graphs of coefficient of Z versus image number in panels E and F.

We leveled a sample by aligning its surface normal to the optical axis using two methods. The first exploits piezoelectric actuation and characterization of the z position of the objective lens. The second takes advantage of Zernike theory. Both involve a stage insert that enables rotation of the sample about the x and y axes, as panels A and B of FIG. 24 show. In the second method, we analyze spatial maps of ρ across the field. We fit the maps to a linear combination of Zernike polynomials in real time, finding the optimal orientation which minimizes the coefficients for the first-order Zernike polynomials $Z_1^1$ and $Z_1^{-1}$, which model orientation of the sample about the x and y axes, as panels B-F of FIG. 24 show. That is, FIG. 24 shows sample leveling, wherein panel A shows a schematic of a sample holder. Panel B shows a sample orientation about the x axis. Panel C shows plots of p at varying magnitudes of orientation about the x axis. Black dots indicate aperture positions. Panel D shows plots of p at varying magnitudes of orientation about the y axis. Orientation direction corresponds to the schematics in panel B. Panel E shows a plot of representative values of the coefficient of the Zernike polynomial modeling orientation about the x axis. The minimum corresponds to the center plot in panel C. Panel F shows a plot of representative values of the coefficient of $Z_1^{-1}$, modeling orientation about the y axis. The minimum corresponds to the center plot in panel D.

Figure 25:
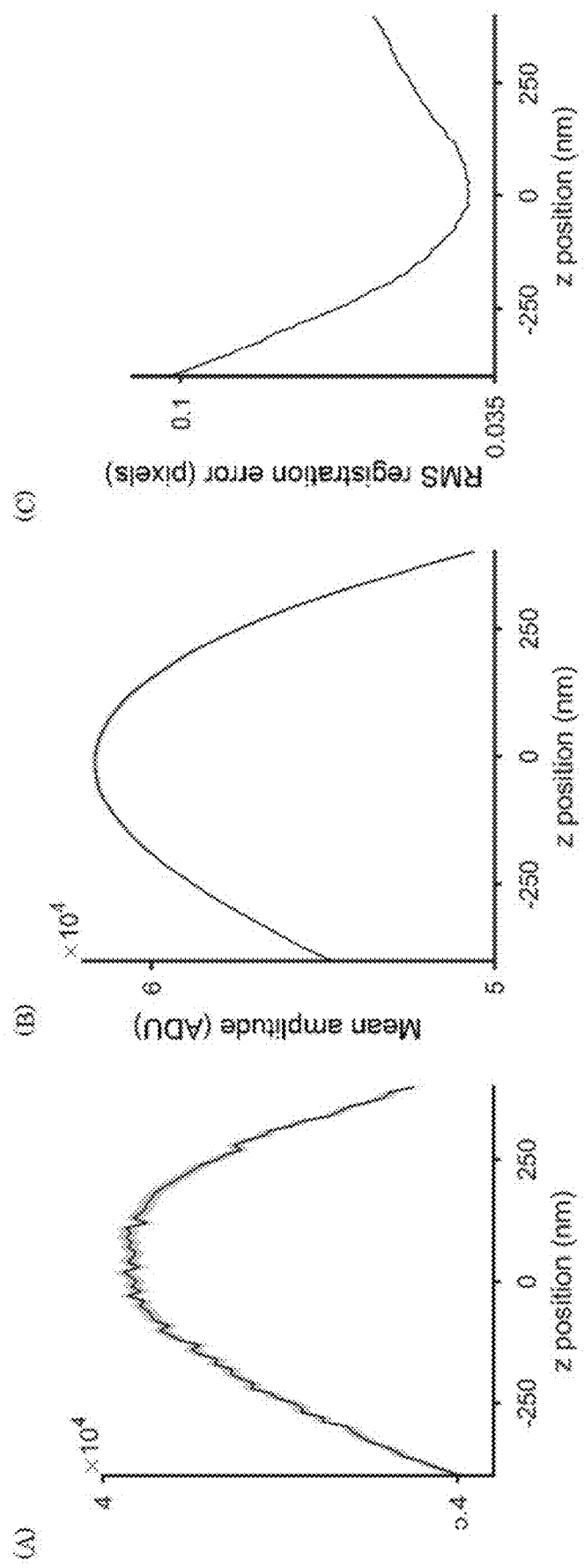
FIG. 25 shows graphs of amplitude versus position in panel A, mean amplitude versus position in panel B, and error versus position in panel C.

For a region of interest, from a square micrometer around a single aperture to the full field of the imaging system, we determine optimal focus first by imaging through focus. We then extract the mean amplitude of the point spread functions that are within the region of interest and empirically model the variation of the mean amplitude with respect to z position using a quintic function. We take the maximum value of the model fit as the z position of optimal focus. FIG. 25 shows amplitude as a function of z position for one aperture and mean amplitude as a function of z position for many apertures in one image, wherein panel A shows a plot of amplitude of the point spread function of a single aperture as a function of z position, with a maximum at optimal focus. The grey boundary is one standard deviation. Panel B shows a plot of the mean amplitude of 1600 point spread functions from as many apertures as a function of z position, with a maximum at the optimal focal plane. The z position of optimal focus of the aperture in panel A differs from the z position of the optimal focal plane in panel B due to field curvature. Panel C shows a plot of the root-mean-square error of a rigid registration between images of an aperture array as a function of z position, with a minimum at the z position of the common optimal focal plane between the two images. The grey boundaries in panel B and panel C are one standard error and are comparable in width to the black lines.

Figure 26:
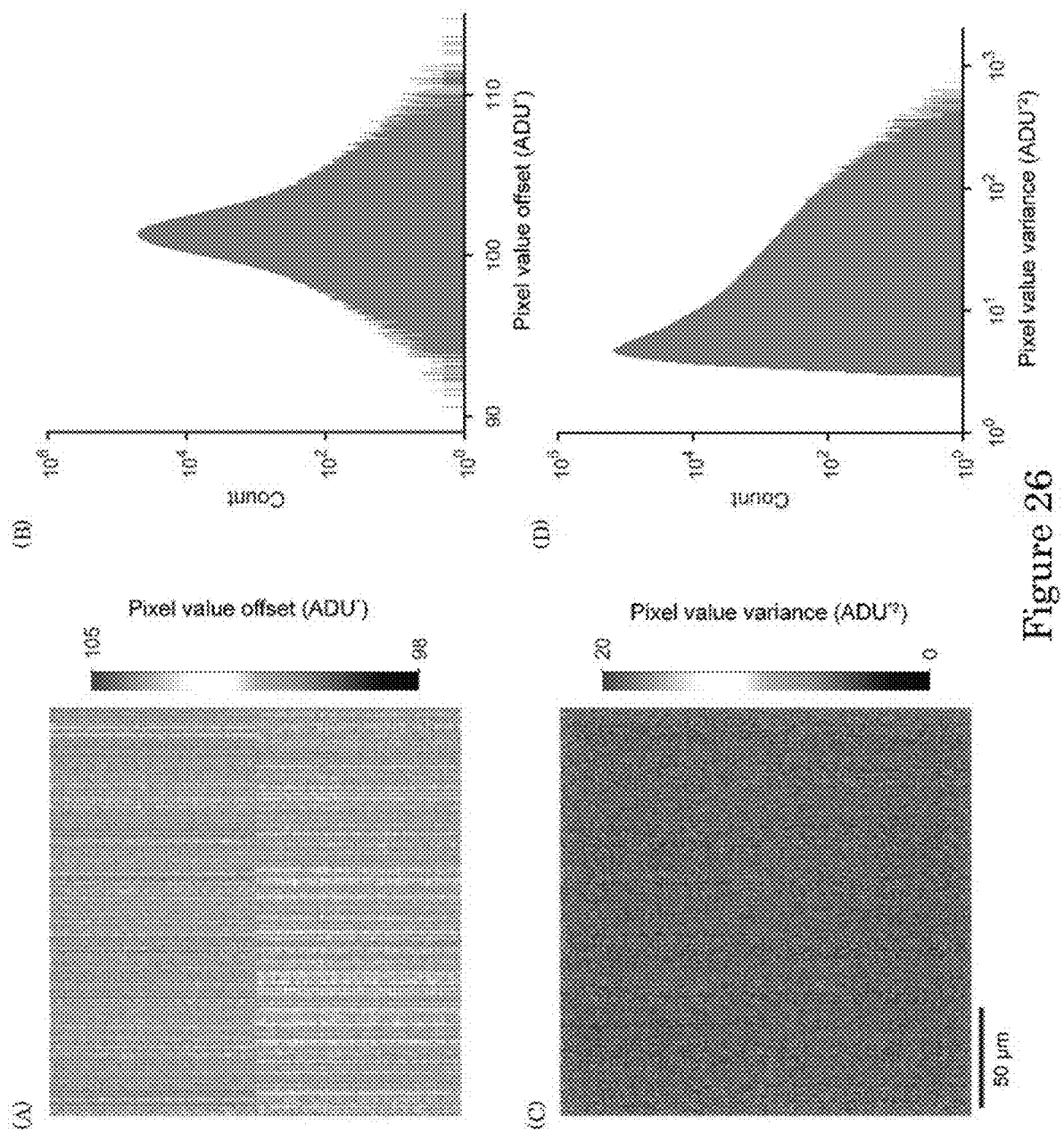
FIG. 26 shows aspects of dark calibration of a camera in panels A-D.

FIG. 26 shows dark calibration of a camera, wherein pixel values are in analog-to-digital units before calibration (ADU). Panel A shows a plot of pixel value offset. Panel B shows a histogram of pixel value offset. Panel C shows a plot of pixel value variance. Panel D shows a histogram of pixel value variance. To clearly show systematic effects in panel A and panel C from the CMOS architecture of the imaging sensor, we restrict the ranges of panel A with respect to panel B and panel C with respect to panel D. Table lists information for calibration with nominal positions at the nodes of an ideal square array. Mean differences that do not alter the mean value of array pitch do not affect microscope calibration.

TABLE 3

| Process | Term | Sources of Error | Quantity |
|---|---|---|---|
| Aperture fabrication | Placement accuracy | Electron-optical aberrations Position resolution of lithography system | Mean magnitude of differences of aperture placements from nominal positions |
| | Placement precision | Pattern resolution and transfer | Standard deviation of difference of aperture placements from nominal positions |
| Emitter localization | Theoretical localization precision | Photon shot noise Background noise Image pixel size Point spread function | Cramér-Rao lower bound |

TABLE 3-continued

| Process | Term | Sources of Error | Quantity |
|---|---|---|---|
| | Empirical localization precision | Theoretical localization precision Fitting error Unintentional random motion of measurement system | Standard deviation of difference of position measurements from mean value of position measurements |
| Microscope calibration | Position accuracy | Placement precision Photon-optical aberrations Image pixel size Fitting error Unintentional systematic motion of measurement system Empirical localization precision | Position error - difference of aperture position measurement from nominal position |
| | Correction accuracy | Placement precision | Correction error - difference of placement precision and the standard deviation of position errors in a synthetic array with ideal placement accuracy |
| Error correction | Localization accuracy | Unintentional axial motion of measurement system Correction accuracy Unknown sources of error | Localization error - standard deviation of position errors, independent of placement precision and empirical localization precision |
| Data registration | Registration accuracy | All sources above Chromatic aberration | Registration error - difference of corresponding position measurements from two images |

Figure 27:
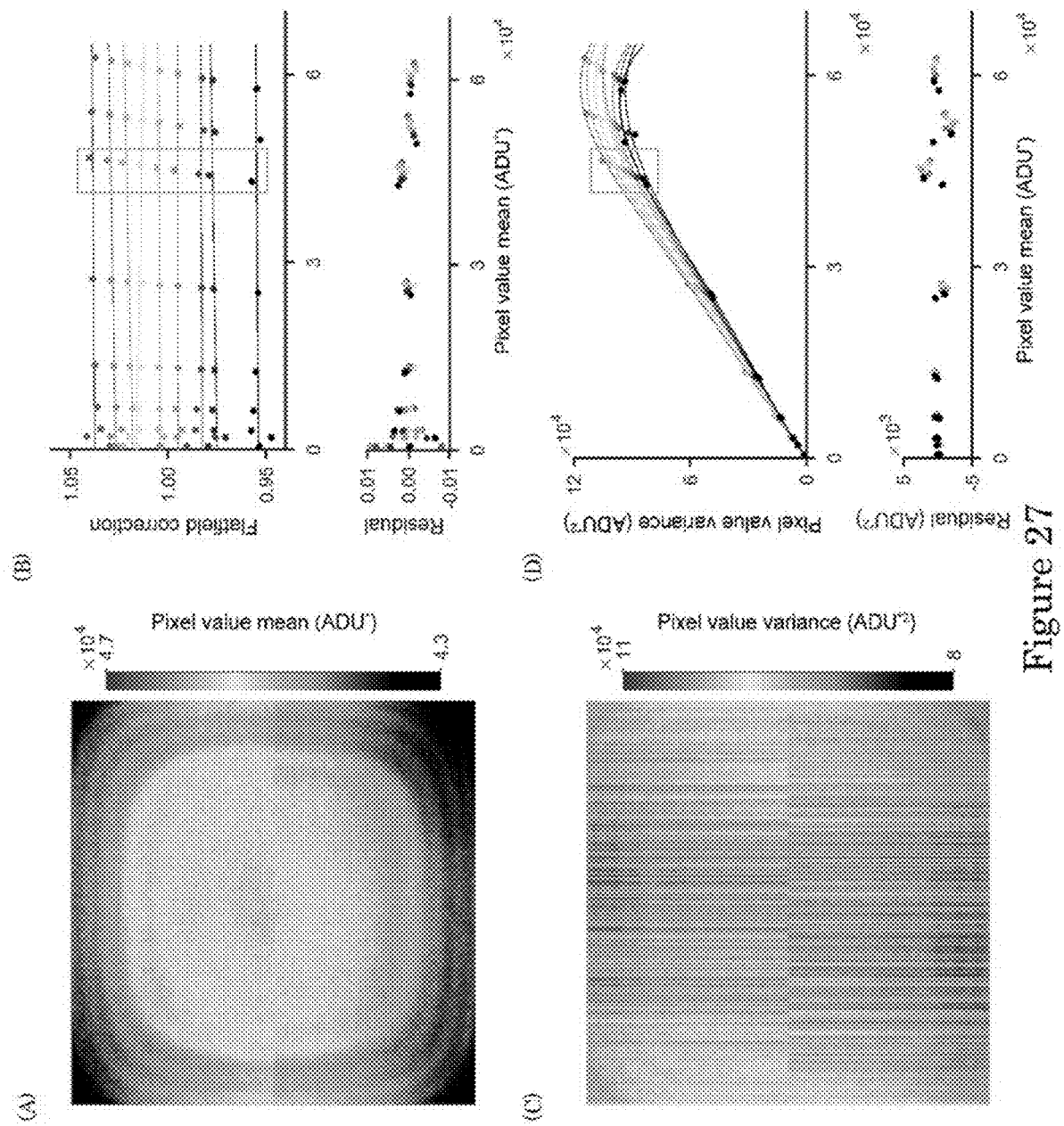
FIG. 27 shows aspects of light calibration of a camera in panels A-D.

FIG. 27 shows light calibration of camera, wherein panel A shows a plot of pixel value mean from 15000 images at one of nine illumination levels. Nonuniformity results from the illumination profile, sensor packaging, and CMOS architecture. Panel B shows a plot of flatfield corrections for nine representative pixels as a function of pixel value mean. The gray box encloses data from the illumination level in panel A. The flatfield corrections abruptly increase at low values and then remain nearly constant for the remaining 95% of the dynamic range. A linear function empirically approximates the flatfield corrections over the full dynamic range. Panel C shows a plot of pixel value variance corresponding to the pixel value mean in panel A. Nonuniformity results from sensor packaging and amplifier columns. Panel D shows a plot of pixel value variance, including contributions from shot noise, read noise, and fixed-pattern noise, as a function of pixel value mean for nine representative pixels. The gray box encloses data from the illumination level in panels A and C. A quartic polynomial empirically approximates the pixel value variance over the full dynamic range. The ratio of pixel value variance to pixel value mean gives an approximate value of gain. Therefore, the quartic polynomial can provide an estimate of gain for any pixel and pixel value, without flatfield correction, to convert units from ADU to photons, such as for calculation of a Cramér-Rao lower bound.

We test localization accuracy for single emitters over the full dynamic range and field of the CMOS camera. We model the response of each pixel as a Gaussian probability density function, which replaces the Poisson distribution that commonly models shot noise due to the nonlinear relationship between pixel value and total variance. The probability density function for each pixel incorporates the pixel value offset and flatfield correction in the calculation of the mean or expected pixel value to account for variation in pixel gain, illumination nonuniformity, and the effects of sensor packaging. The variance of the probability density function comes from the quartic function in the main text. We perform Monte Carlo simulations to generate images of a univariate Gaussian point spread function in which this same Gaussian probability density function, incorporating parameter values that correspond exactly to a region of our CMOS camera, determines each pixel value. This analysis results in accurate localization with uncertainties near the Cramér-Rao lower bound, as Table 4 shows for the x direction. We find that using an approximate model for total variance, which includes only contributions from shot noise and read noise for each pixel, results in empirical localization precision and localization accuracy that are equivalent to using the empirical model for the total variance. This demonstrates that, despite the difference between the empirical and approximate variance, which is significant for pixels with values in the top 25% of the dynamic range, the approximate model is more efficient and is equally accurate even for images of point sources with pixel values that span the full dynamic range of the CMOS sensor.

TABLE 4

| Number of signal photons | Theoretical localization precision (pixels) | Empirical localization precision (pixels) | Standard error (pixels) | Empirical error (pixels) |
|---|---|---|---|---|
| $4.5 \times 10^5$ | $2.7 \times 10^{-3}$ | $2.9 \times 10^{-3}$ | $4.1 \times 10^{-5}$ | $5.8 \times 10^{-5}$ |
| $7.0 \times 10^5$ | $2.2 \times 10^{-3}$ | $2.4 \times 10^{-3}$ | $3.4 \times 10^{-5}$ | $5.3 \times 10^{-5}$ |

We approximate the point spread function, which varies across the imaging field, with a bivariate Gaussian function, $$G_{biv}(x, y, \Theta = [A, \sigma_x, \sigma_y, \rho, x_0, y_0, C]) = A \cdot \exp - \left( \left[ \frac{1}{2(1-\rho^2)} \left[ \frac{(x-x_0)^2}{\sigma_x^2} - 2\rho \frac{(x-x_0)(y-y_0)}{\sigma_x \sigma_y} + \frac{(y-y_0)^2}{\sigma_y^2} \right] \right] \right) + C, \quad \text{(Eq. S1)}$$

where A is the amplitude, $x_0$ is the position of the peak in the x direction, $y_0$ is the position of the peak in the y direction, $\sigma_x$ is the standard deviation in the x direction, $\sigma_y$ is the standard deviation in they direction, $\rho$ is the correlation coefficient between the x and y directions, and C is a constant background. This model determines the expected pixel value in analog-to-digital units (ADU) for each pixel in an image, $$E_i(x_i, y_i, \Theta) = G_{biv}(x_i, y_i, \Theta), \quad \text{(Eq. S2)}$$

where i indexes each pixel, $x_i$ is the position of the pixel in the x direction, $y_i$ is the position of the pixel in the y direction. For weighted least-squares, the objective function for fitting this model of the expected pixel values using is, $$\hat{\Theta} = \text{argmin} \left[ \sum_i \frac{(I_i - E_i)^2}{gI_i + \sigma_{read,i}^2} \right], \quad \text{(Eq. S3)}$$

where $\hat{\Theta}$ is the estimate for the parameter set $\hat{\Theta} = \{A, \sigma_x, \sigma_y, \rho, x_0, y_0, C\}$,
g is the nominal gain of the camera specified by the manufacturer, a $\sigma_{read,i}^2$ is the pixel read noise, and $I_i$ is the experimental pixel value after calibration for CMOS characteristics, $$I_i = \frac{I_i^* - o_i}{FF_i}, \quad \text{(Eq. S4)}$$

where $I_i^*$ is the pixel value before calibration, $o_i$ is the pixel value offset, and $FF_i$ is the flatfield correction. Subsequently, pixel values are in analog-to-digital units after calibration (ADU). In the case of a Gaussian probability density function for the response of single pixels, the objective function for maximum-likelihood is similar, $$\hat{\Theta} = \text{argmin} \left[ \sum_i \frac{(I_i - E_i)^2}{gE_i + \sigma_{read,i}^2} \right], \quad \text{(Eq. S5)}$$

with the only difference being the replacement of the experimental pixel value $I_i$ in the denominator of Eq. S3 with the model or expected pixel value $E_i$.

If the model systematically underestimates the experimental pixel values, then the presence of the expected pixel value $E_i$ in the denominator of Eq. 55 means that maximum-likelihood gives additional weight to the underestimated pixel, as FIG. 11 shows. In contrast, the presence of $I_i$ in the denominator of Eq. S3 means that weighted least-squares does not have this bias. These effects are the opposite for the case that the model systematically overestimates the experimental values.

We modify our localization algorithm to mitigate such effects. A general solution to this problem of selecting either weighted least-squares or maximum-likelihood is a hybrid objective function, which empirically reduces the effect of model discrepancies whether the model systematically overestimates or underestimates the data, $$\hat{\Theta} = \text{argmin} \left[ \sum_i \frac{(I_i - E_i)^2}{g \cdot \max(I_i, E_i) + \sigma_{read,i}^2} \right], \quad \text{(Eq. S6)}$$

where $\max(I_i, E_i)$ reduces the weight of pixels with significant residuals. Therefore, we term this the light-weighting objective function.

We use unweighted least-squares to determine the starting point for localization with the other algorithms. The field dependence of position estimation with light-weighting, maximum-likelihood, and weighted and unweighted least-squares is in FIG. S11, and a quantitative comparison of empirical localization precision is in Table 5. We derive empirical localization precision from the standard deviation of 100 measurements in an image series of the pitch of each unit cell of the aperture array. The values in Table 5, which average over the x and y directions, are the root-mean-square of the pitch standard deviations over a factor of $\sqrt{2}$ from 1640 pitches.

TABLE 5

| | Mean number of signal photons per point spread function | | | |
|---|---|---|---|---|
| | $5.3 \times 10^5$ | $3.0 \times 10^5$ | $5.3 \times 10^4$ | $5.9 \times 10^3$ |
| | Empirical localization precision (pixels) | | | |
| Light-weighting (Eq. S6) | 0.00295 (0.00398) | 0.00399 | 0.00889 | 0.02710 |
| Weighted least-squares (Eq. S3) | 0.00301 (0.00399) | 0.00391 | 0.00892 | 0.02910 |
| Maximum-likelihood (Eq. S5) | 0.00356 (0.00399) | 0.00795 | 0.01398 | 0.03183 |
| Unweighted least-squares | 0.00339 | 0.00446 | 0.01042 | 0.03165 |

Figure 28:
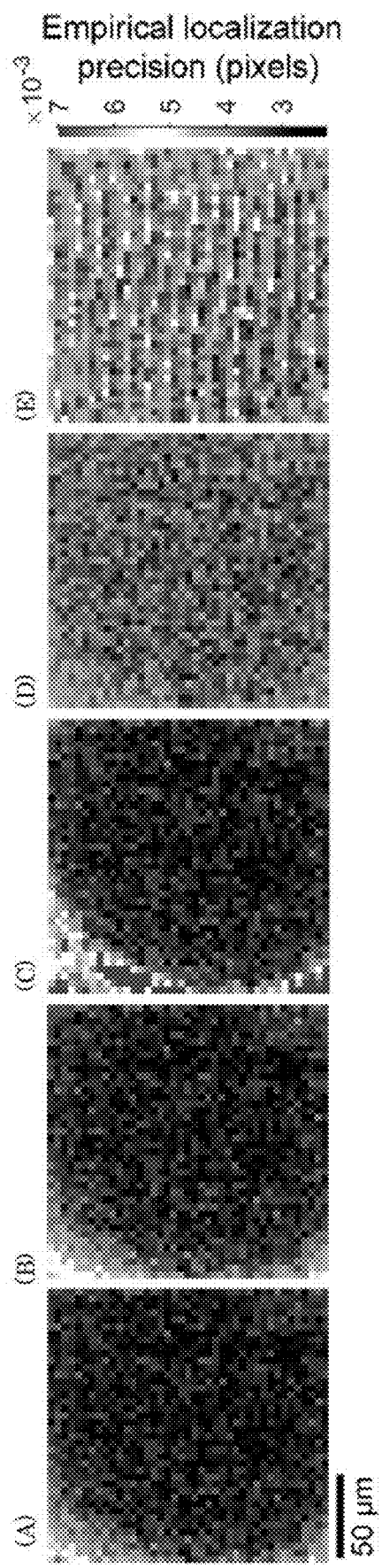
FIG. 28 shows aspects of localization processing in panels A-E.

FIG. 28 shows aspects of localization method performance, wherein panels A-E shows plots of empirical localization precision across the field for position estimation with (a) light-weighting, (b) weighted least-squares, (c) maximum-likelihood, (d) unweighted least-squares, and (e) light-weighting with a smaller region of interest of 500 nm by 500 nm that excludes much of the point spread function outside of the central peak. The data in panel E is nearly identical for the first three localization algorithms. The mean number of signal photons per point spread function is $5.3 \times 10^5$. For this data, weighted least-squares performs similarly to light-weighting, due to deformation of the point spread function most often causing the model to underestimate the data, but this may not always be the case. Unweighted least squares generally results in larger uncertainties than the other algorithms and is not suitable for inclusion of CMOS characteristics and shot noise. However, it is also less sensitive to the model discrepancy that FIG. 11 shows, because uniform weighting optimizes the fit to the central peak of the point spread function that is approximately Gaussian. Therefore, unweighted least-squares performs best in field regions with the largest deformation of the point spread function. Similarly, a region of interest that excludes much of the point spread function outside of the central peak results in nearly identical performance of the first three methods, but the empirical localization precision is significantly worse overall. The field dependence in (e) indicates systematic effects of pixelation on the definition of a localization region of interest that excludes much of the point spread function outside of the central peak. These results highlight the utility of light-weighting for accommodating deformation of the point spread function. Summary results for the different localization algorithms for different signal intensities and regions of interest are in Table 5.

We test the extent to which empty apertures with nominal diameters ranging from 200 nm to 500 nm appear as point sources under transillumination. For each value of nominal diameter, we image 400 apertures around the center of the write field and the center of the imaging field. We determine the position of optimal focus as FIG. 25 shows, localize each aperture, extract the standard deviations of the bivariate Gaussian approximation of the point spread function, and evaluate the mean value of $(\sigma_x + \sigma_y)/2$. These values are in Table 2. Apertures with nominal diameters of 200 nm, 300 nm, and 400 nm have equivalent mean values of this quantity, indicating that the functional diameters of these apertures are below the resolution of the imaging system and that they appear as point sources. These mean values of $(\sigma_x + \sigma_y)/2$ exceed the theoretical value of approximately $0.21\lambda/NA = 90$ nm, likely due to the inclusion of the first Airy ring in the fitting region of interest. Apertures with nominal diameters of 500 nm appear to be slightly larger, indicating that their functional diameters approach the resolution limit of the imaging system. On the basis of this data, in the calibration of our microscope, we typically use apertures with nominal diameters of 400 nm to maximize the number of signal photons.

Figure 29:
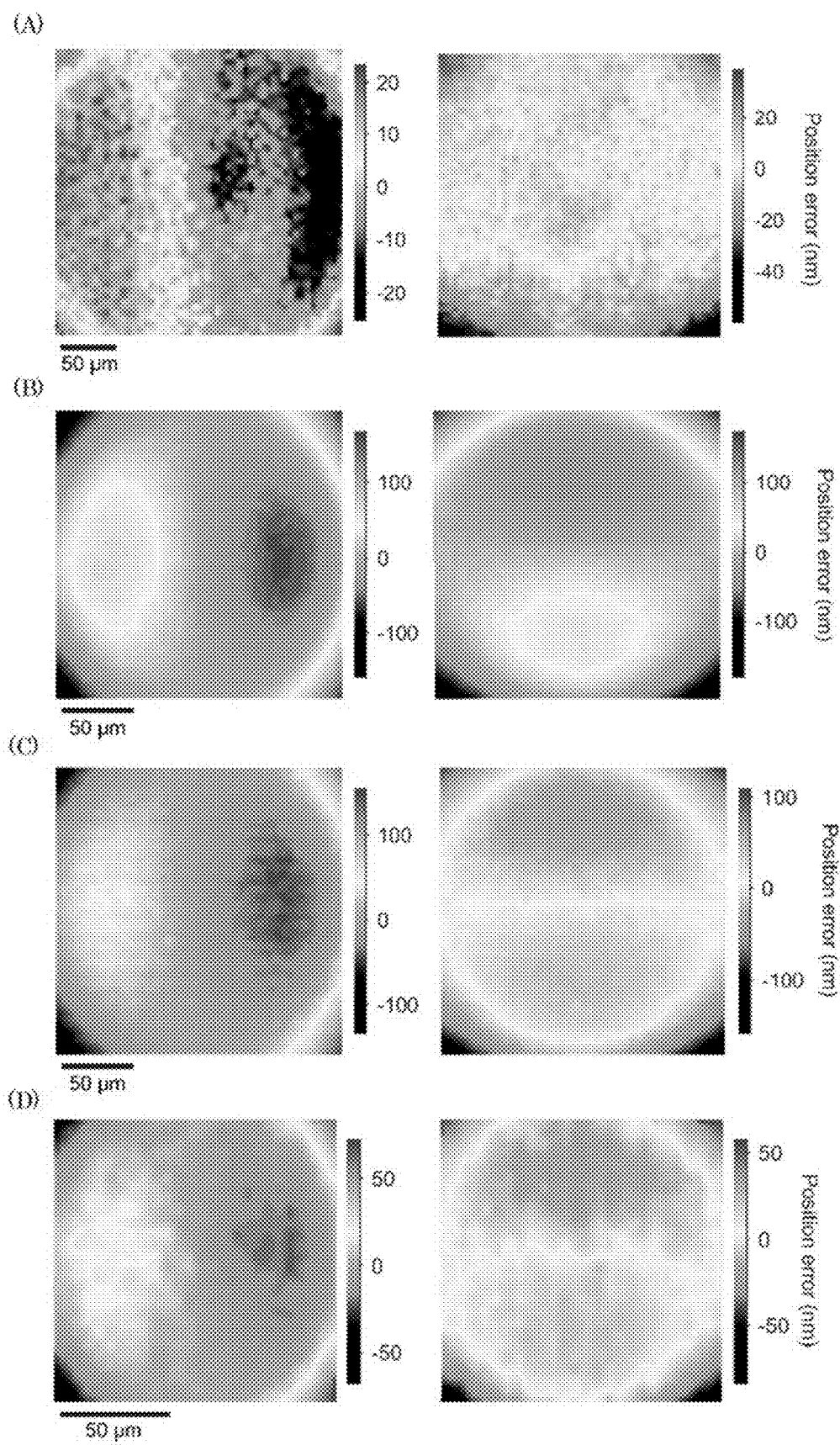
FIG. 29 shows position errors for an objective lens in panels A-D.

FIG. 29 shows images for objective lenses, wherein panels A-D show plots of position errors due mostly to using the mean values of image pixel size for four objective lenses with magnification and numerical aperture values of (panel A) 50× and 0.55, (panel B) 63× and 1.20, (panel C) 63× and 1.40, and (panel D) 100× and 1.46. The left column shows position errors in the x direction. The right column shows position errors in the y direction. We reconfigure the same microscope system for testing each objective lens using an aperture array with nominal diameters of 200 nm or 400 nm. Further specifications of the objective lenses and the resulting standard deviation of position errors are in Table 6. Removing and replacing an objective lens requires recalibration of the microscope. For example, when we remove and replace the objective lens in (b), the mean value of image pixel size changes by up to 0.07%.

TABLE 6

| Magnification (x) | Numerical aperture ( ) | Refractive index of immersion medium ( ) | Working distance (mm) | Corrections | Standard deviation of position errors (nm) | |
|---|---|---|---|---|---|---|
| | | | | | x | y |
| 50 | 0.55 | 1.00 | 9.1 | Chromatic, flatfield | 10.85 ± 0.15 | 11.57 ± 0.16 |
| 63 | 1.2 | 1.33 | 0.28 | Coverslip, chromatic, flatfield | 39.95 ± 0.69 | 39.52 ± 0.68 |
| 63 | 1.4 | 1.52 | 0.19 | Coverslip, chromatic, flatfield | 30.53 ± 0.52 | 30.75 ± 0.53 |
| 100 | 1.46 | 1.52 | 0.11 | Coverslip, chromatic, flatfield | 15.64 ± 0.43 | 16.34 ± 0.44 |

Figure 30:
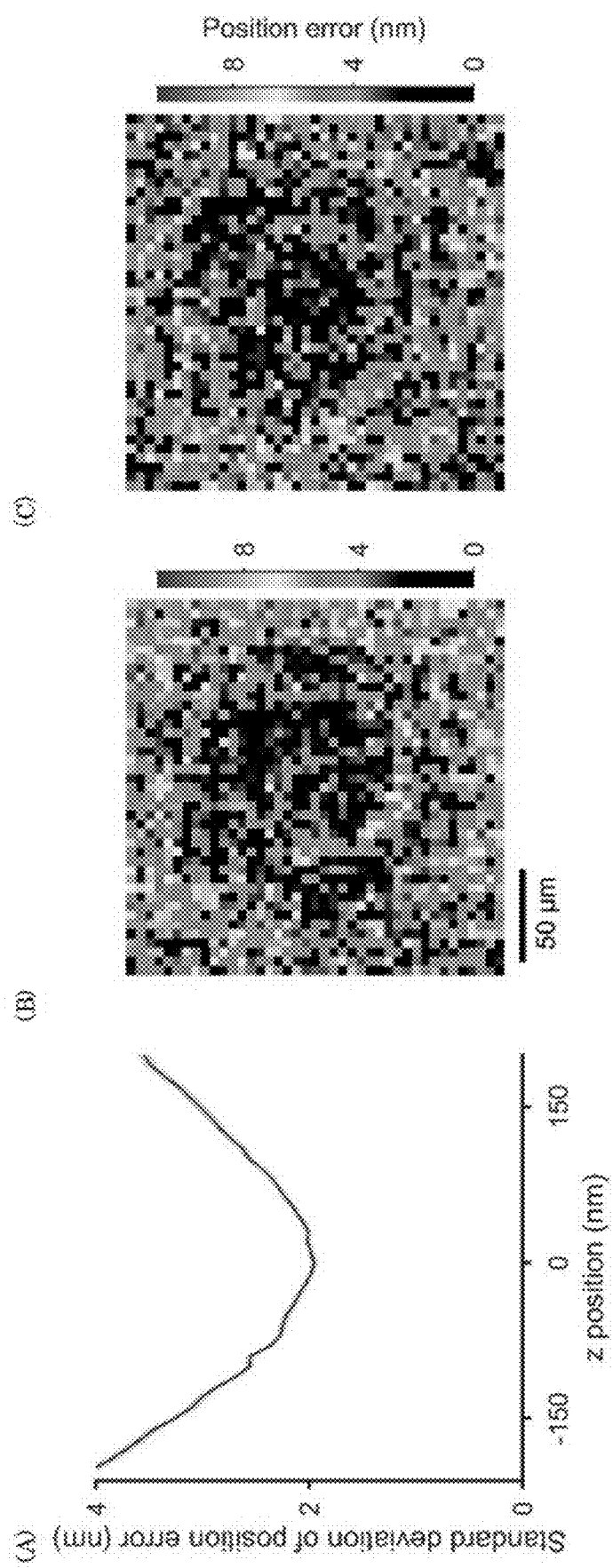
FIG. 30 shows a graph of standard deviation of error in position versus position in panel A and maps of position error in panels B and C.

FIG. 30 shows that error correction depends on z position, wherein panel A shows a plot of the pooled standard deviation of position errors in the x and y directions following error correction with respect to z position. The gray boundary is one standard error and is comparable in width to the black line. Panels B and C show plots of the total magnitude of position errors at (panel B) 150 nm below the z position of optimal focus and (panel C) 150 nm above the z position of optimal focus. Position errors increase with the magnitude of z position away from optimal focus, with a radial deformation of the field.

Figure 31:
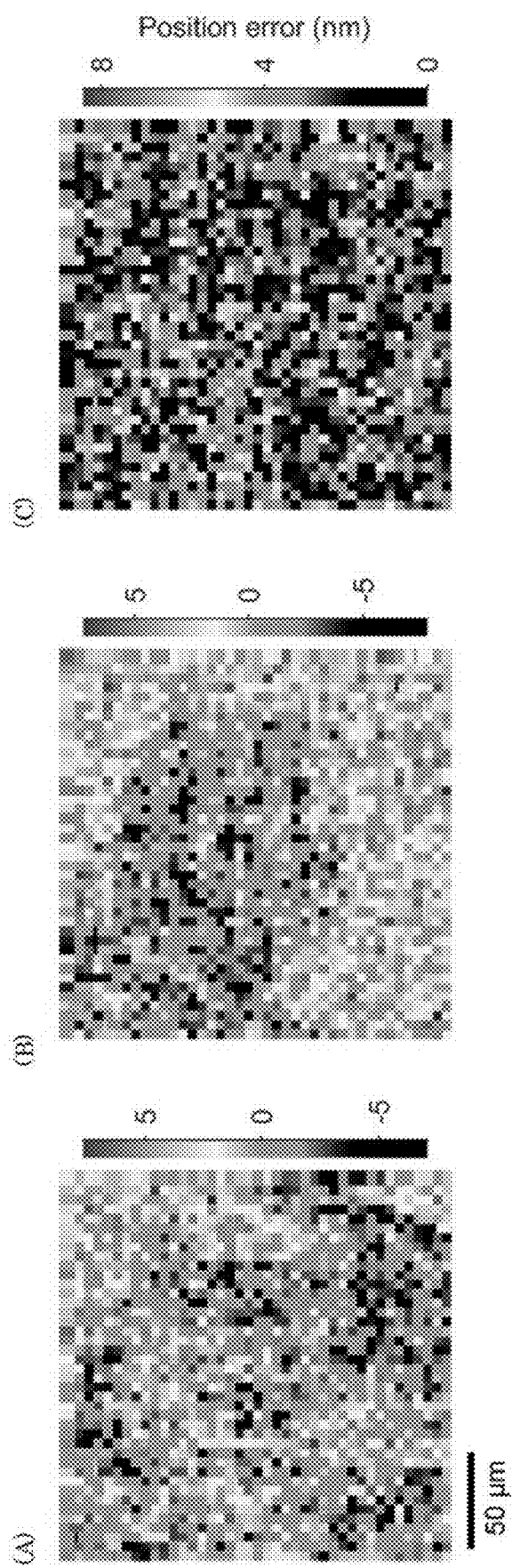
FIG. 31 shows error correction for an aperture array panels A-C.

FIG. 31 shows error correction across the aperture array, wherein plots show position errors in (panel A) the x direction, (panel B) the y direction, and (panel C) total magnitude, from applying error correction models that we derive from the center of the standard array to a different region of the standard array. Systematic effects in (panel B) are consistent with variation in z position with respect to the data in FIG. 13.

The spatial variances of pitch values across the aperture array from scanning and widefield measurements are, respectively, $$\sigma_{pitch,S}^2 = \sigma_{lp,S}^2 + \sigma_{pp}^2 + \sigma_{le,S}^2 \quad \text{(Eq. S7)}$$

$$\sigma_{pitch,W}^2 = \sigma_{lp,W}^2 + \sigma_{pp}^2 + \sigma_{le,W}^2 \quad \text{(Eq. S8)}$$

where $\sigma_{lp,S}^2$ is the variance from empirical localization precision in scanning measurements, $\sigma_{lp,W}^2$ is the variance from empirical localization precision in widefield measurements, $\sigma_{le,S}^2$ is the variance from localization errors in scanning measurements, $\sigma_{le,W}^2$ is the variance from localization errors in widefield measurements, and $\sigma_{pp}^2$ is the variance from placement precision. We determine the values of empirical localization precision from the mean variance of 1600 pitch measurements over a time series of 100 images of the aperture array.

The difference of pitch values between scanning and widefield measurements eliminates $\sigma_{pp}^2$, isolating the independent terms in $\sigma_{pitch,S}^2$ and $\sigma_{pitch,W}^2$, $$\sigma_{pitch,S-W}^2 = \sigma_{lp,S}^2 + \sigma_{lp,W}^2 + \sigma_{le,W}^2 + \sigma_{le,S}^2, \quad \text{(Eq. S9)}$$

and randomizing the correspondence between the scanning and widefield measurements of pitch causes $\sigma_{pp}^2$ to be independent between the two measurement methods, giving a variance for the difference between the randomized pitch measurements of $$(\sigma_{pitch,S-W}^2)_{Random} = \sigma_{lp,S}^2 + \sigma_{lp,W}^2 + \sigma_{le,W}^2 + \sigma_{le,S}^2 + 2\sigma_{pp}^2. \quad \text{(Eq. S10)}$$

Subtracting Eq. (S9) from Eq. (S10) isolates $\sigma_{pp}^2$, providing a measure of placement precision that is free from empirical localization precision and localization error. The corresponding value of placement precision is $$\frac{\sigma_{pp}}{\sqrt{2}},$$

where dividing by $\sqrt{2}$ converts pitch standard deviation to position standard deviation. Values for these quantities are in Tables 7 and 8.

Inserting the values of $\sigma_{pp}^2$ and $\sigma_{lp,W}^2$ into Eq. (S8) gives a localization error in widefield measurements of $$\frac{\sigma_{le,W}}{\sqrt{2}}.$$

Values for these quantities are in Table 8. Sequent analysis of registration errors indicates that this calculation is conservative, as the localization error evidently includes systematic effects that cancel in registration.

Values from an analogous analysis for scanning measurements of pitch are in Table 7. The widefield values and their components in Table 7 are consistent with but slightly lower than the corresponding values in Table 1. This is due to small differences in the characterization of position error by either the ideal array method or measurements of pitch, as well as the exclusion of shot noise.

The measurement uncertainties of variance values are the standard error of the variance. To determine values of $\sigma_{pp}$, $\sigma_{le,W}$, and $\in_W$, we propagate uncertainty using either the NIST Uncertainty Machine or the law of propagation of uncertainty.

TABLE 7

| Measurement type | $\sigma^2_{pitch}$ (nm$^2$) | $\sigma_{lp}^2$ (nm$^2$) | $\sigma_{le}^2$ (nm$^2$) |
|---|---|---|---|
| | x direction | | |
| Widefield | 6.83 ± 0.34 | 0.184 ± 0.002 | 0.78 ± 0.50 |
| Scanning | 7.42 ± 0.37 | 0.138 ± 0.0006 | 1.41 ± 0.52 |
| | y direction | | |
| 1 Widefield | 7.73 ± 0.39 | 0.154 ± 0.001 | 1.03 ± 0.54 |
| Scanning | 7.25 ± 0.36 | 0.131 ± 0.0006 | 0.57 ± 0.52 |

TABLE 8

| Quantity | x direction | y direction |
|---|---|---|
| $\sigma_{pitch,s-w}^2$ (nm$^2$) | 2.51 ± 0.13 | 1.88 ± 0.09 |
| $(\sigma_{pitch,s-w}^2)_{Random}$ (nm$^2$) | 14.25 ± 0.71 | 14.98 ± 0.75 |
| $\sigma_{pp}^2$ (nm$^2$) | 5.87 ± 0.36 | 6.55 ± 0.38 |
| $\sigma_{pp}/\sqrt{2}$ (nm) | 1.71 ± 0.05 | 1.81 ± 0.05 |
| $\sigma_{le,w}/\sqrt{2}$ (random) (nm) | 0.62 ± 0.20 | 0.72 ± 0.19 |

TABLE 9

| Peak wavelength (nm) | Mean value of image pixel size (nm) | Position of optima focal plane (nm) |
|---|---|---|
| 400 | 99.85 | 370 |
| 500 | 100.01 | 0 |
| 630 | 100.13 | −720 |

Figure 32:
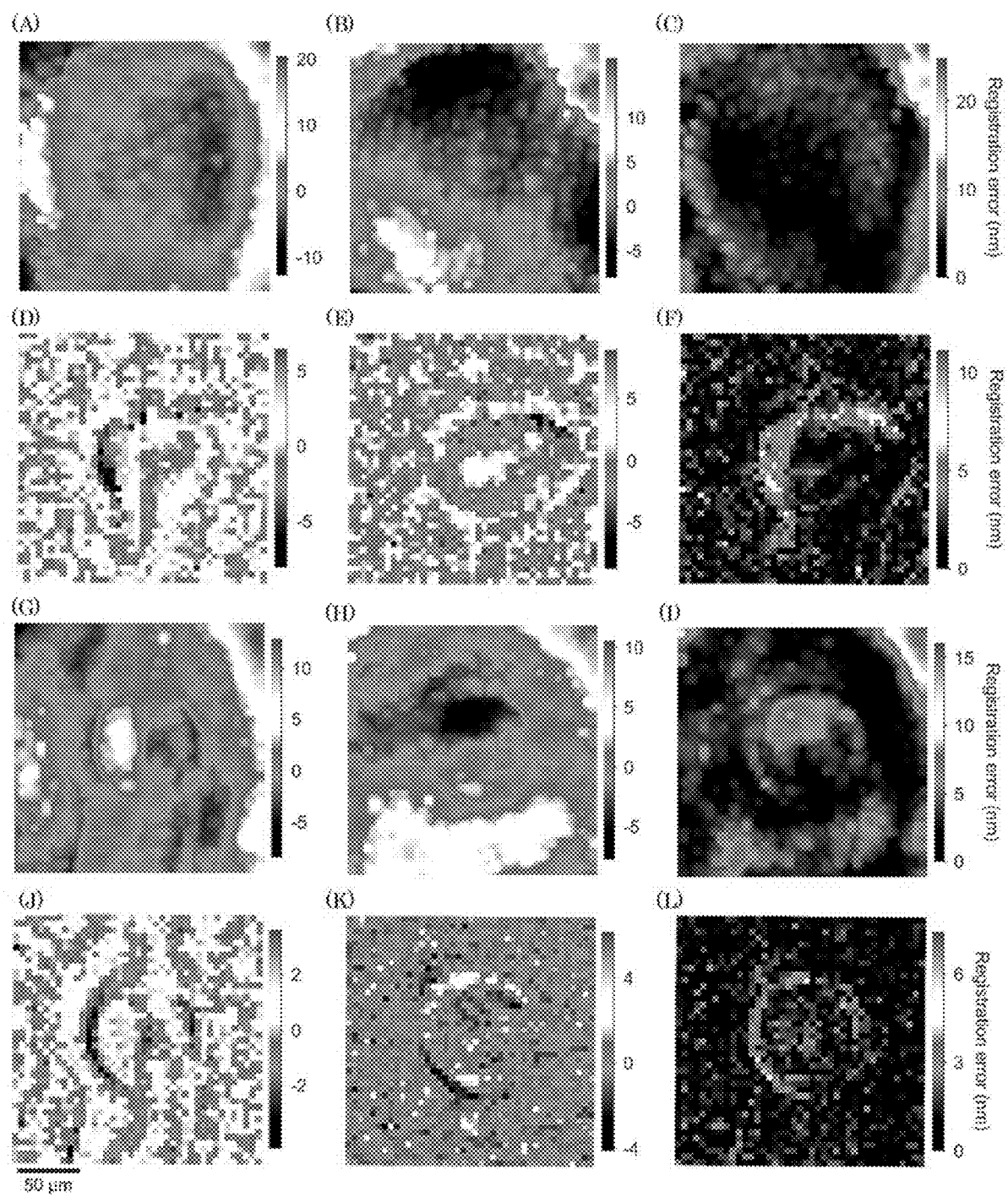
FIG. 32 shows registration error maps in panels A-I.

FIG. 32 shows registration errors from three colors at one focal plane. Panels A-F shows plots of registration errors in (panels A and ID) the x direction, (panels B and E) the y direction, and (c,f) total magnitude, (a-c) before correction and (d-f) after correction of data from 500 nm and 630 nm peak wavelengths, at the optimal focal plane for the former. Panels G-L shows plots of registration errors in (g,j) the x direction, (h,k) the y direction, and (i,l) total magnitude (g-i) before correction and (j-l) after correction of data from 400 nm and 500 nm peak wavelengths, at the optimal focal plane for the former. Systematic errors due to the wavelength dependence of distortion are apparent in the data before correction (a-f, h-j). Systematic errors due to defocus are apparent in the (a-f) 630 nm data and (h-m) 400 nm data.

Figure 33:
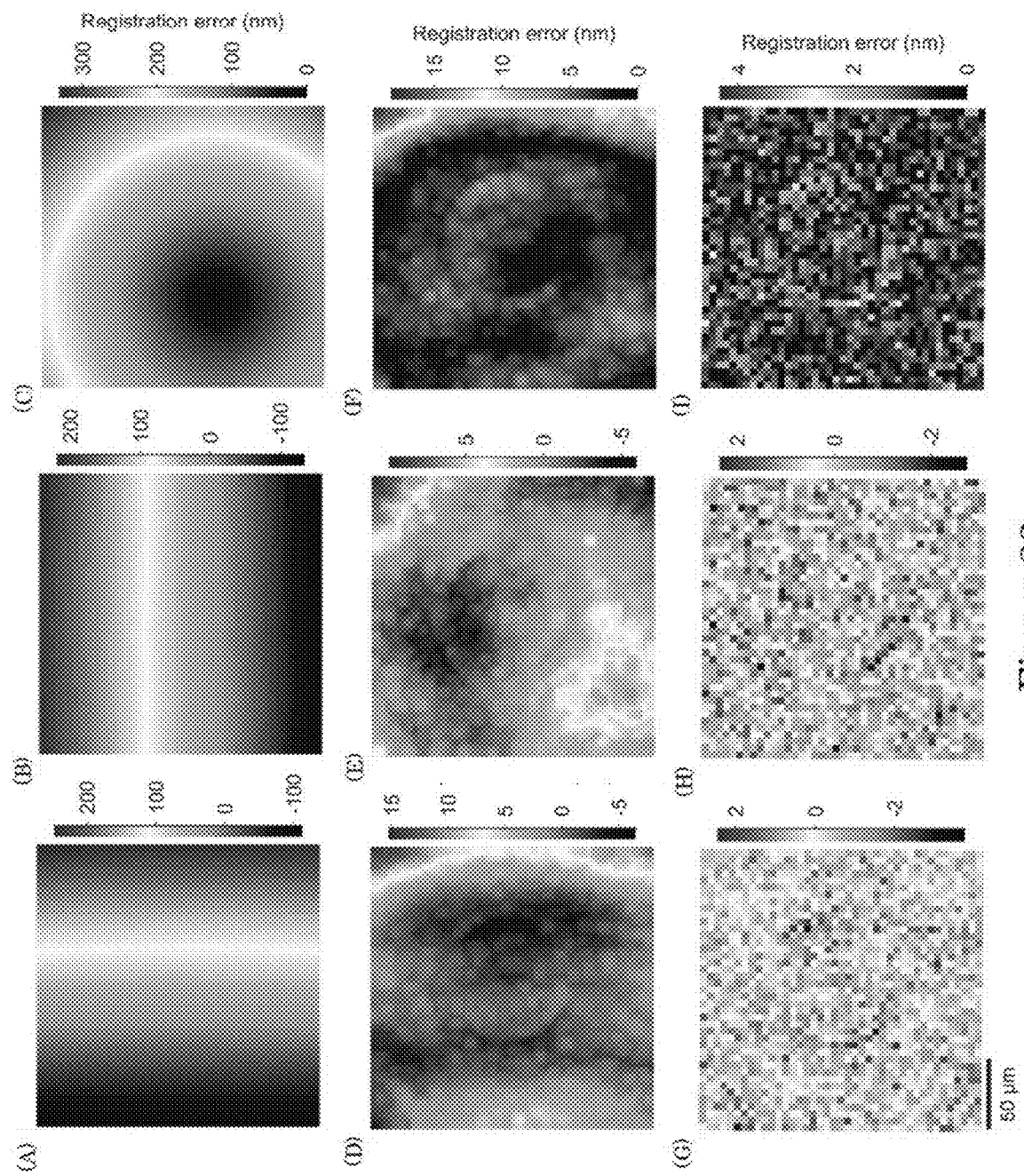
FIG. 33 shows registration error maps in panels A-I.

FIG. 33 shows registration errors from two colors at optimal focal planes, wherein panels A-C show plots of registration errors in (a) the x direction, (b) they direction, and (c) total magnitude, due mostly to different mean values of image pixel size and a lateral offset for localization data from 400 nm and 500 nm peak wavelengths. Panels D-F show plots of registration errors in (d) the x direction, (e) the y direction, and (f) total magnitude, after applying a similarity transform to the localization data, due mostly to variable distortion from chromatic aberration. Panels G-I shows plots of registration errors in (g) the x direction, (h) the y direction, and (i) total magnitude, after applying correction models to the localization data before a similarity transform, due mostly to localization error and empirical localization precision.

Registration errors of data after correction from two colors are due to a combination of empirical localization precision and localization error, having a variance of $$\sigma_{reg}^2 = \sigma_{lp,1}^2 + \sigma_{lp,2}^2 + \sigma_{le,1}^2 + \sigma_{le,2}^2, \quad \text{(Eq. S12)}$$

where $\sigma_{lp,1}^2$ and $\sigma_{lp,2}^2$ are the variance due to empirical localization precision, and $\sigma_{le,1}^2$ and $\sigma_{le,2}^2$ are the variance due to localization error for colors 1 and 2, respectively. Assuming the localization error is the same for each color channel, or equivalently considering the mean value, and by measuring the empirical localization precision, we determine the contribution of localization error to the registration error as $$\sigma_{le} = \sqrt{\frac{\sigma_{reg}^2 - \sigma_{lp,1}^2 - \sigma_{lp,2}^2}{2}}. \quad \text{(Eq. S13)}$$

Values of empirical localization precision are in Table 10. Values of the contribution of localization error to registration error, $\sigma_{le}$, for data before and after correction prior to registration are in Table 11.

TABLE 10

| Peak wavelength (nm) | $\sigma_{lp,x}$ (nm) | $\sigma_{lp,y}$ (nm) |
|---|---|---|
| 400 | 0.340 ± 0.003 | 0.318 ± 0.002 |
| 500 | 0.371 ± 0.003 | 0.315 ± 0.002 |
| 630 | 0.394 ± 0.002 | 0.320 ± 0.002 |

TABLE 11

|  |  | 400 nm and 500 nm | | 500 nm and 630 nm | |
| --- | --- | --- | --- | --- | --- |
|  |  | $\sigma_{le,x}$ (nm) | $\sigma_{le,y}$ (nm) | $\sigma_{le,x}$ (nm) | $\sigma_{le,y}$ (nm) |
| Optimal focal planes | Uncorrected | 2.23 ± 0.04 | 1.70 ± 0.03 | 2.45 ± 0.04 | 1.78 ± 0.03 |
|  | Corrected | 0.40 ± 0.01 | 0.41 ± 0.01 | 0.35 ± 0.01 | 0.47 ± 0.01 |
| Single focal plane | Uncorrected | 1.85 ± 0.03 | 1.85 ± 0.03 | 2.86 ± 0.05 | 2.86 ± 0.05 |
|  | Corrected | 0.63 ± 0.01 | 0.59 ± 0.01 | 1.16 ± 0.02 | 1.28 ± 0.02 |

Figure 34:
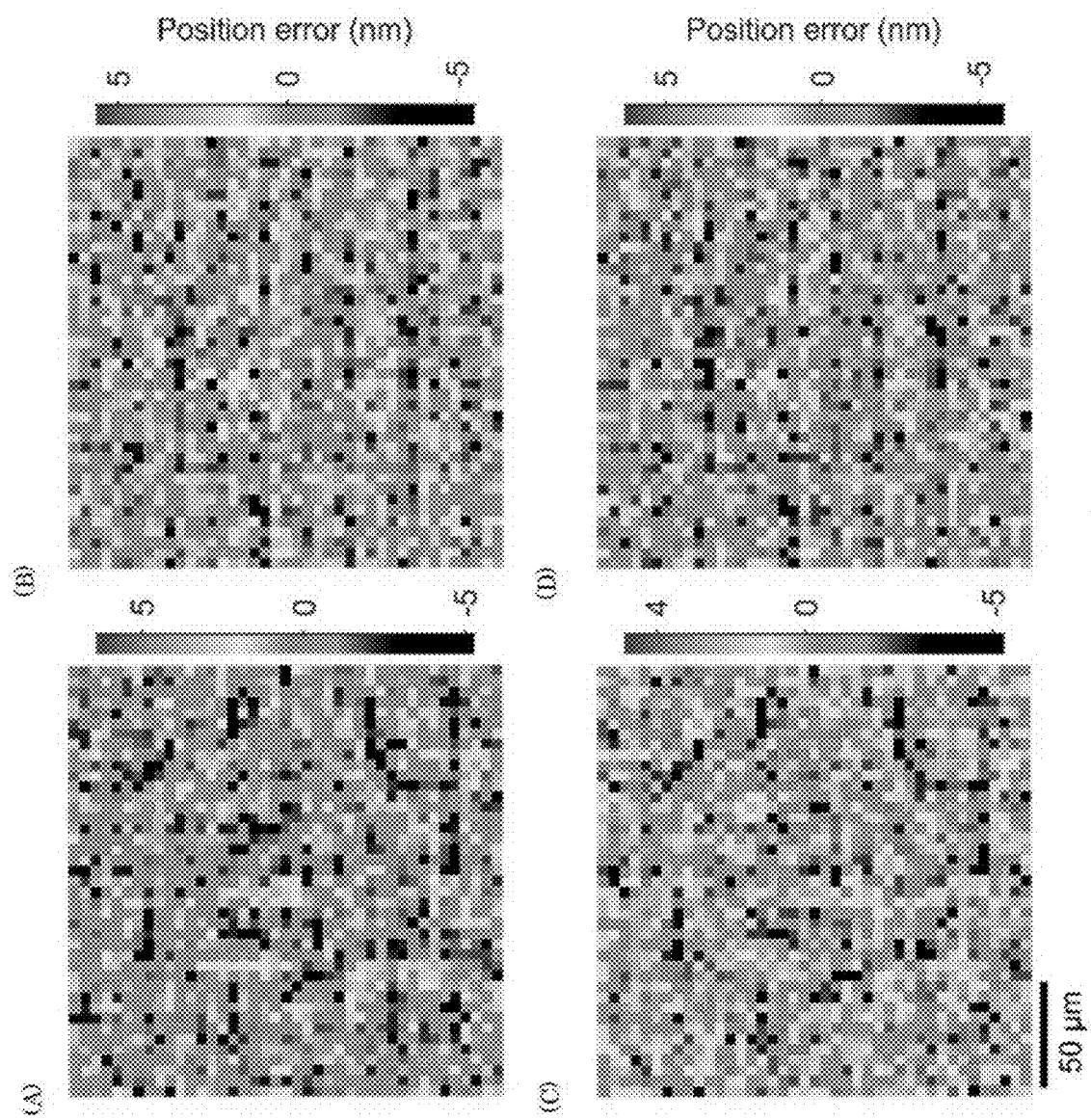
FIG. 34 shows correction of fluorescence data in panels A-C.

FIG. 34 shows correction of fluorescence data, wherein panels A-D shows plots of position errors in (panels A and C) the x direction and (panel B and D) the y direction following correction of data from (panels A and B) transillumination and (panels C and D) fluorescence. These results show that our reference materials and calibration methods are equally applicable to transillumination of empty apertures and epi-illumination of fluorescent dye in apertures.

Figure 35:
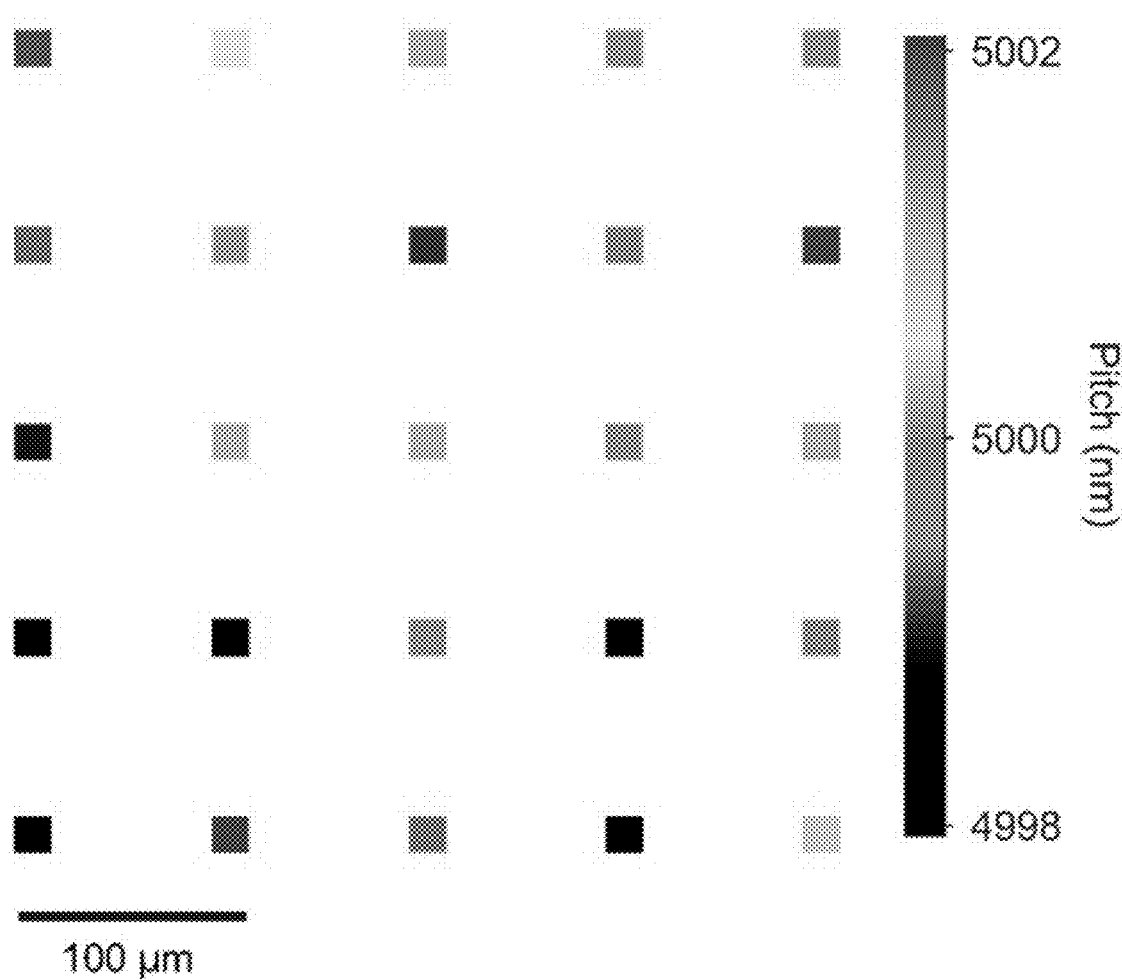
FIG. 35 shows pitch across an aperture array.

FIG. 35 shows pitch across the aperture array, wherein the plot shows 25 regions of the aperture array, with scale indicating mean pitch from four aperture pairs within each region.

TABLE 12

|  | x direction | | y direction | |
| --- | --- | --- | --- | --- |
|  | Array 1 | Array 2 | Array 1 | Array 2 |
| Mean pitch (pixels) | 49.969 | 49.958 | 49.974 | 49.964 |
| Standard error (pixels) | 0.003 | 0.002 | 0.002 | 0.002 |

The positions of each aperture or nanoparticle define a nominally rigid, constellation of points in the image plane, $(x_{j,\eta}, y_{j,\eta})$, where the index j denotes an image in a measurement series and the index η denotes a point in a constellation. We measure and remove the common-mode motion of the sample by applying a two-dimensional rigid transformation to map the constellation in image j to the constellation in image k. This transformation consists of a displacement of the centroid of the constellation $(X_j-X_k)\hat{x} + (Y_j-Y_k)\hat{y}$ and a rotation of the constellation about the centroid, $\Delta\theta=\theta_j-\theta_k$, where $(X_j,Y_j)$ and $(X_k,Y_k)$ are the positions of the centroids in images j and k, respectively, and $\theta_j$ and $\theta_k$ are the orientations of the constellation in images j and k, respectively. The optimal rigid transformation minimizes the registration error between corresponding points in images j and k. Registration error is insensitive to systematic errors in localizing single apertures or nanoparticles. Therefore, we omit CMOS calibration from this analysis.

Motion of a sample in the z direction during a time series can cause apparent deformation of a rigid constellation in optical micrographs. At time scales that allow, we minimize these effects by imaging through focus at each point in the time series, acquiring images at multiple z positions around the plane of optimal focus for the entire time series. The nominal spacing in z position between each image is 10 nm, set by the resolution of our piezoelectric nosepiece that controls the position of the objective lens. At each time point, we choose from the set of images at varying z positions the one image that minimizes the root-mean-square of the registration errors from registration with the first image in the time series. This procedure minimizes any motion of the sample in the z direction relative to the position at the initial time point, so that the images that form the resulting time series share a common z position within 10 nm.

Figure 36:
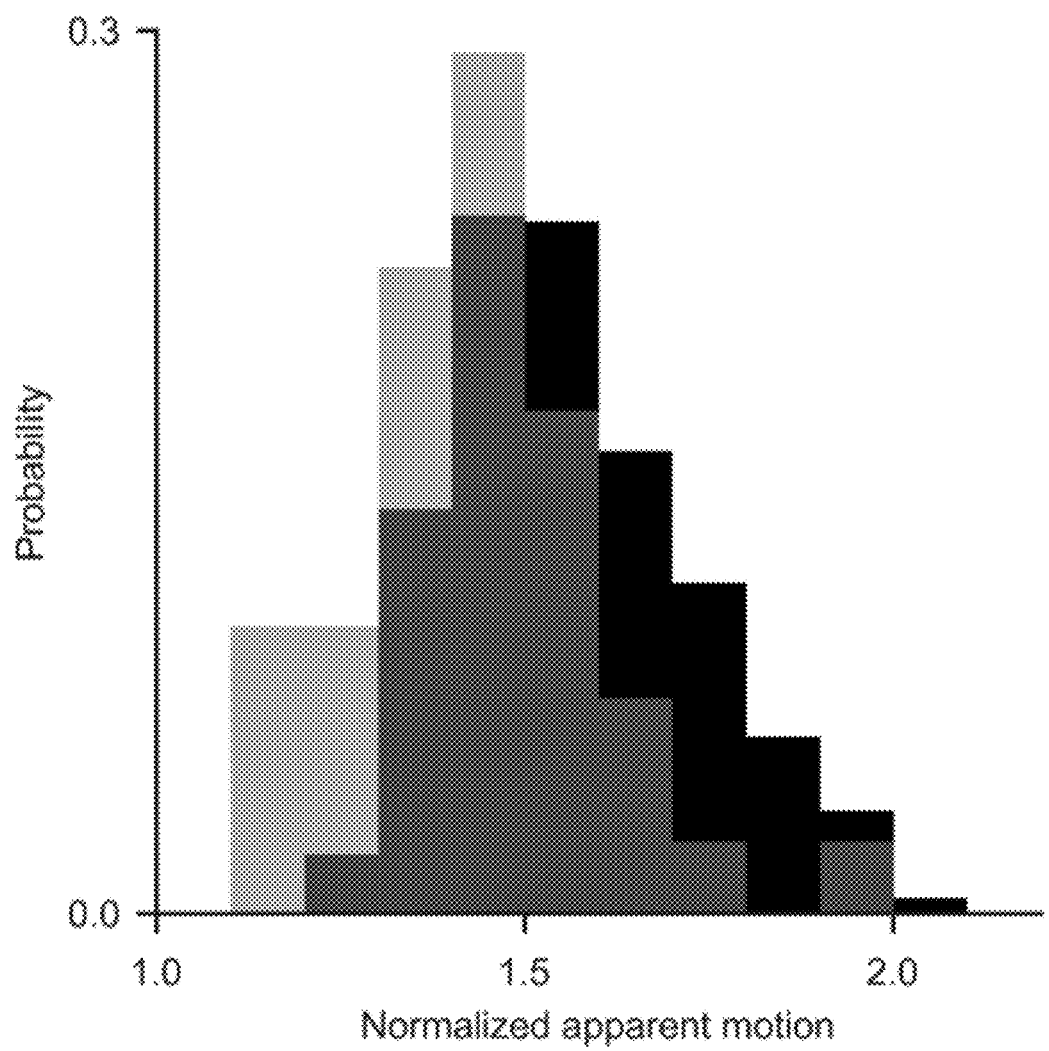
FIG. 36 shows a graph of probability versus apparent motion for apertures and nanoparticles.

FIG. 36 shows nanoparticle stability down to $10^{-1}$ s, wherein the plot shows probability distributions of normalized apparent motion for nominally motionless apertures and nanoparticles that we image at a frequency of 101 $s^{-1}$ for a duration of 101 s, without intentionally changing the z position. The normalization is with respect to the Cramér-Rao lower bound and accounts primarily for differences in the number of signal photons. The corresponding absolute mean values define the measurement uncertainties and are approximately 0.43 nm for apertures and 0.55 nm for nanoparticles. The magnitude of normalized apparent motion for nanoparticles is comparable to that of static apertures, indicating that the nanoparticles are also static at these scales.

Figure 37:
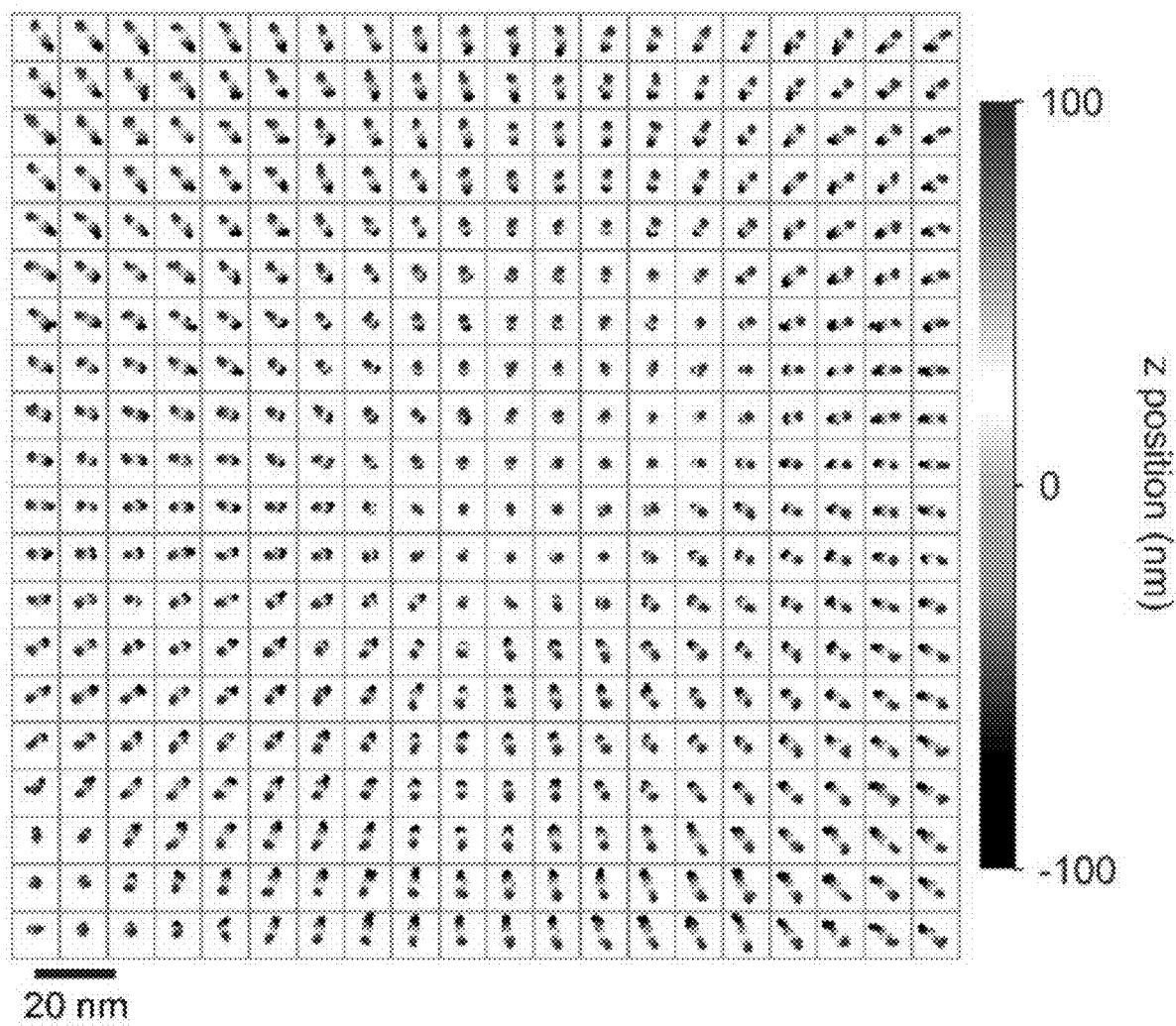
FIG. 37 shows apparent motion for apertures.

FIG. 37 shows apparent motion data, wherein a grid of scatterplots, each corresponding to a single aperture, show apparent motion in the radial direction due to imaging through focus over a range of 200 nm in z position. The grid spacing indicates an array pitch of 10 μm. The scale bar corresponds to the scatterplots.

Figure 38:
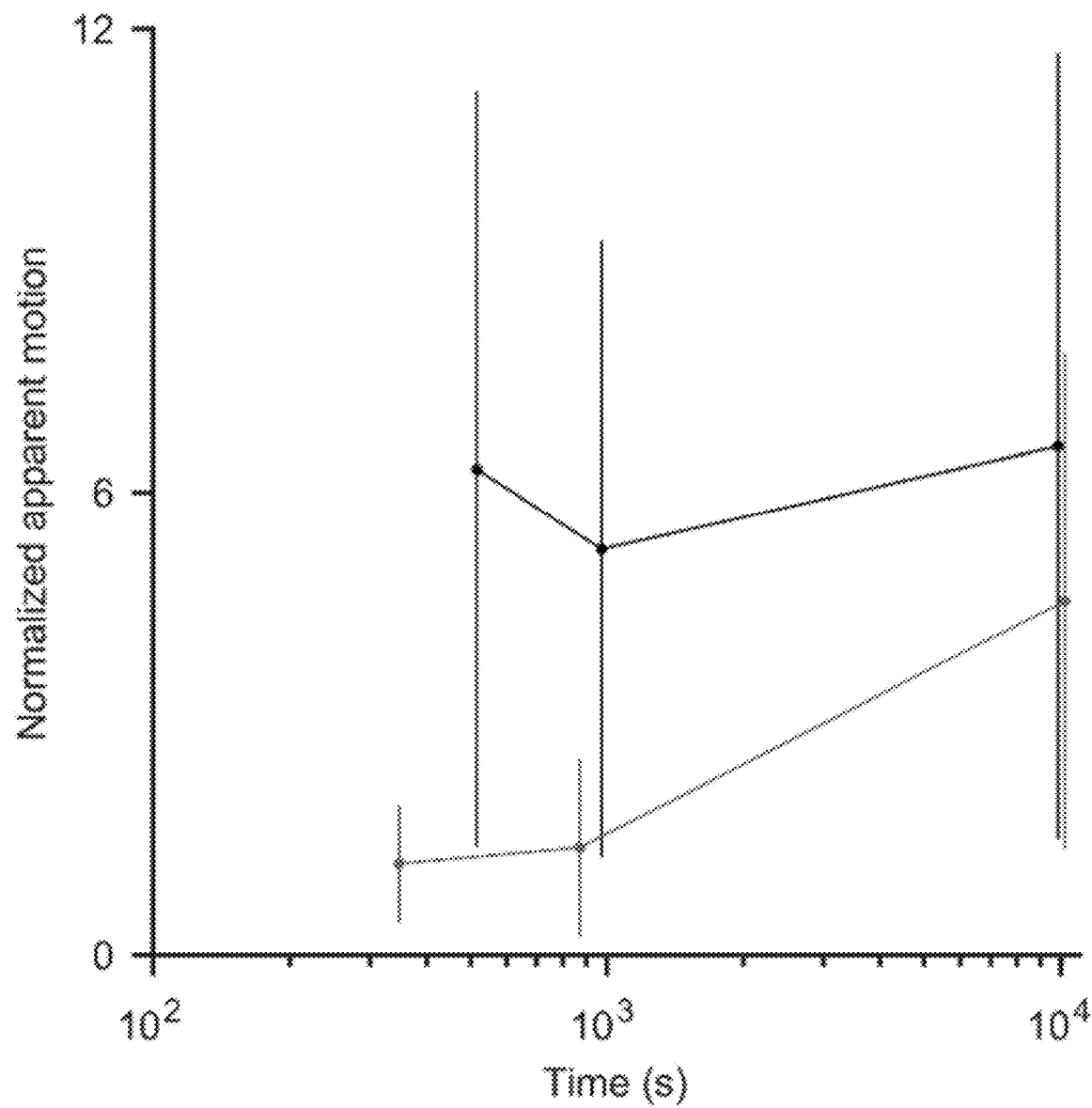
FIG. 38 shows a graph of apparent motion of apertures and nanoparticles versus time.

FIG. 38 shows nanoparticle stability up to $10^4$ s, wherein the data shown in the plot is normalized for apparent motion as a function of time, exceeding the time for imaging through focus, for nominally static apertures (black) and nanoparticles (blue). Normalization is with respect to empirical localization precision, or the corresponding values of apparent motion at the time scale of $10^{-1}$ s. Data markers are mean values and vertical bars are ±one standard deviation. The values of normalized apparent motion for nanoparticles are comparable to those of apertures, indicating that the nanoparticles are static at these scales.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive; rather the elements can be used separately or can be combined together under appropriate circumstances.

What is claimed is:

1. A process for performing critical-dimension localization microscopy, the process comprising:
fabricating a reference artifact that comprises a first dimensional member and a second dimensional member, such that the first dimensional member and the second dimensional member, in combination, comprise a critical dimension, and each of the first dimensional member and the second dimensional member independently provide optical contrast when the reference artifact is subjected to optical microscopy;
subjecting the first dimensional member and the second dimensional member of the reference artifact to critical-dimension metrology;
determining a primary length L1 and a primary length uncertainty LU1 of the critical dimension from the critical-dimension metrology so that the critical dimension is traceable to International System of Units meter (SI-m);
imaging in a calibrant optical field, by optical microscopy, the first dimensional member and the second dimensional member, the calibrant optical field disposed in an ocular optical field;
determining, from the optical microscopy of the first dimensional member and the second dimensional member, a secondary length L2 and a secondary length uncertainty LU2 of the critical dimension subjected to the critical-dimension metrology; and
calibrating the calibrant optical field and the secondary length L2, to the primary length L1 to establish traceability of the secondary length L2 to the International System of Units meter SI-m to perform critical-dimension localization microscopy.

2. The process for performing critical-dimension localization microscopy of claim 1, the process further comprising:
disposing a first pair of analyte members in the calibrant optical field;
imaging in the calibrant optical field, by optical microscopy, the first pair;
determining, from the optical microscopy of the first pair, a first analyte length and a first analyte length uncertainty of the first pair; and
calibrating the first analyte length and the first analyte length uncertainty of the first pair to the primary length L1 to establish traceability of the first analyte length to the International System of Units meter SI-m.

3. The process for performing critical-dimension localization microscopy of claim 2, the process further comprising:
translating, relative to the calibrant optical field, a substrate on which is disposed a plurality of analyte members, so that different pairs of analyte members are disposed in the calibrant optical field due to translating the analyte members;
independently imaging the different pairs in the calibrant optical field, by optical microscopy;
independently determining, from the optical microscopy of the different pairs, an analyte length and an analyte length uncertainty of each different pair; and
calibrating the analyte length of each different pair to the primary length L1 to establish traceability of the analyte length of each different pair to the International System of Units meter SI-m.

4. The process for performing critical-dimension localization microscopy of claim 2, the process further comprising:
disposing the first pair in the ocular optical field outside of the calibrant optical field;
imaging in the ocular optical field, by optical microscopy, the first pair; and
calibrating an optical length of the ocular optical field in which the first pair is disposed indirectly to the primary length L1 via the first analyte length to establish traceability of the optical length to the International System of Units meter SI-m.

5. The process for performing critical-dimension localization microscopy of claim 4, the process further comprising:
translating, relative to the calibrant optical field, a substrate on which is disposed a plurality of analyte members, so that different pairs of analyte members are disposed in the calibrant optical field due to translating the analyte members;
independently imaging the different pairs in the calibrant optical field, by optical microscopy;
independently determining, from the optical microscopy of the different pairs, an analyte length and an analyte length uncertainty of each different pair; and
calibrating the analyte length of each different pair to the primary length L1 to establish traceability of the analyte length of each different pair to the International System of Units meter SI-m.

6. The process for performing critical-dimension localization microscopy of claim 5, the process further comprising:
disposing the different pairs in the ocular optical field outside of the calibrant optical field;
imaging in the ocular optical field, by optical microscopy, the different pairs; and
calibrating the optical length of the ocular optical field in which the different pairs are disposed indirectly to the primary length L1 via the analyte length of each different pair to establish traceability of the optical length of the ocular optical field in which the different pairs are disposed to the International System of Units meter SI-m.

7. A process for performing critical-dimension localization microscopy, the process comprising:
subjecting a first dimensional member and a second dimensional member of a reference artifact to critical-dimension metrology, the first dimensional member and the second dimensional member, in combination, comprising a critical dimension, and each of the first dimensional member and the second dimensional member independently provide optical contrast when the reference artifact is subjected to optical microscopy;
determining a primary length L1 and a primary length uncertainty LU1 of the critical dimension from the critical-dimension metrology so that the critical dimension is traceable to International System of Units meter (SI-m);

imaging in a calibrant optical field, by optical microscopy, the first dimensional member and the second dimensional member, the calibrant optical field disposed in an ocular optical field;

determining, from the optical microscopy of the first dimensional member and the second dimensional member, a secondary length L2 and a secondary length uncertainty LU2 of the critical dimension subjected to the critical-dimension metrology; and calibrating the calibrant optical field and the secondary length L2, to the primary length L1 to establish traceability of the secondary length L2 to the International System of Units meter SI-m to perform critical-dimension localization microscopy.

8. The process for performing critical-dimension localization microscopy of claim 7, the process further comprising fabricating the reference artifact that comprises the first dimensional member and the second dimensional member.

9. The process for performing critical-dimension localization microscopy of claim 7, the process further comprising:

disposing a first pair of analyte members in the calibrant optical field;

imaging in the calibrant optical field, by optical microscopy, the first pair;

determining, from the optical microscopy of the first pair, a first analyte length and a first analyte length uncertainty of the first pair; and calibrating the first analyte length and the first analyte length uncertainty of the first pair to the primary length L1 to establish traceability of the first analyte length to the International System of Units meter SI-m.

10. The process for performing critical-dimension localization microscopy of claim 9, the process further comprising:

translating, relative to the calibrant optical field, a substrate on which is disposed a plurality of analyte members, so that different pairs of analyte members are disposed in the calibrant optical field due to translating the analyte members;

independently imaging the different pairs in the calibrant optical field, by optical microscopy;

independently determining, from the optical microscopy of the different pairs, an analyte length and an analyte length uncertainty of each different pair; and calibrating the analyte length of each different pair to the primary length L1 to establish traceability of the analyte length of each different pair to the International System of Units meter SI-m.

11. The process for performing critical-dimension localization microscopy of claim 9, the process further comprising:

disposing the first pair in the ocular optical field outside of the calibrant optical field;

imaging in the ocular optical field, by optical microscopy, the first pair; and calibrating an optical length of the ocular optical field in which the first pair is disposed indirectly to the primary length L1 via the first analyte length to establish traceability of the optical length to the International System of Units meter SI-m.

12. The process for performing critical-dimension localization microscopy of claim 11, the process further comprising:

translating, relative to the calibrant optical field, a substrate on which is disposed a plurality of analyte members, so that different pairs of analyte members are disposed in die calibrant optical field due to translating the analyte members;

independently imaging the different pairs in the calibrant optical field, by optical microscopy;

independently determining, from the optical microscopy of the different pairs, an analyte length and an analyte length uncertainty of each different pair; and calibrating the analyte length of each different pair to the primary length L1 to establish traceability of the analyte length of each different pair to the International System of Units meter SI-m.

13. The process for performing critical-dimension localization microscopy of claim 12, the process further comprising:

disposing the different pairs in the ocular optical field outside of the calibrant optical field;

imaging in the ocular optical field, by optical microscopy, the different pairs; and calibrating the optical length of the ocular optical field in which the different pairs are disposed indirectly to the primary length L1 via the analyte length of each different pair to establish traceability of the optical length of the ocular optical field in which the different pairs are disposed to the International System of Units meter SI-m.

14. An apparatus for critical-dimension localization microscopy for performing critical-dimension localization microscopy and comprising:

a critical-dimension metrolog that:

subjects a reference artifact to critical-dimension metrology, the reference artifact comprising a critical dimension; and produces metrology data of the reference artifact from the critical-dimension metrology;

an optical microscope comprising:

an ocular optical field; and a calibrant optical field disposed in the ocular optical field, such that the optical microscope:

receives the reference artifact in die calibrant optical field, the reference artifact being subjected to the critical-dimension metrology;

subjects the reference artifact in the calibrant optical field to optical microscopy;

produces calibrant microscopy data from the reference artifact in the calibrant optical field;

receives the reference artifact in the ocular optical field;

subjects the reference artifact in the ocular optical field to optical microscopy;

produces ocular microscopy data from the reference artifact in the ocular optical field;

an analysis machine comprising:

a first analyzer that:

receives the metrology data from the critical-dimension metrolog; and produces calibration factors from the metrology data;

a second analyzer that:

receives the calibrant microscopy data from the optical microscope;

receives the ocular microscopy data from the optical microscope;

calibrates, with the calibration factors, the calibrant microscopy data and the ocular microscopy data to the critical dimension to produce traceable microscopy data from the calibrant microscopy data, the ocular microscopy data, and the calibration factors to establish traceability of the ocular optical field to the International System of Units meter SI-m.

* * * * *